(12) United States Patent
Singh et al.

(10) Patent No.: US 11,817,345 B2
(45) Date of Patent: Nov. 14, 2023

(54) MULTIPLE THICKNESS SEMICONDUCTOR-ON-INSULATOR FIELD EFFECT TRANSISTORS AND METHODS OF FORMING THE SAME

(71) Applicant: Taiwan Semiconductor Manufacturing Company Limited, Hsinchu (TW)

(72) Inventors: Gulbagh Singh, Tainan (TW); Po-Jen Wang, Taichung (TW); Kun-Tsang Chuang, Miaoli (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/849,765

(22) Filed: Jun. 27, 2022

(65) Prior Publication Data
US 2022/0328345 A1    Oct. 13, 2022

Related U.S. Application Data

(63) Continuation of application No. 16/885,377, filed on May 28, 2020, now Pat. No. 11,398,403.

(51) Int. Cl.
*H01L 21/762* (2006.01)
*H01L 27/12* (2006.01)
(Continued)

(52) U.S. Cl.
CPC .... *H01L 21/76224* (2013.01); *H01L 21/7624* (2013.01); *H01L 21/76227* (2013.01);
(Continued)

(58) Field of Classification Search
CPC ......... H01L 21/76224–76232; H01L 21/7624; H01L 29/786; H01L 29/78696; H01L 29/0642–0653
See application file for complete search history.

(56) References Cited

U.S. PATENT DOCUMENTS 6,033,943 A    3/2000 Gardner
6,724,045 B1   4/2004 Ushiku
(Continued)

FOREIGN PATENT DOCUMENTS

TW    447031 B    7/2001
TW    I270114 B   1/2007

OTHER PUBLICATIONS

Taiwan Patent and Trademark Office, Application No. 110102011 Office Action dated Dec. 10, 2021, 7 pages.

*Primary Examiner* — Bac H Au
(74) *Attorney, Agent, or Firm* — The Marbury Law Group, PLLC

(57) ABSTRACT

Semiconductor-on-insulator (SOI) field effect transistors (FETs) including body regions having different thicknesses may be formed on an SOI substrate by selectively thinning a region of a top semiconductor layer while preventing thinning of an additional region of the top semiconductor layer. An oxidation process or an etch process may be used to thin the region of the top semiconductor layer, and a patterned oxidation barrier mask or an etch mask may be used to prevent oxidation or etching of the additional portion of the top semiconductor layer. Shallow trench isolation structures may be formed prior to, or after, the selective thinning processing steps. FETs having different depletion region configurations may be formed using the multiple thicknesses of the patterned portions of the top semiconductor layer. For example, partially depleted SOI FETs and fully depleted SOI FETs may be provided.

20 Claims, 42 Drawing Sheets

(51) Int. Cl.
*H01L 29/06* (2006.01)
*H01L 29/786* (2006.01)

(52) U.S. Cl.
CPC .. *H01L 21/76229* (2013.01); *H01L 21/76232* (2013.01); *H01L 21/76264* (2013.01); *H01L 21/76283* (2013.01); *H01L 27/1233* (2013.01); *H01L 29/0653* (2013.01); *H01L 29/786* (2013.01); *H01L 29/78696* (2013.01)

(56) References Cited

U.S. PATENT DOCUMENTS

| | | | |
|---|---|---|---|
| 7,061,054 B2 | 6/2006 | Tomiye et al. | |
| 7,087,967 B2 | 8/2006 | Mori et al. | |
| 7,410,841 B2 | 8/2008 | Tigelaar | |
| 7,507,610 B2 | 3/2009 | Yoshida | |
| 7,927,979 B2 * | 4/2011 | Hill | H01L 21/84 |
| | | | 257/350 |
| 8,350,331 B2 | 1/2013 | Tsujiuchi et al. | |
| 8,652,887 B2 | 2/2014 | Nguyen et al. | |
| 10,062,712 B1 | 8/2018 | Moen et al. | |
| 2004/0079993 A1 | 4/2004 | Ning et al. | |
| 2004/0173851 A1 * | 9/2004 | Ushiku | H01L 29/78612 |
| | | | 257/350 |
| 2004/0180478 A1 | 9/2004 | Yang et al. | |
| 2007/0176235 A1 | 8/2007 | Tsujiuchi et al. | |
| 2012/0146148 A1 * | 6/2012 | Iwamatsu | H01L 29/6659 |
| | | | 257/351 |
| 2013/0087855 A1 | 4/2013 | Makiyama et al. | |
| 2014/0353756 A1 * | 12/2014 | Yamamoto | H01L 27/1203 |
| | | | 438/154 |
| 2017/0069661 A1 * | 3/2017 | Zhang | H01L 29/66628 |
| 2017/0352687 A1 | 12/2017 | Makiyama | |
| 2019/0019876 A1 * | 1/2019 | Smith | H01L 27/1203 |
| 2019/0035815 A1 * | 1/2019 | Smith | H01L 21/84 |
| 2019/0057981 A1 * | 2/2019 | Fagot | H01L 21/7624 |
| 2019/0326183 A1 * | 10/2019 | Costaganna | H01L 21/3081 |
| 2020/0006386 A1 * | 1/2020 | Singh | H01L 29/66772 |
| 2020/0051808 A1 * | 2/2020 | Metze | H01L 29/78654 |
| 2020/0075633 A1 * | 3/2020 | Liang | H01L 23/5226 |
| 2020/0335402 A1 * | 10/2020 | Zhou | H01L 21/82385 |

* cited by examiner

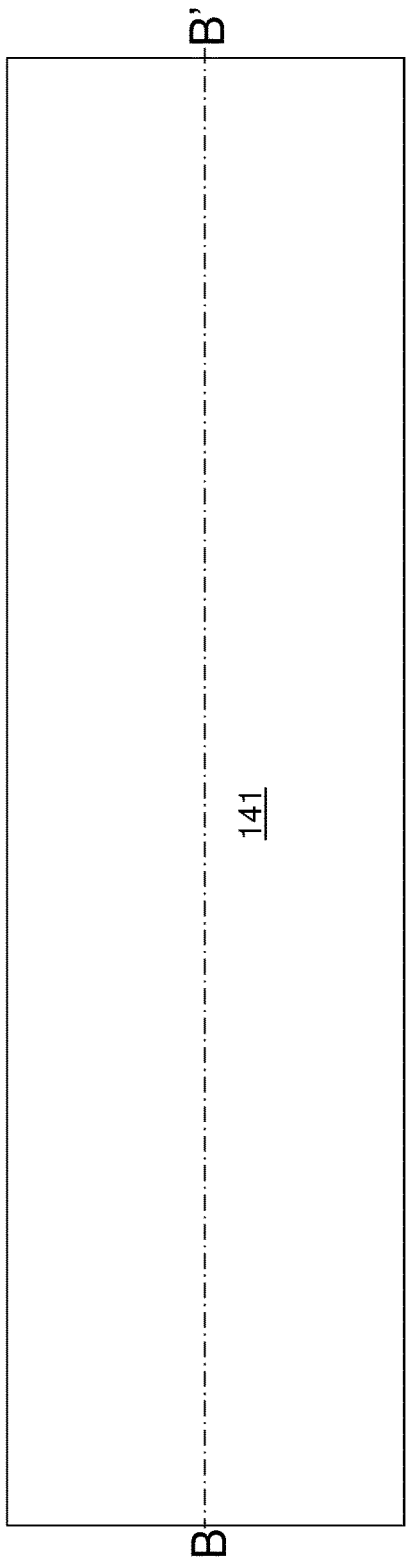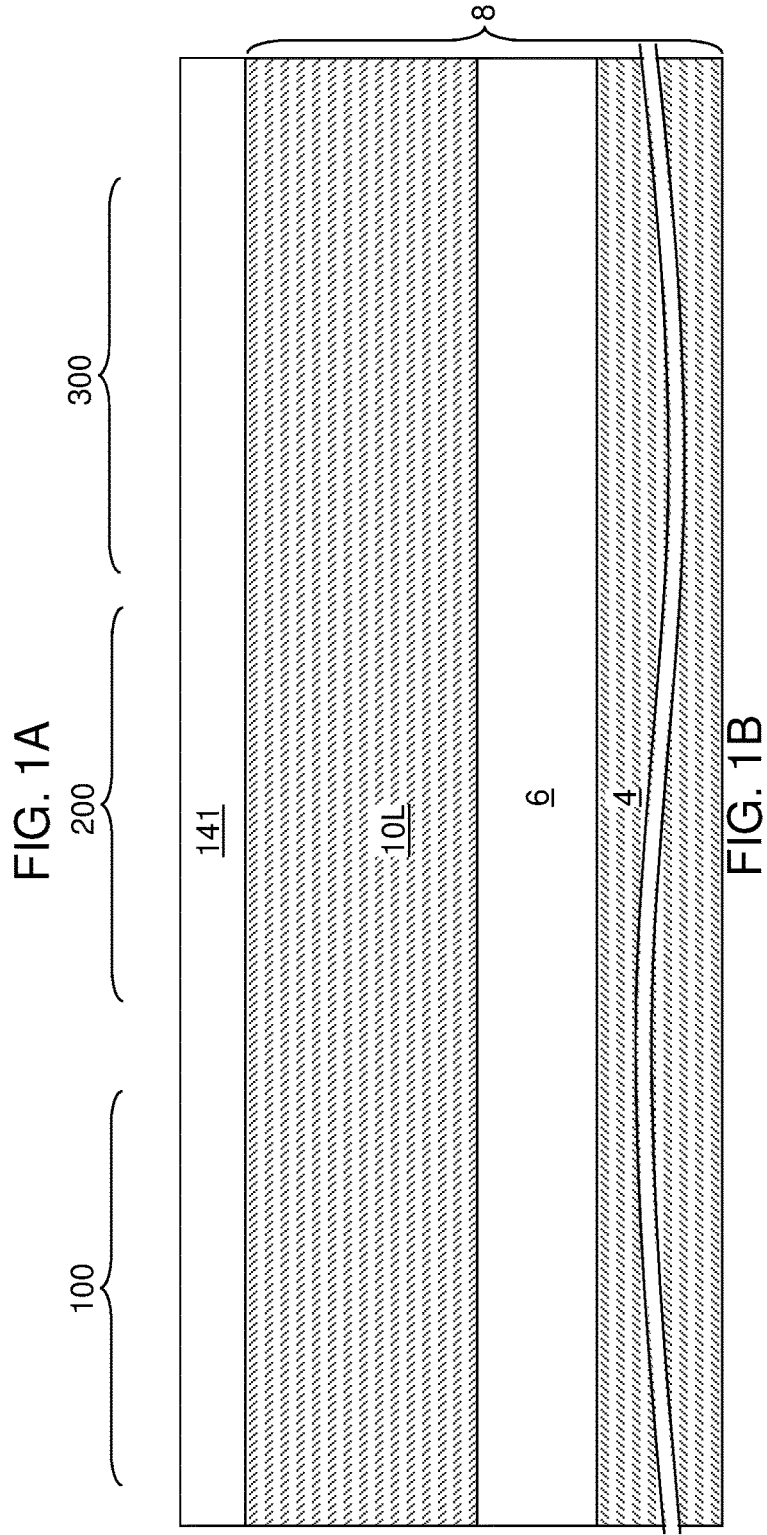

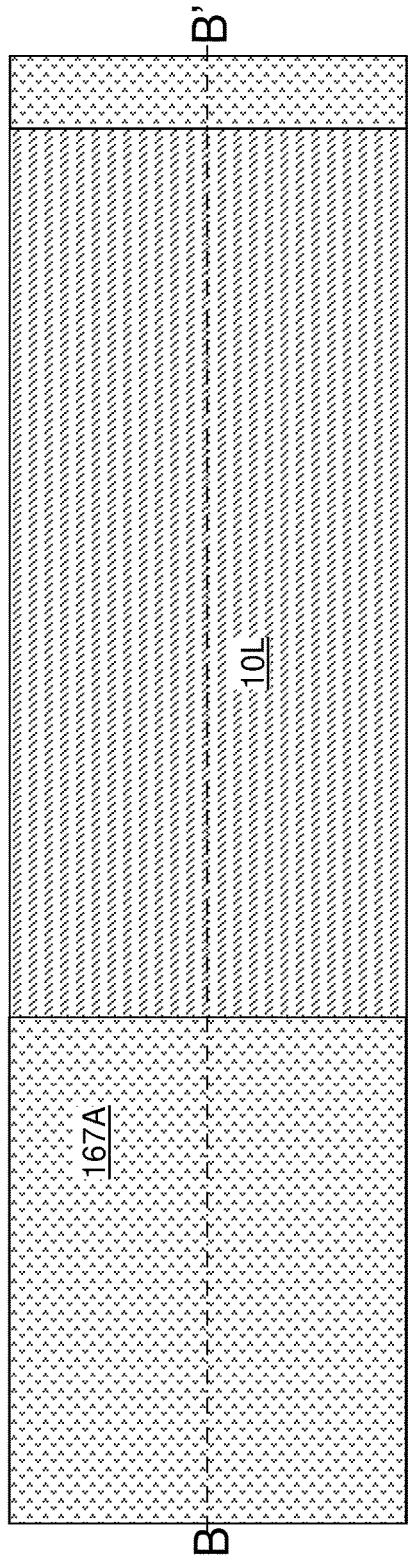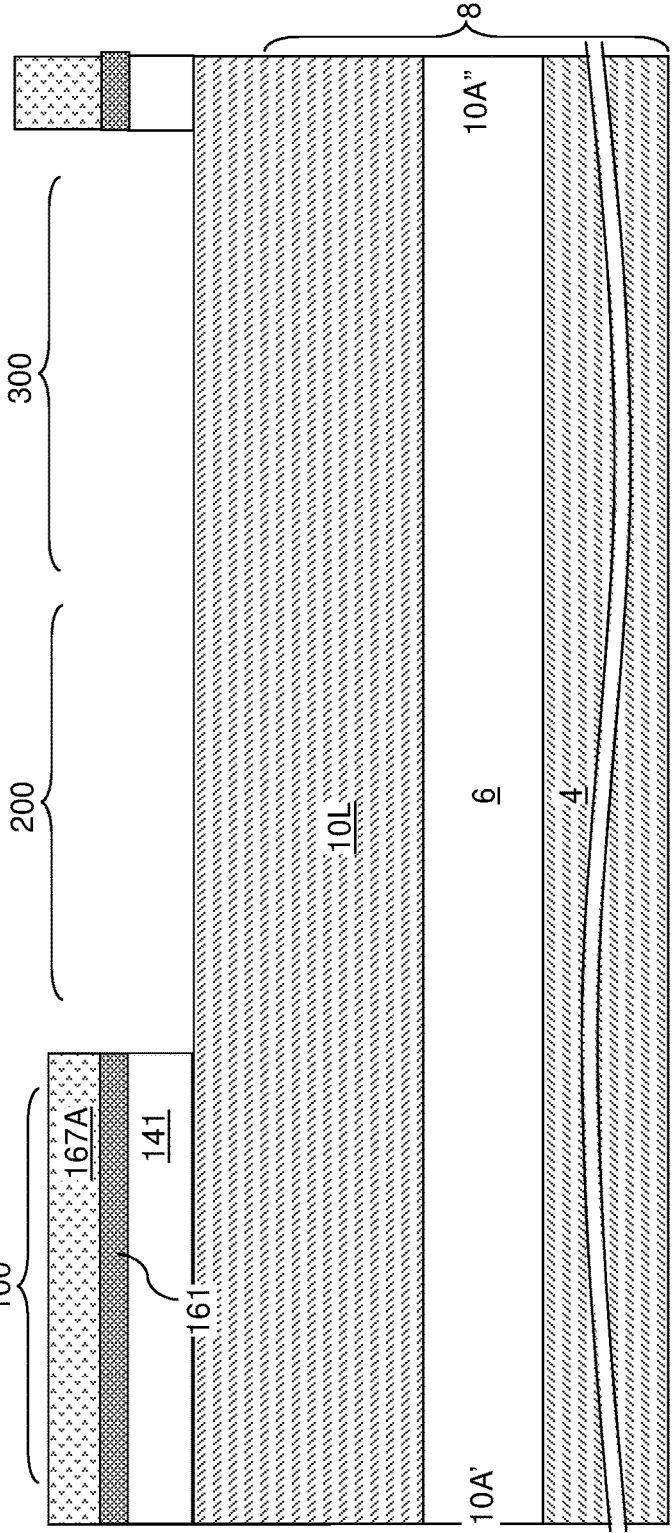

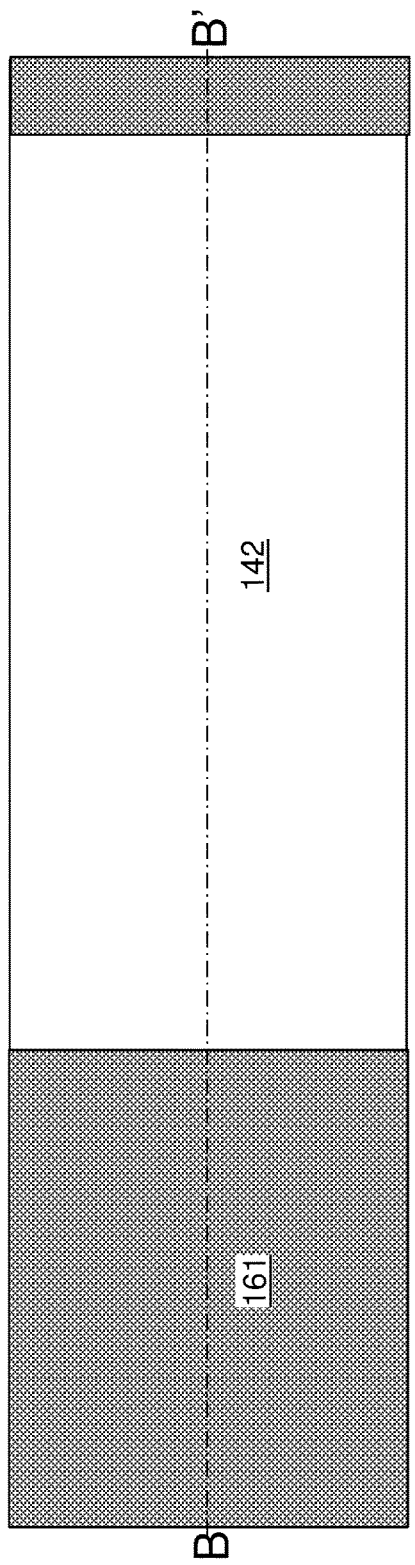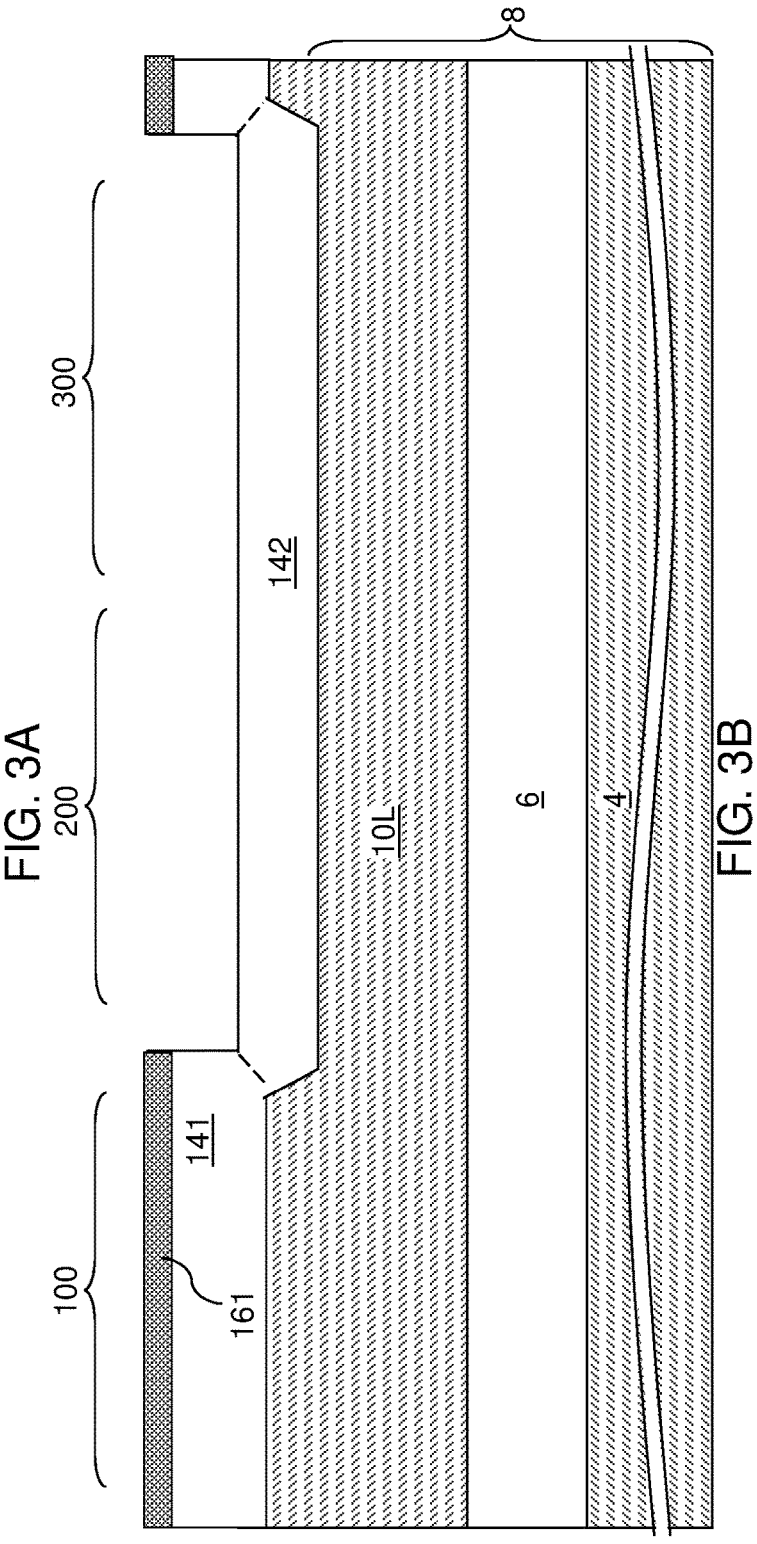

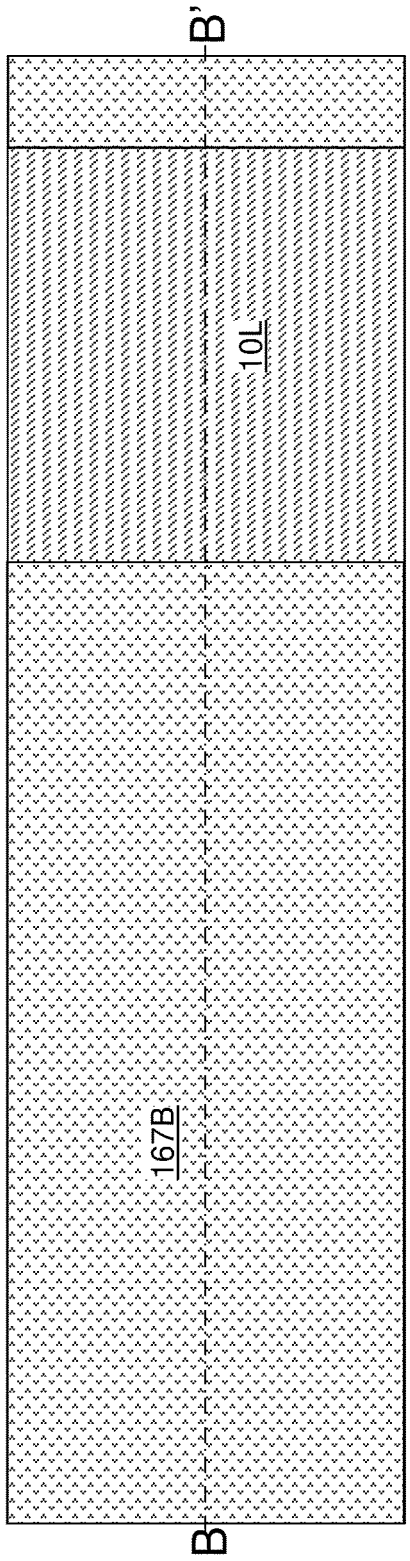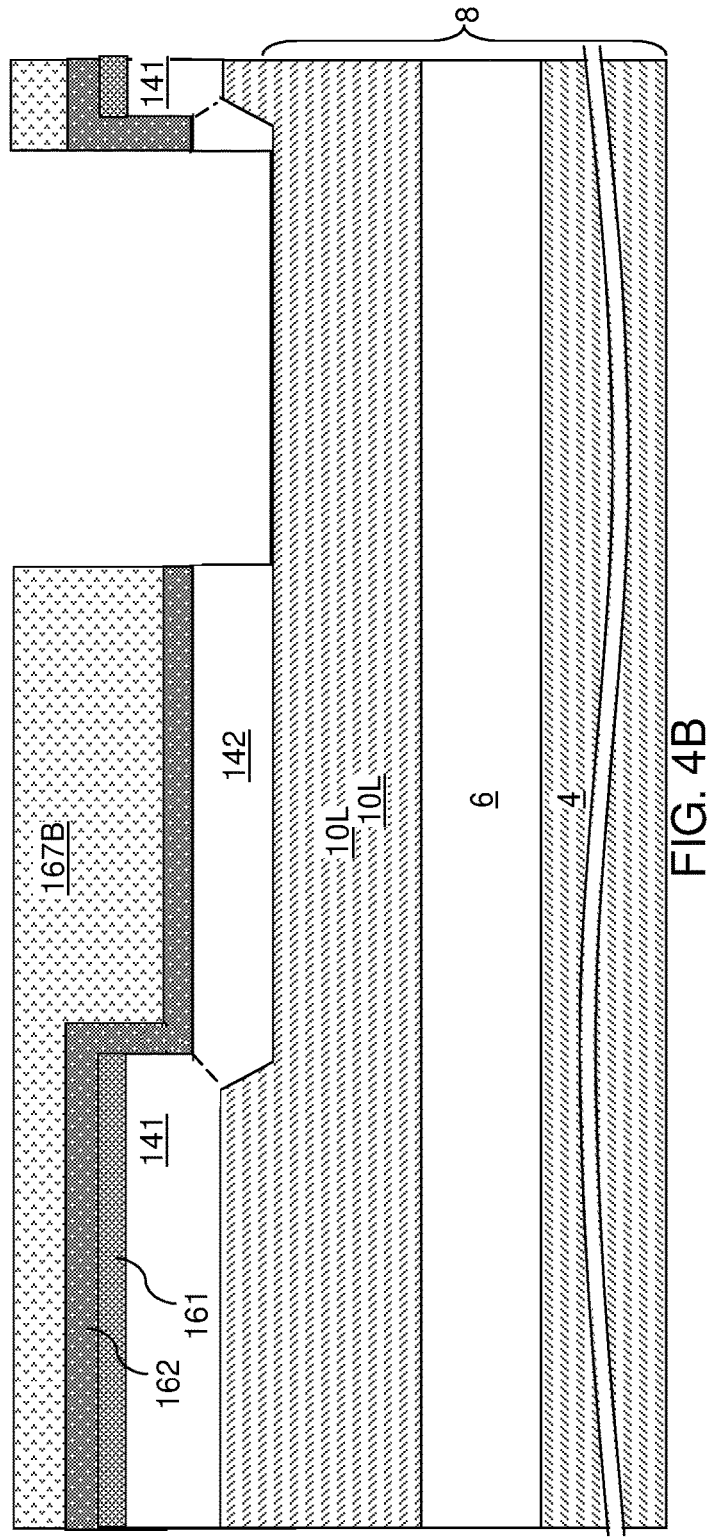

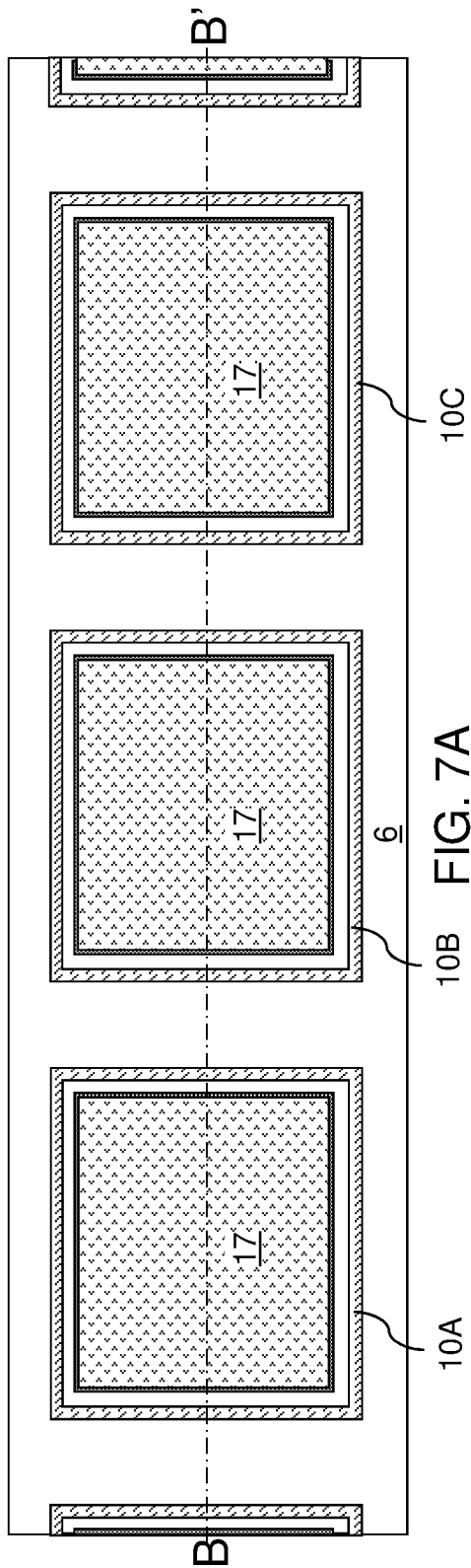

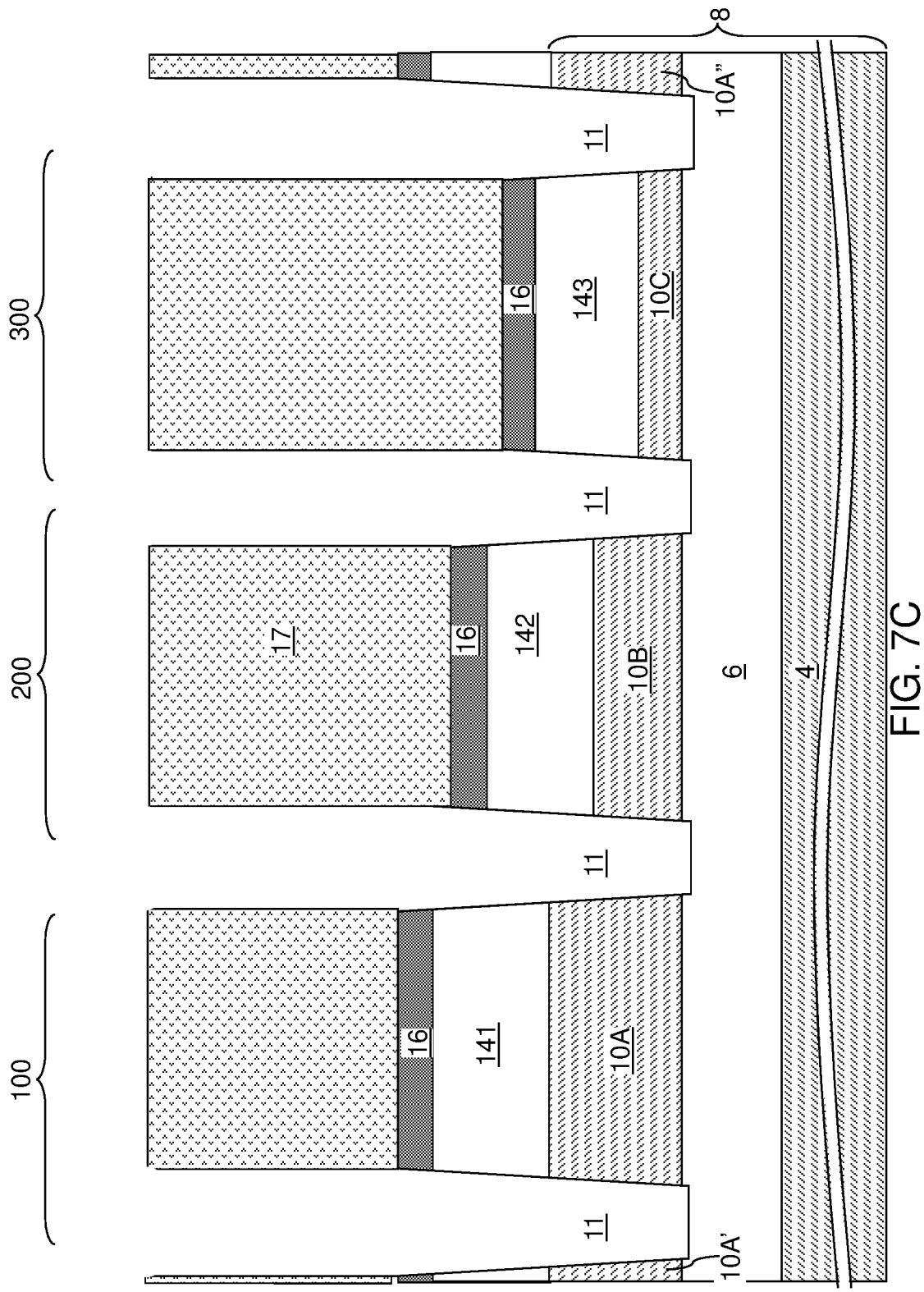

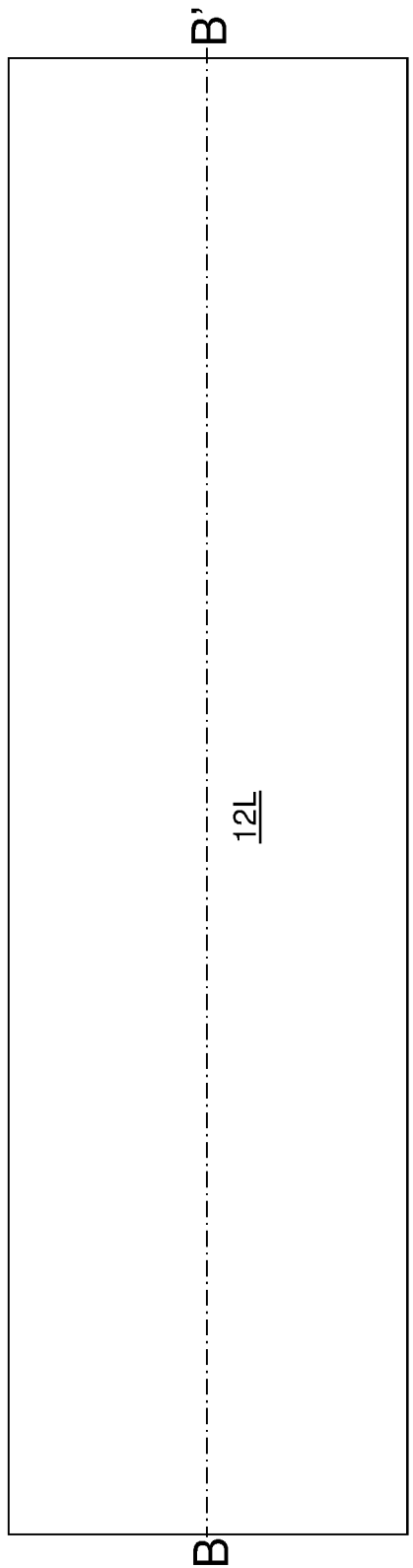

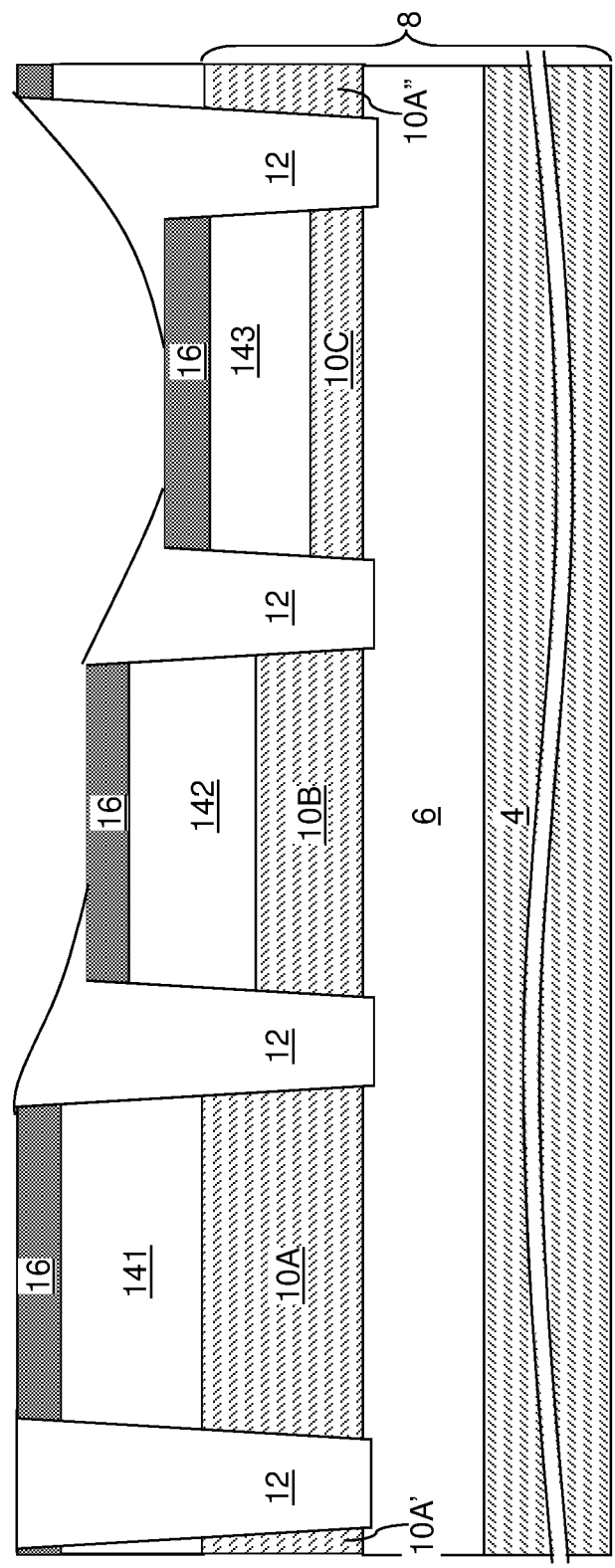

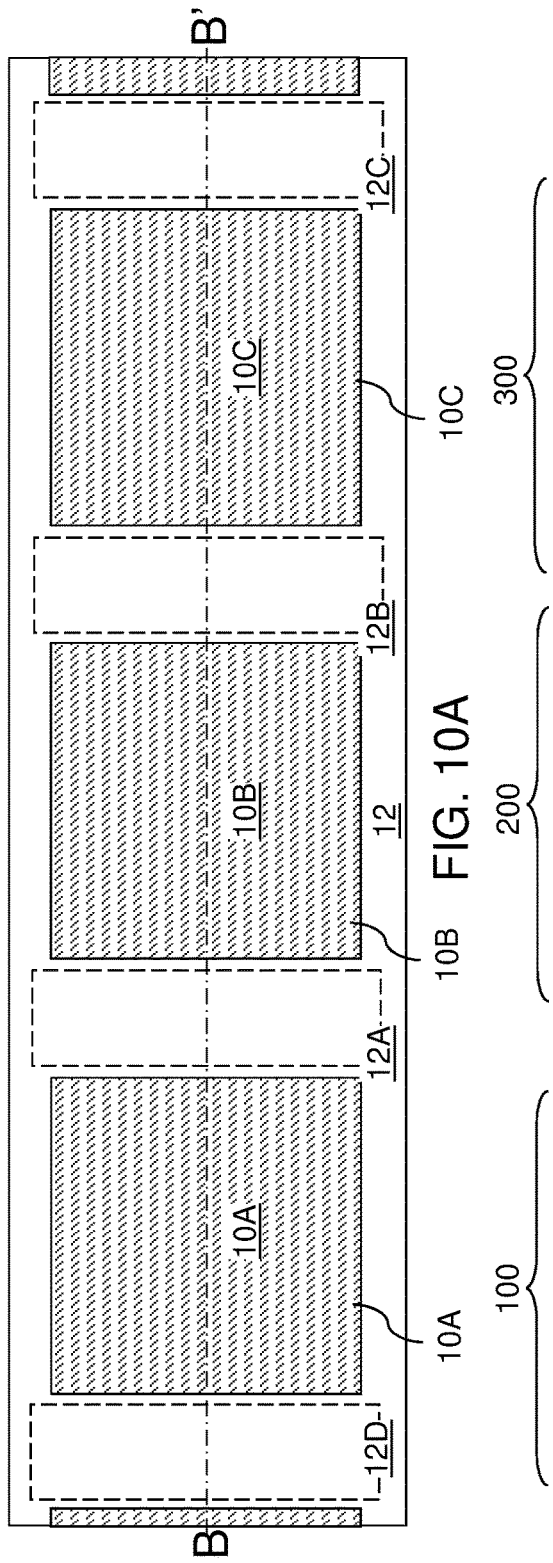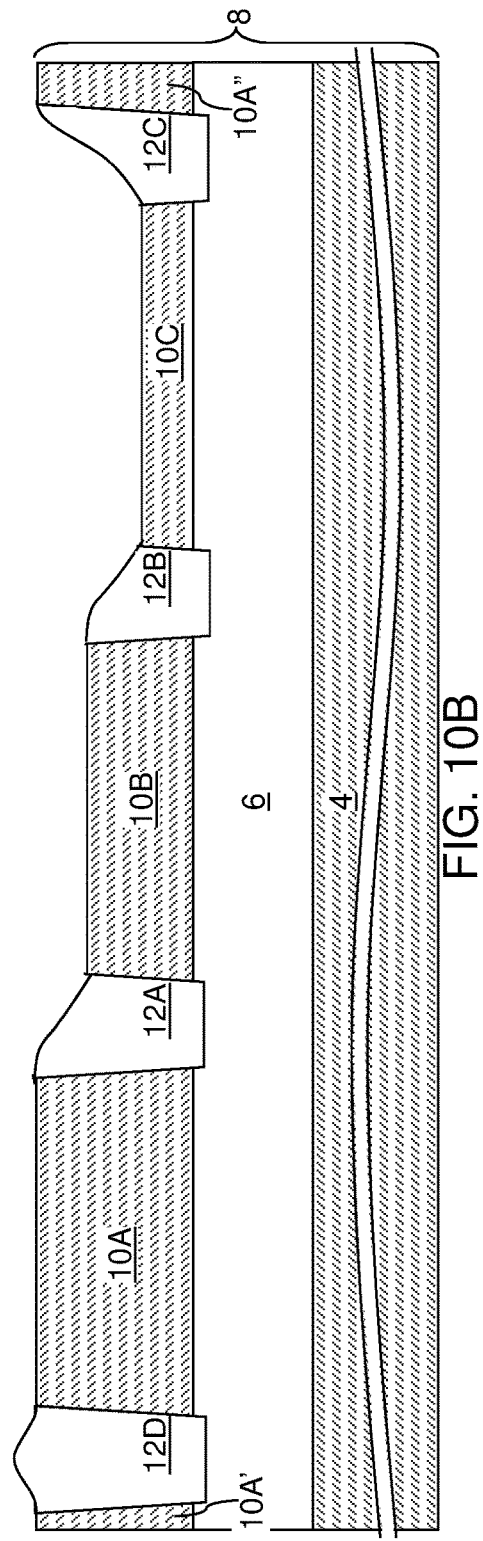

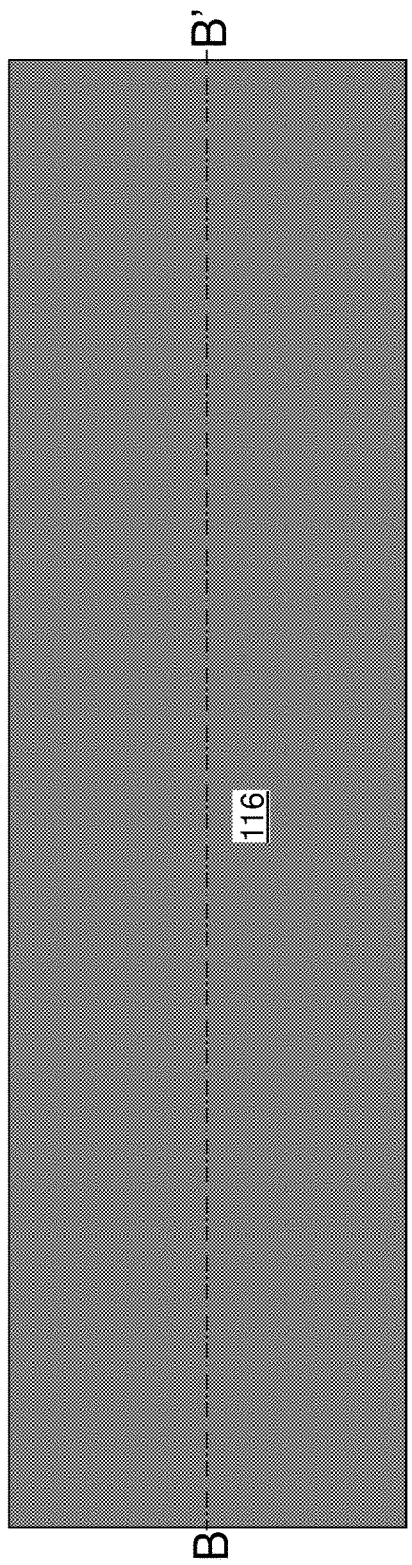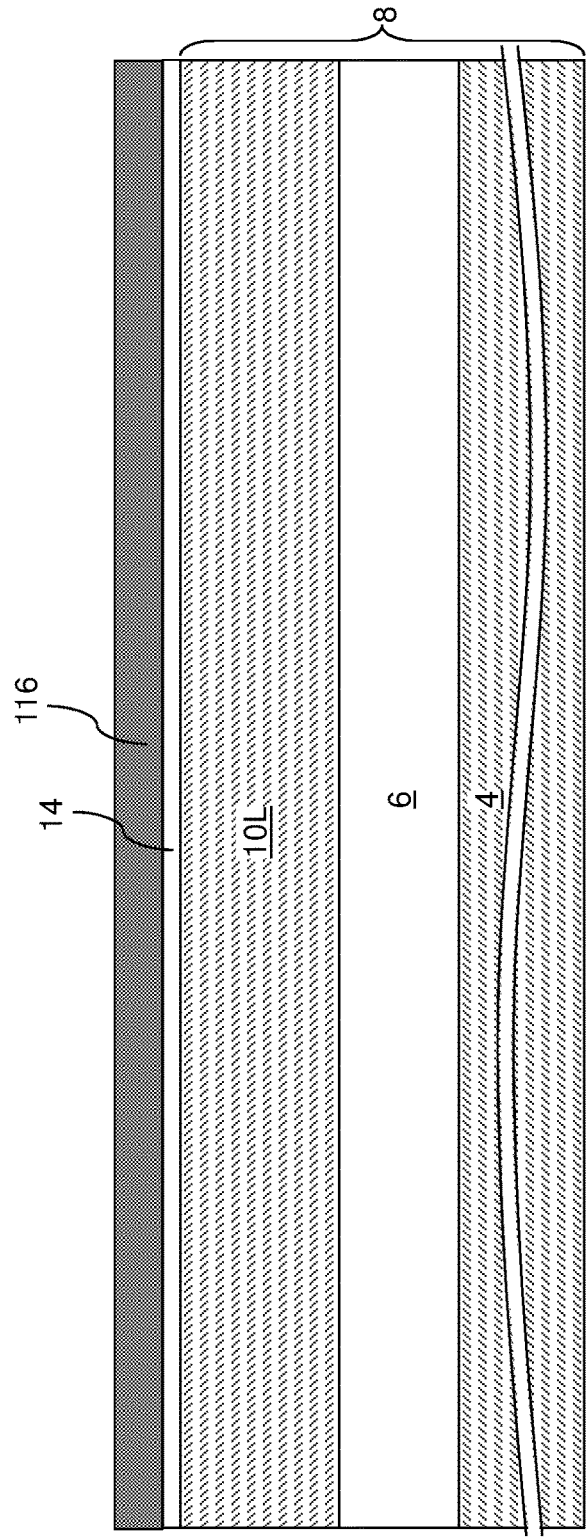

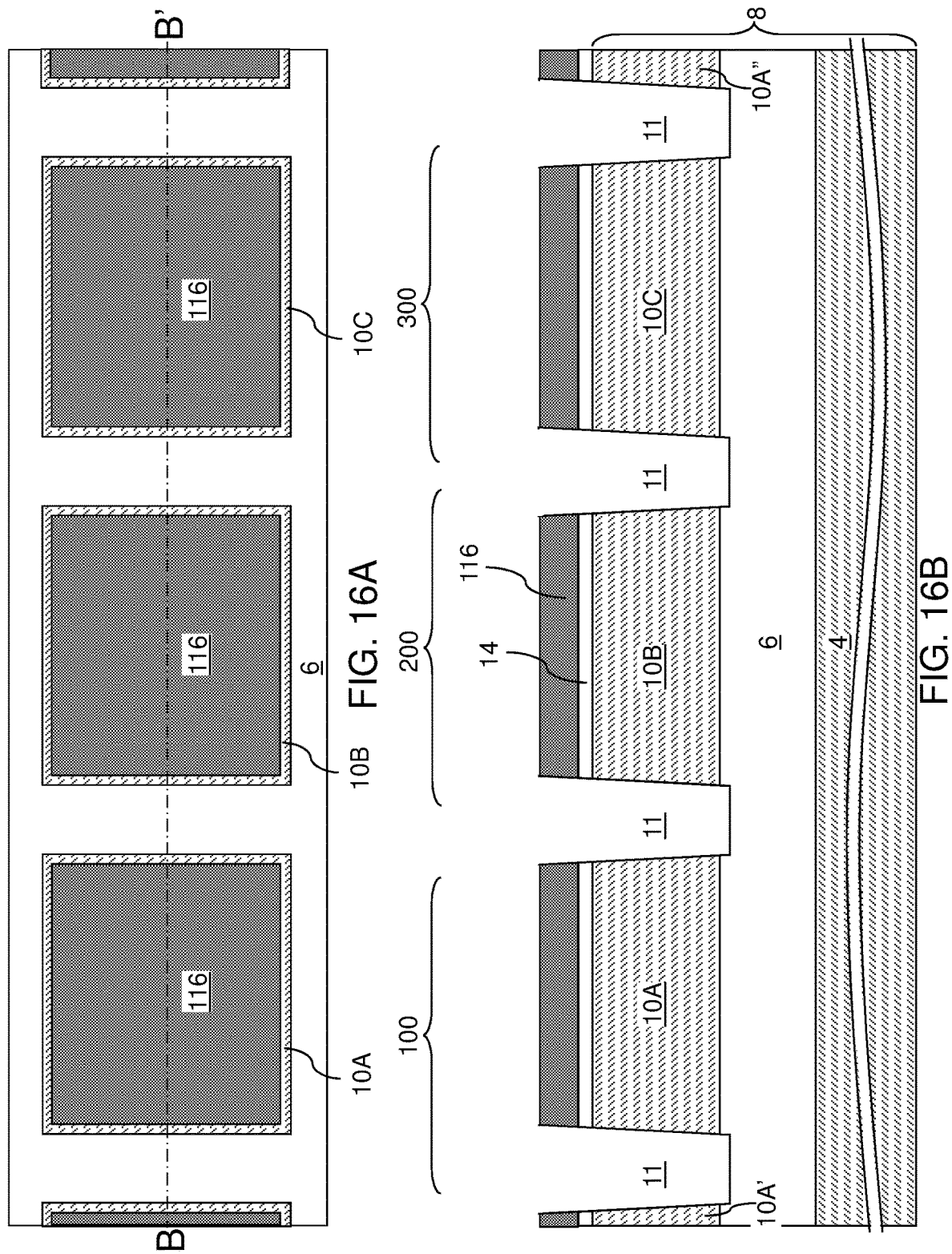

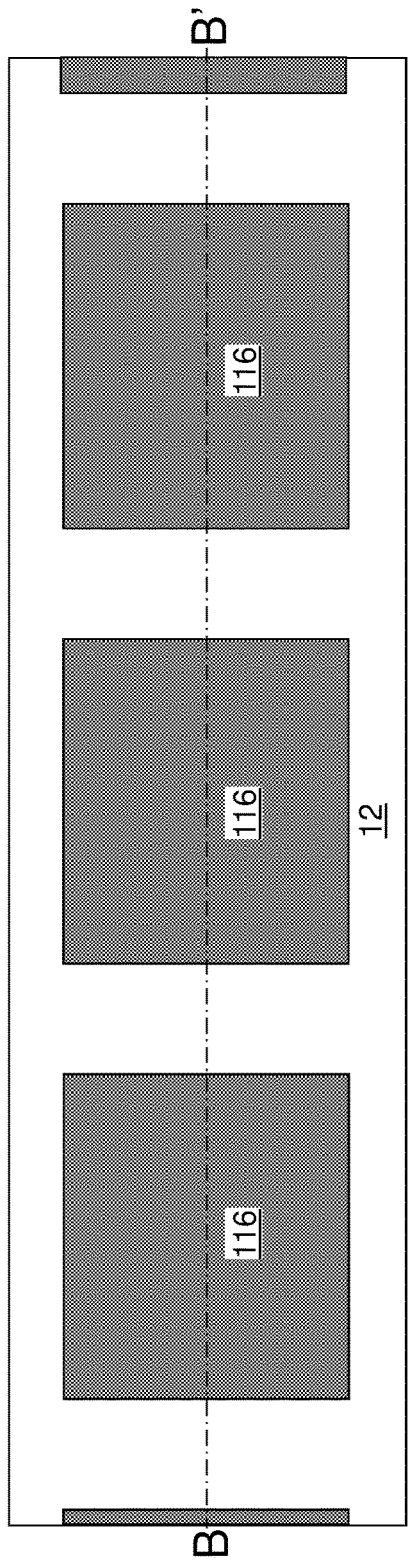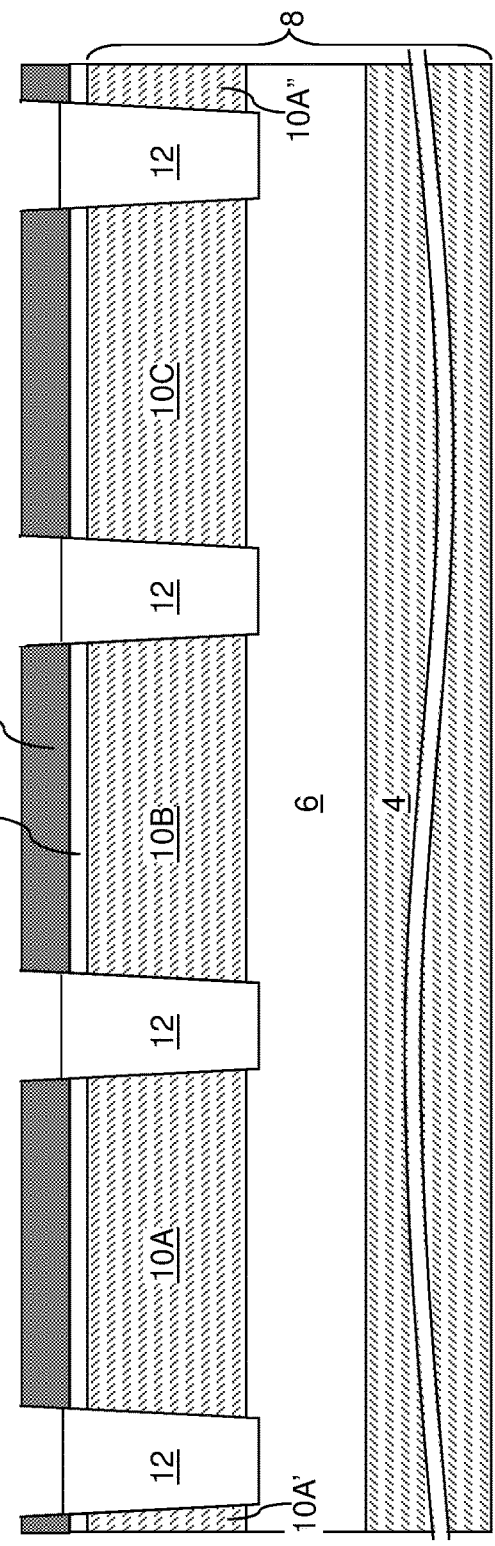

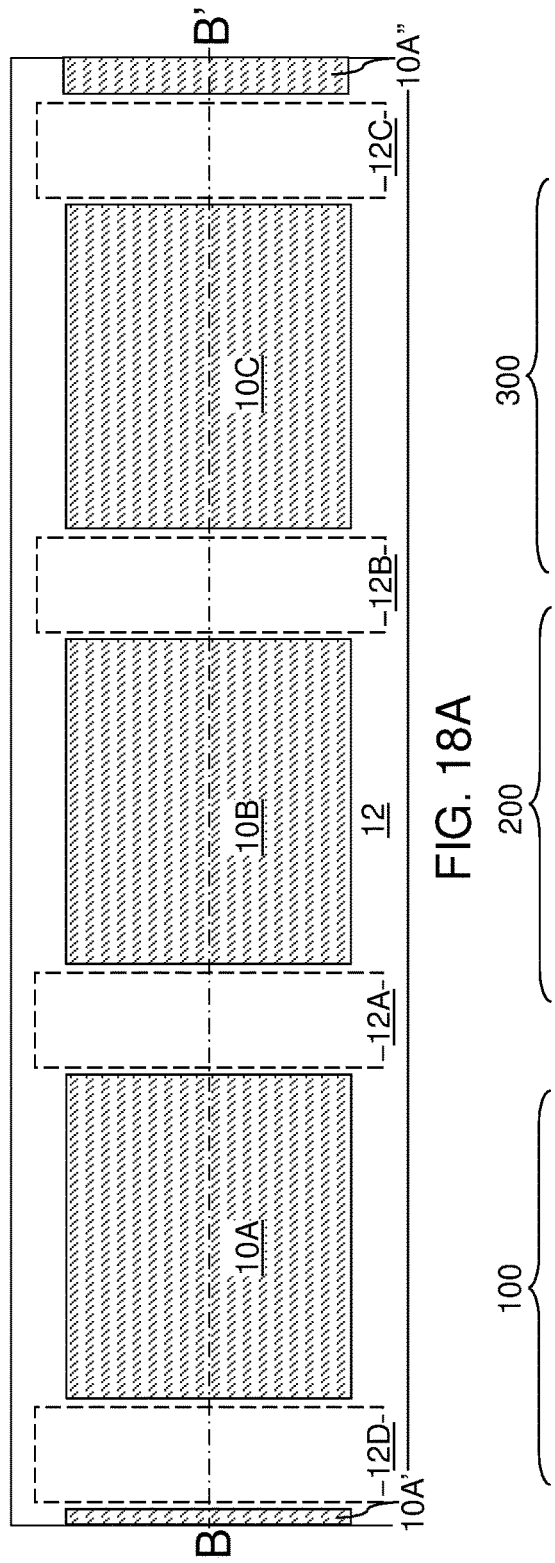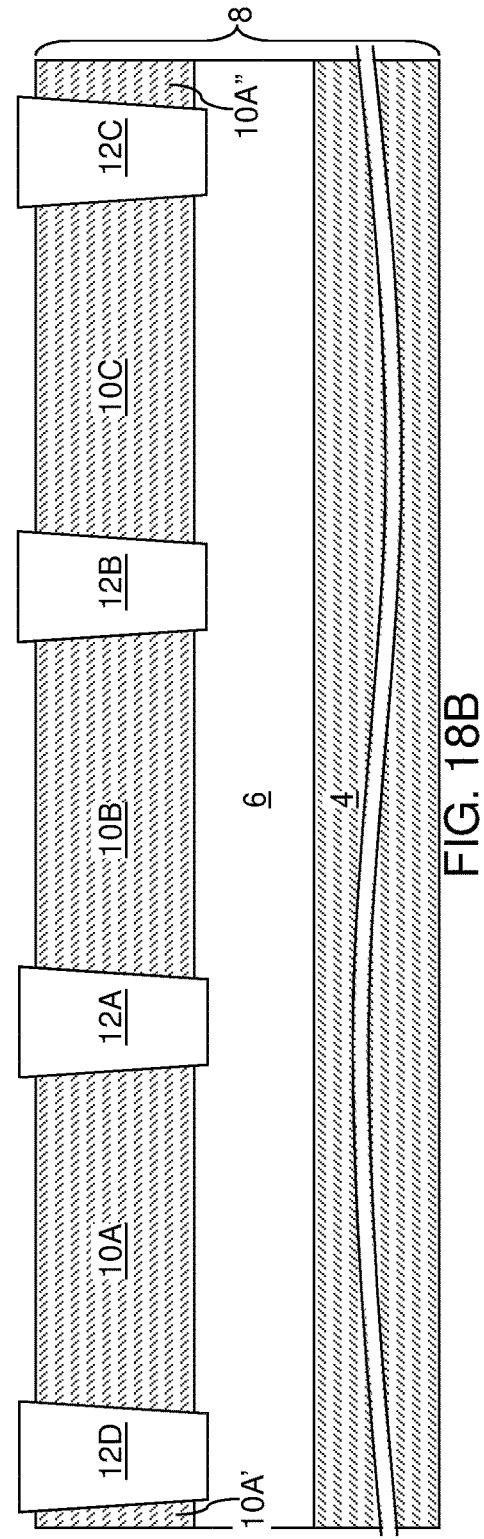

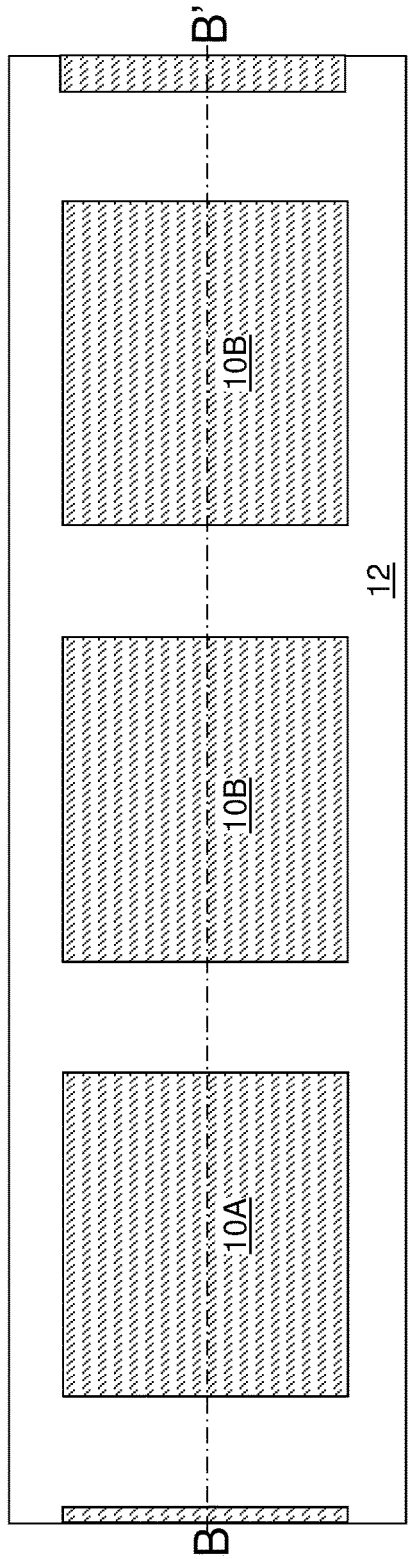
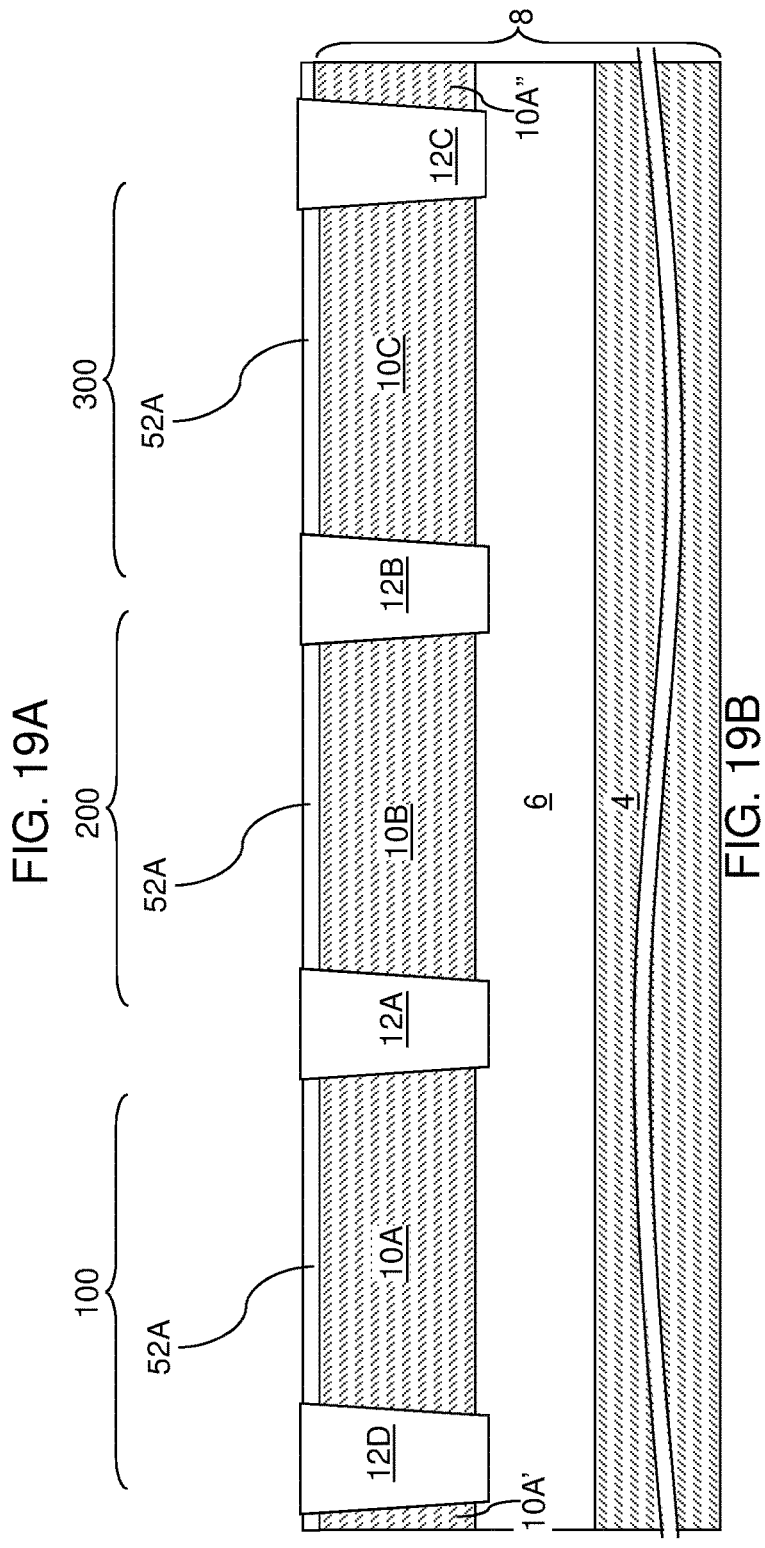

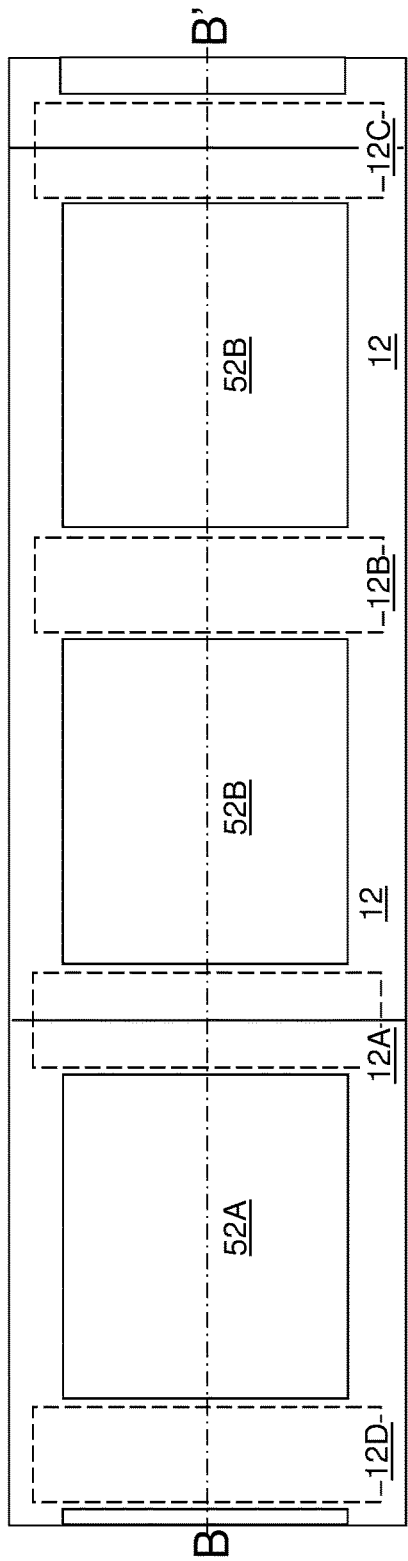
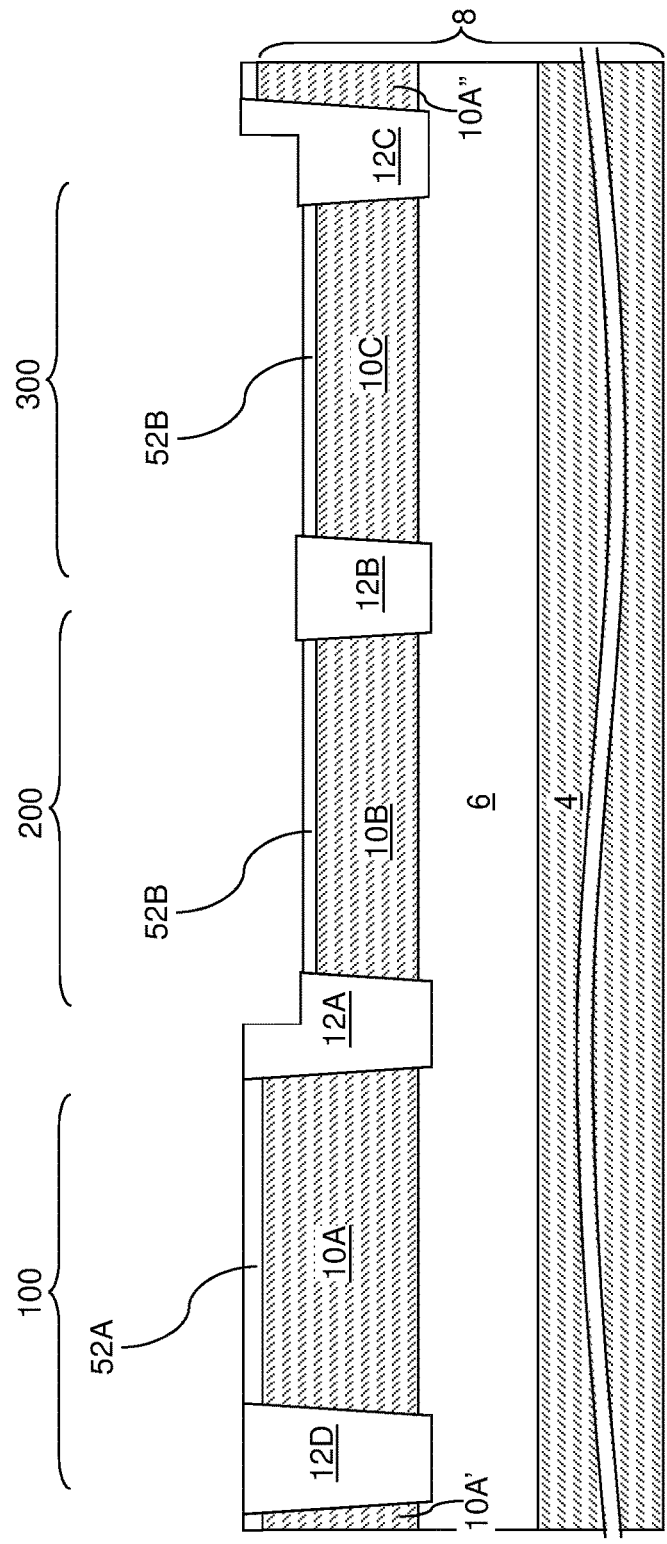

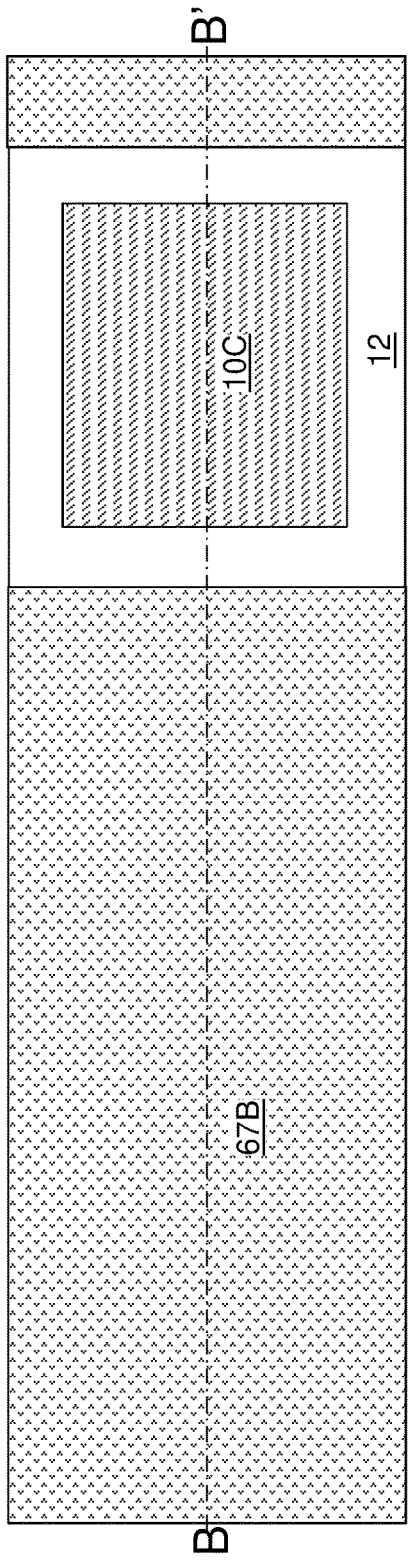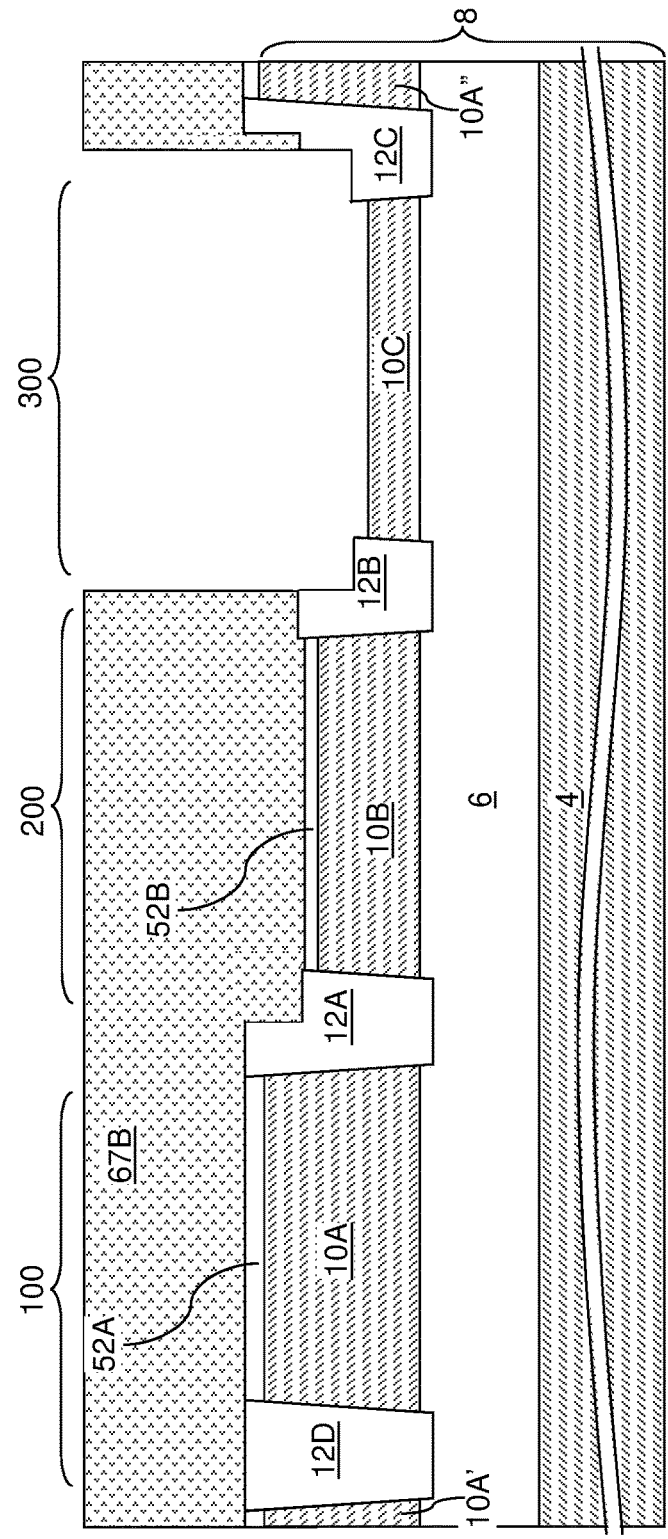

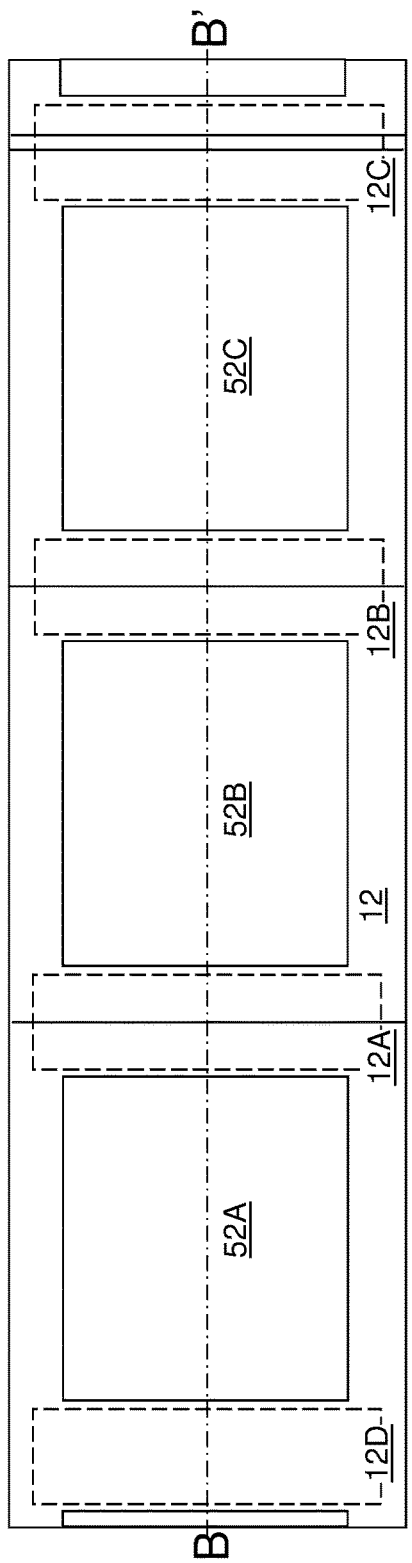
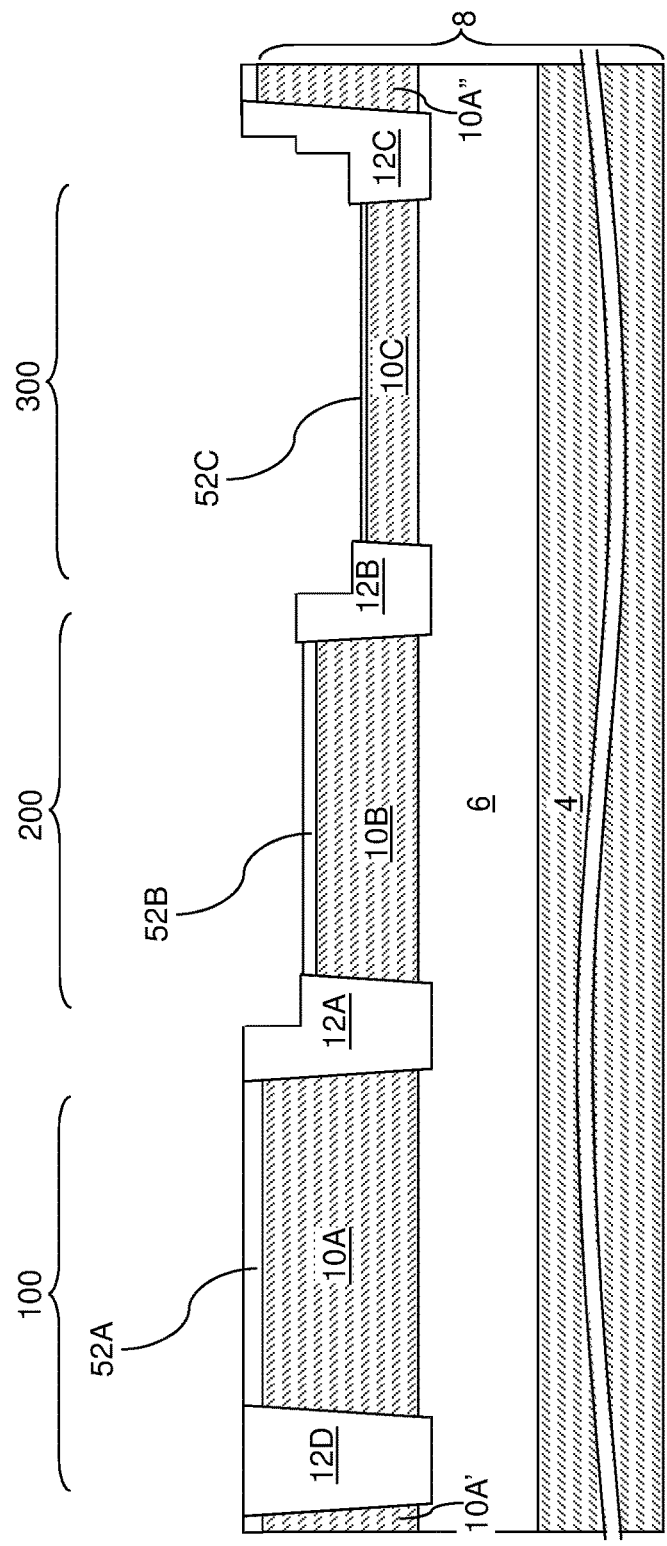

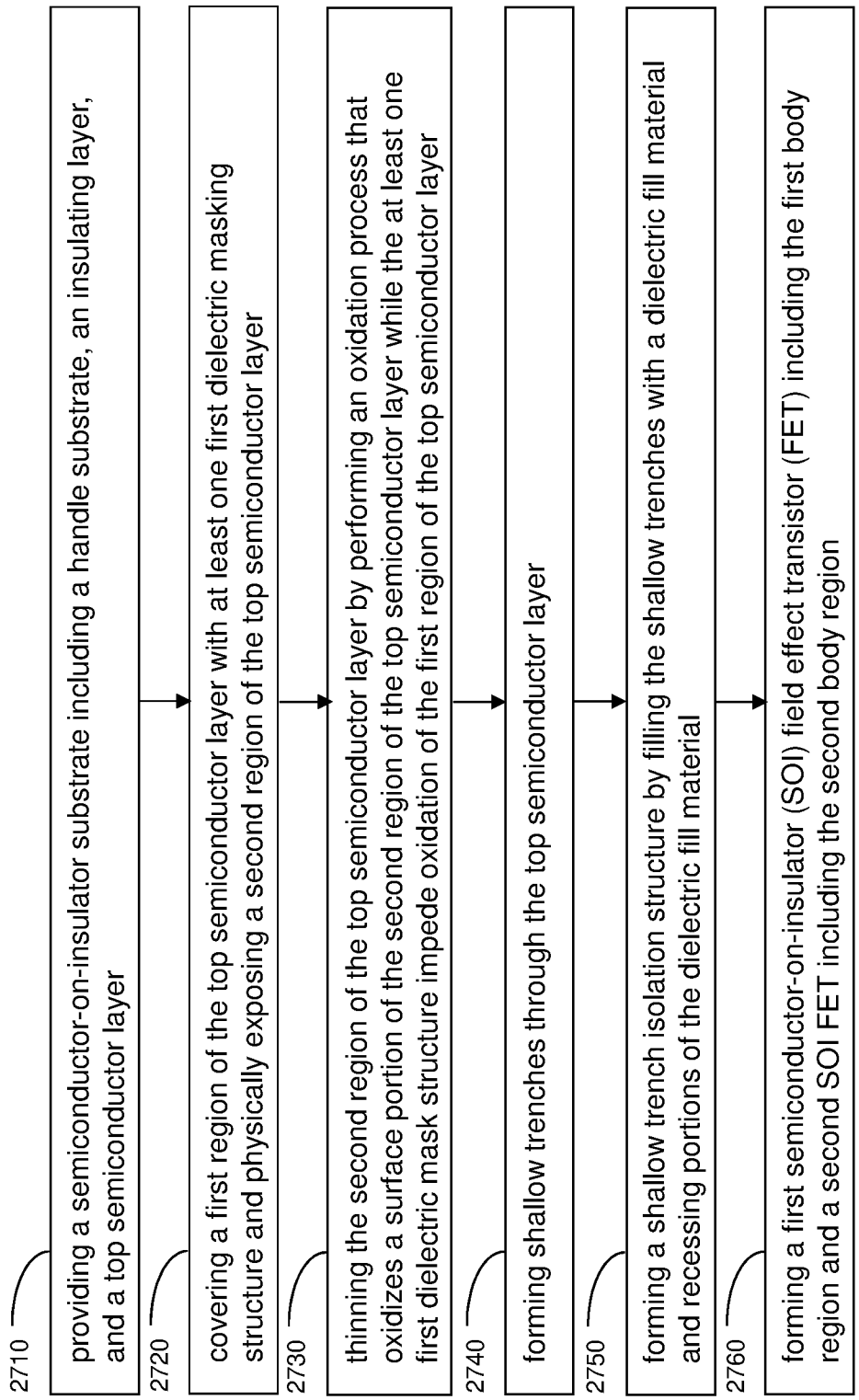

MULTIPLE THICKNESS SEMICONDUCTOR-ON-INSULATOR FIELD EFFECT TRANSISTORS AND METHODS OF FORMING THE SAME

RELATED APPLICATIONS

This application claims the benefit of priority from U.S. patent application Ser. No. 16/885,377 entitled "Multiple Thickness Semiconductor-On-Insulator Field Effect Transistors and Methods of Forming the Same" and filed on May 28, 2020, the entire contents of which are incorporated herein by reference for all purposes.

BACKGROUND

Semiconductor-on-insulator (SOI) field effect transistors are formed by providing a semiconductor-on-insulator substrate including a stack, from bottom to top, of a handle substrate, an insulating layer, and a top semiconductor layer, and by forming shallow trench isolation structures, various doped semiconductor regions, and gate stack structures in, or over, the top semiconductor layer. As such, each SOI field effect transistor has the same thickness. The device characteristics of the SOI field effect transistors may be determined by the thickness of the SOI field effect transistors. For example, if the depletion region within a floating body region does not extend across the entirety of the floating body region, a partially depleted SOI field effect transistor may be formed. Alternatively, if the depletion region within a floating body region extends across the entirety of the floating body region, a fully depleted SOI field effect transistor can be formed. Partially depleted SOI field effect transistors and fully depleted field effect transistors provide different device characteristics, and it may be desirable to employ partially depleted SOI field effect transistors and fully depleted SOI field effect transistors within a same semiconductor die. However, it is difficult to provide partially depleted SOI field effect transistors and fully depleted field effect transistors within a SOI substrate in which the top semiconductor layer has a same thickness throughout.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top-down view of a first exemplary structure after formation of a first semiconductor oxide layer on a top surface of a semiconductor-on-insulator substrate according to a first embodiment of the present disclosure.

FIG. 1B is a vertical cross-sectional view of the first exemplary structure along the plane B-B' of FIG. 1A.

FIG. 2A is a top-down view of the first exemplary structure after formation of a first diffusion barrier layer, application and patterning of a first photoresist layer, and transfer of a pattern in the first photoresist layer through the first diffusion barrier layer and the first semiconductor oxide layer according to the first embodiment of the present disclosure.

FIG. 2B is a vertical cross-sectional view of the first exemplary structure along the plane B-B' of FIG. 2A.

FIG. 3A is a top-down view of the first exemplary structure after an oxidation process that forms a second semiconductor oxide layer according to the first embodiment of the present disclosure.

FIG. 3B is a vertical cross-sectional view of the first exemplary structure along the plane B-B' of FIG. 3A.

FIG. 4A is a top-down view of the first exemplary structure after formation of a second diffusion barrier layer, application and patterning of a second photoresist layer, and transfer of a pattern in the second photoresist layer through the second diffusion barrier layer and the second semiconductor oxide layer according to the first embodiment of the present disclosure.

FIG. 4B is a vertical cross-sectional view of the first exemplary structure along the plane B-B' of FIG. 4A.

FIG. 7A is a top-down view of the first exemplary structure after formation of shallow trenches according to the first embodiment of the present disclosure.

FIG. 7C is a vertical cross-sectional view of an alternative embodiment of the first exemplary structure at the processing steps of FIGS. 7A and 7B.

FIG. 8A is a top-down view of the first exemplary structure after formation of a dielectric fill material layer according to the first embodiment of the present disclosure.

FIG. 9C is a vertical cross-sectional view of an alternative embodiment of the first exemplary structure at the processing steps of FIGS. 9A and 9B.

FIG. 10A is a top-down view of the first exemplary structure after removal of the planarization stop dielectric layer, the second diffusion barrier layer, and the first diffusion barrier layer, and recessing of the dielectric fill material layer according to the first embodiment of the present disclosure.

FIG. 10B is a vertical cross-sectional view of the first exemplary structure along the plane B-B' of FIG. 10A.

FIG. 15A is a top-down view of a second exemplary structure after formation of a silicon oxide pad layer and a silicon nitride pad layer on a top surface of a semiconductor-on-insulator substrate according to a second embodiment of the present disclosure.

FIG. 15B is a vertical cross-sectional view of the second exemplary structure along the plane B-B' of FIG. 15A.

FIG. 16A is a top-down view of the second exemplary structure after formation of shallow trenches according to the second embodiment of the present disclosure.

FIG. 16B is a vertical cross-sectional view of the second exemplary structure along the plane B-B' of FIG. 16A.

FIG. 17A is a top-down view of the second exemplary structure after formation of a shallow trench isolation structure according to the second embodiment of the present disclosure.

FIG. 17B is a vertical cross-sectional view of the second exemplary structure along the plane B-B' of FIG. 17A.

FIG. 18A is a top-down view of the second exemplary structure after removal of the silicon nitride pad layer and the silicon oxide pad layer according to the second embodiment of the present disclosure.

FIG. 18B is a vertical cross-sectional view of the second exemplary structure along the plane B-B' of FIG. 18A.

FIG. 19A is a top-down view of the second exemplary structure after formation of a first gate dielectric layer according to the second embodiment of the present disclosure.

FIG. 19B is a vertical cross-sectional view of the second exemplary structure along the plane B-B' of FIG. 19A.

FIG. 21A is a top-down view of the second exemplary structure after formation of a second gate dielectric layer according to the second embodiment of the present disclosure.

FIG. 21B is a vertical cross-sectional view of the second exemplary structure along the plane B-B' of FIG. 21A.

FIG. 22A is a top-down view of the second exemplary structure after vertically recessing the third body region while protecting the first body region and the second body region with a second patterned photoresist layer according to the second embodiment of the present disclosure.

FIG. 22B is a vertical cross-sectional view of the second exemplary structure along the plane B-B' of FIG. 22A.

FIG. 23A is a top-down view of the second exemplary structure after formation of a third gate dielectric layer according to the second embodiment of the present disclosure.

FIG. 23B is a vertical cross-sectional view of the second exemplary structure along the plane B-B' of FIG. 23A.

FIG. 27 is a first flowchart illustrating steps for forming the first exemplary structure of the present disclosure according to an embodiment of the present disclosure.

DETAILED DESCRIPTION

Figure 4C:
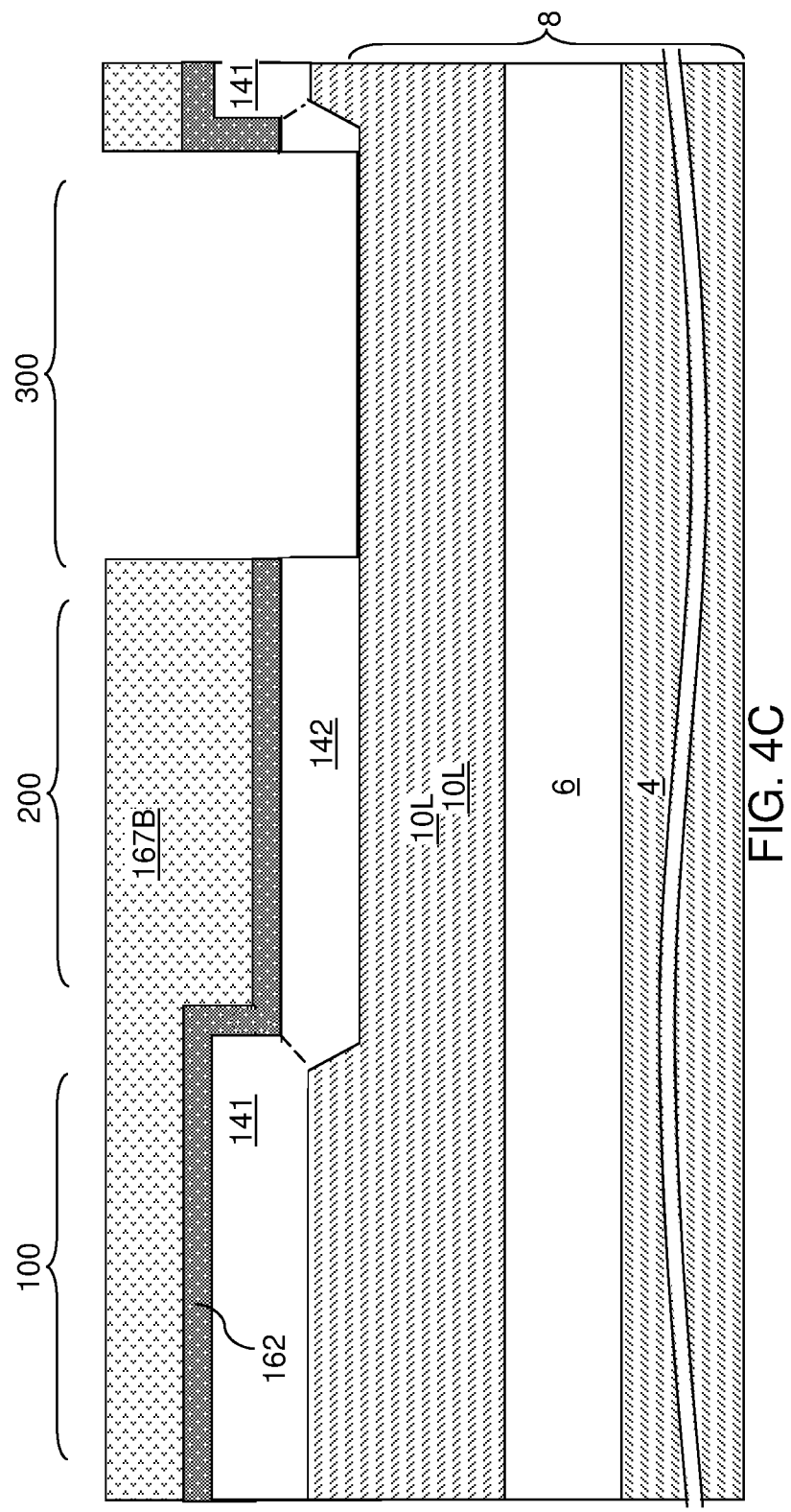
FIG. 4C is a vertical cross-sectional view of an alternative embodiment of the first exemplary structure at the processing steps of FIGS. 4A and 4B.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed generally to semiconductor devices, and specifically to semiconductor devices including semiconductor-on-insulator (SOI) field effect transistors located on a same SOI substrate and having different thicknesses for body regions and methods of forming the same. A top semiconductor layer of an SOI substrate may be patterned into multiple body regions that are laterally surrounded by a shallow trench isolation structure. The different body regions may be selectively thinned using a combination of patterned oxidation mask structures and oxidation processes that oxidize upper portions of unmasked body regions, or using a combination of patterned etch mask structures and etch processes that etch upper portions of unmasked body regions. The various embodiments of which are discussed in detail herebelow.

Referring to FIGS. 1A and 1B, a first exemplary structure according to a first embodiment of the present disclosure is illustrated, which includes a semiconductor-on-insulator substrate 8 including a top semiconductor layer 10L. The semiconductor-on-insulator substrate 8 includes, from bottom to top, a handle substrate 4, an insulating layer 6 (which is also referred to as a buried insulating layer), and a top semiconductor layer 10L. The handle substrate 4 may include any material that may provide mechanical support to overlying layers, and may have a thickness in a range from 60 nm to 2 mm, such as from 120 nm to 800 microns, although lesser and greater thicknesses may also be used. The handle substrate 4 may include a semiconductor material (such as silicon), an insulating material, or a conductive material. For example, the handle substrate 4 may include a semiconductor material. The insulating layer 6 includes an insulating material such as silicon oxide, and may have a thickness in a range from 50 nm to 600 nm, such as from 100 nm to 300 nm, although lesser and greater thicknesses may also be used. For example, the semiconductor-on-insulator substrate 8 may be a commercially available single crystalline semiconductor-on-insulator substrate.

The top semiconductor layer 10L may include a single crystalline semiconductor material or a polycrystalline semiconductor material. In one embodiment, the entirety of the top semiconductor layer 10L may include a single crystalline semiconductor material such as single crystalline silicon. The thickness of the top semiconductor layer 10L may be in a range from 300 nm to 600 nm, although lesser and greater thicknesses may also be used. In one embodiment, the thickness of the top semiconductor layer 10L may be selected to be thick enough to provide formation of a partially depleted semiconductor-on-insulator field effect transistor (SOI FET) thereupon. The semiconductor material of the top semiconductor layer 10L may have a doping of a first conductivity type, which may be p-type or n-type. The atomic concentration of dopants of the first conductivity type in the top semiconductor layer 10L may be in a range from $1.0 \times 10^{14}/cm^3$ to $3.0 \times 10^{17}/cm^3$, although lesser and greater atomic concentrations may also be used. In one embodiment, the top semiconductor layer 10L may comprise silicon and dopants of the first conductivity type.

A first semiconductor oxide layer 141 may be formed on the top surface of the top semiconductor layer 10L. The first semiconductor oxide layer 141 may be deposited by a conformal or non-conformal deposition process, or may be formed by oxidation of a surface portion of the top semiconductor layer 10L. In embodiments in which the first semiconductor oxide layer 141 is formed by oxidation of the surface portion of the top semiconductor layer 10L, the thickness of the top semiconductor layer 10L as initially provided may be thicker so that the thickness of the top semiconductor layer 10L after the oxidation process may be in a range from 200 nm to 500 nm, although lesser and greater thicknesses may also be used. The thickness of the first semiconductor oxide layer 141 may be in a range from 20 nm to 400 nm, such as from 40 nm to 200 nm, although lesser and greater thicknesses may also be used. The first semiconductor oxide layer 141, if present, may function as a stress reliever that reduces stress on the top semiconductor layer 10L during subsequent processing steps such as oxidation processes and a chemical mechanical planarization process.

The first exemplary structure may include multiple regions for forming devices such as field effect transistors. For example, the first exemplary structure may include a first device region 100 for forming a first SOI FET, a second device region 200 for forming a second SOI FET, and a third device region 300 for forming a third SOI FET. The region (portion) of the top semiconductor layer 10L within the first device region 100 is herein referred to as a first region of the top semiconductor layer 10L, the region of the top semiconductor layer 10L within the second device region 200 is herein referred to as a second region of the top semiconductor layer 10L, and the region of the top semiconductor layer 10L within the third device region 300 is herein referred to as a third region of the top semiconductor layer 10L. The top semiconductor layer 10L may include additional regions in which additional devices may be subsequently formed.

Referring to FIGS. 2A and 2B, a first diffusion barrier layer 161 may be deposited over the top surface of the first semiconductor oxide layer 141. The first diffusion barrier layer 161 includes a material that blocks or impedes diffusion of oxygen atoms therethrough. For example, the first diffusion barrier layer 161 may include silicon nitride or silicon carbide. The first diffusion barrier layer 161 may be deposited by a conformal or non-conformal deposition process, and may have a thickness in a range from 10 nm to 40 nm, although lesser and greater thicknesses may also be used.

A first photoresist layer 167A may be applied over the first diffusion barrier layer 161, and may be lithographically patterned to cover portions of the first diffusion barrier layer 161 in the first device region 100 without covering portions of the first diffusion barrier layer 161 in the second device region 200 or in the third device region 300. Additional portions of the first diffusion barrier layer 161 in additional device regions may, or may not, be covered depending on whether thinning of the portions of the top semiconductor layer 10L within each of the additional device regions is desired or not.

The pattern in the first photoresist layer 167A may be transferred through the first diffusion barrier layer 161 and the first semiconductor oxide layer 141 employing etch processes. The etch processes may include isotropic etch processes (such as wet etch processes), or may include anisotropic etch processes (such as reactive ion etch processes). Portions of the first diffusion barrier layer 161 and the first semiconductor oxide layer 141 may be removed from above the second region 200 and the third region 300 of the top semiconductor layer 10L during the etch processes. Thus, the first region 100 of the top semiconductor layer 10L is covered with the first diffusion barrier layer 161, and the second region 200 and the third region 300 of the top semiconductor layer 10L are physically exposed. The first photoresist layer 167A may be subsequently removed, for example, by ashing.

The first diffusion barrier layer 161 may be subsequently employed to prevent or impede the oxidation of underlying portions of the top semiconductor layer 10L. Silicon nitride or silicon carbide is effective as a diffusion-blocking material. Thus, the first diffusion barrier layer 161 in the first region 100 may provide significant thickness differential among different regions of the top semiconductor layer 10L through subsequent oxidation processes.

Referring to FIGS. 3A and 3B, an oxidation process is performed to covert unmasked surface portions of the top semiconductor layer 10L into a semiconductor oxide layer, which is herein referred to as a second semiconductor oxide layer 142. The oxidation process may include a thermal oxidation process or a plasma oxidation process. The surface portions of the second region 200 and the third region 300 of the top semiconductor layer 10L are converted into the second semiconductor oxide layer 142. As a consequence, the second region 200 and the third region 300 of the top semiconductor layer 10L are thinned by the oxidation process. The first diffusion barrier layer 161 impedes, and/or prevents, oxidation of the first region 100 of the top semiconductor layer 10L during the oxidation process. The second region 200 and the third region 300 of the top semiconductor layer 10L have a lesser thickness than the first region 100 of the top semiconductor layer 10L after the oxidation process. The thickness of the second region 200 and the third region 300 of the top semiconductor layer 10L may be in a range from 20% to 80% of the thickness of the top semiconductor layer 10L as provided at the processing steps of FIGS. 1A and 1B. For example, the thickness of the second region 200 and the third region 300 of the top semiconductor layer 10L may be in a range from 30 nm to 150 nm, such as from 50 nm to 100 nm, although lesser and greater thicknesses may also be used. The first diffusion barrier layer 161 minimizes reduction in thickness of the top semiconductor layer 10L in the first region 100, thereby providing significant thickness differential between the portions of the top semiconductor layer 10L in the second region 200 and the third region 300 relative to the portion of the top semiconductor layer 10L in the first region 100. Alternatively, the thickness of the first region 100 of the top semiconductor layer 10L may be collaterally reduced by a lesser extent than the thickness reduction in the second and third regions (200, 300) of the top semiconductor layer 10L in embodiments in which the at least one first diffusion barrier layer includes only the first semiconductor oxide layer 141. The second semiconductor oxide layer 142 is adjoined to the first semiconductor oxide layer 141 at a periphery thereof.

Referring to FIGS. 4A and 4B, a second diffusion barrier layer 162 may be deposited over the top surface of the first diffusion barrier layer 161 and the second semiconductor oxide layer 142. The second diffusion barrier layer 162 includes a material that blocks diffusion of oxygen atoms therethrough. For example, the second diffusion barrier layer 162 may include silicon nitride or silicon carbide. The second diffusion barrier layer 162 may be deposited by a conformal or non-conformal deposition process, and may have a thickness in a range from 10 nm to 40 nm, although lesser and greater thicknesses may also be used.

A second photoresist layer 167B may be applied over the second diffusion barrier layer 162, and may be lithographically patterned to cover portions of the second diffusion barrier layer 162 in the first device region 100 and in the second device region 200 without covering portions of the second diffusion barrier layer 162 in the third device region 300. Additional portions of the second diffusion barrier layer 162 in additional device regions may, or may not, be covered depending on whether subsequent thinning of the portions of the top semiconductor layer 10L within each of the additional device regions is desired or not.

The pattern in the second photoresist layer 167B may be transferred through the second diffusion barrier layer 162 and the second semiconductor oxide layer 142 using etch processes. The etch processes may include isotropic etch processes (such as wet etch processes), or may include anisotropic etch processes (such as reactive ion etch processes). Portions of the second diffusion barrier layer 162 and the second semiconductor oxide layer 142 are removed from above the third region 300 of the top semiconductor layer 10L during the etch processes. Thus, the first region 100 and the second region 200 of the top semiconductor layer 10L are covered with second diffusion barrier layer 162, and the third region 300 of the top semiconductor layer 10L are physically exposed. The second photoresist layer 167B may be subsequently removed, for example, by ashing.

Generally, the third region 300 of the top semiconductor layer 10L may be physically exposed while the first region 100 of the top semiconductor layer is covered with the first diffusion barrier layer 161 and while the second region 200 of the top semiconductor layer 10L is covered with a semiconductor oxide portion formed by oxidation of the surface portion of the second region 200 of the top semiconductor layer 10L, i.e., the second semiconductor oxide layer 142, and with the second diffusion barrier layer 162.

Referring to FIG. 4C, an alternative embodiment of the first exemplary structure is illustrated, which may be derived from the first exemplary structure of FIGS. 4A and 4B by removing the first diffusion barrier layer 161 after the processing steps of FIGS. 3A and 3B, i.e., prior to formation of the second diffusion barrier layer 162. In such an embodiment, the first diffusion barrier layer 161 may be removed selective to the top semiconductor layer 10L, the second semiconductor oxide layer 142, and the first semiconductor oxide layer 141. For example, a wet etch process may be used to remove the first diffusion barrier layer 161. In such an embodiment, the second diffusion barrier layer 162 may be formed directly on the top surface of the second semiconductor oxide layer 142 and the first semiconductor oxide layer 141.

Figure 5A:
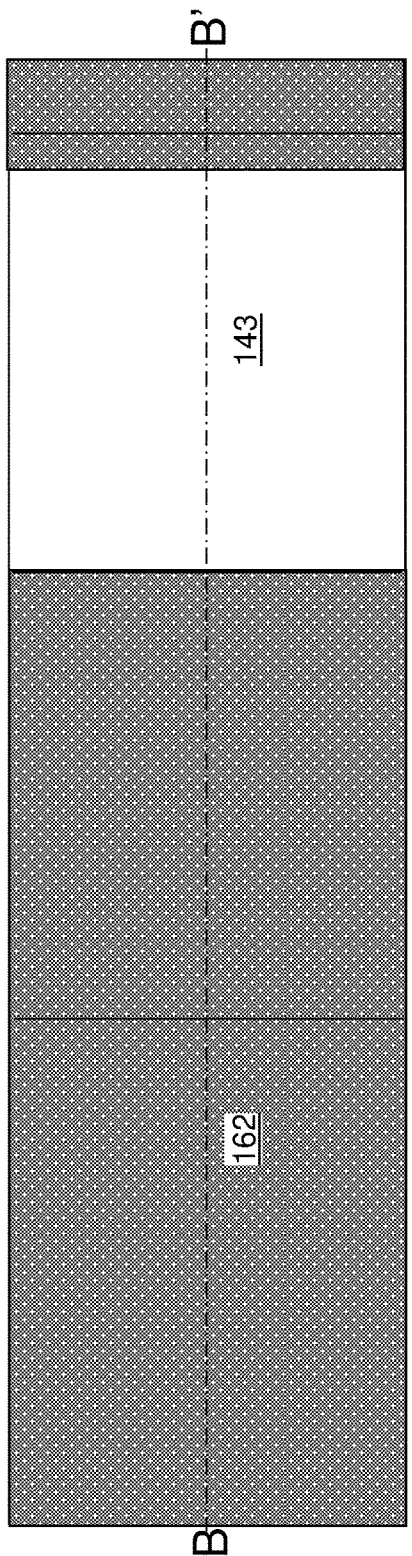
FIG. 5A is a top-down view of the first exemplary structure after an oxidation process that forms a third semiconductor oxide layer according to the first embodiment of the present disclosure.
Figure 5B:
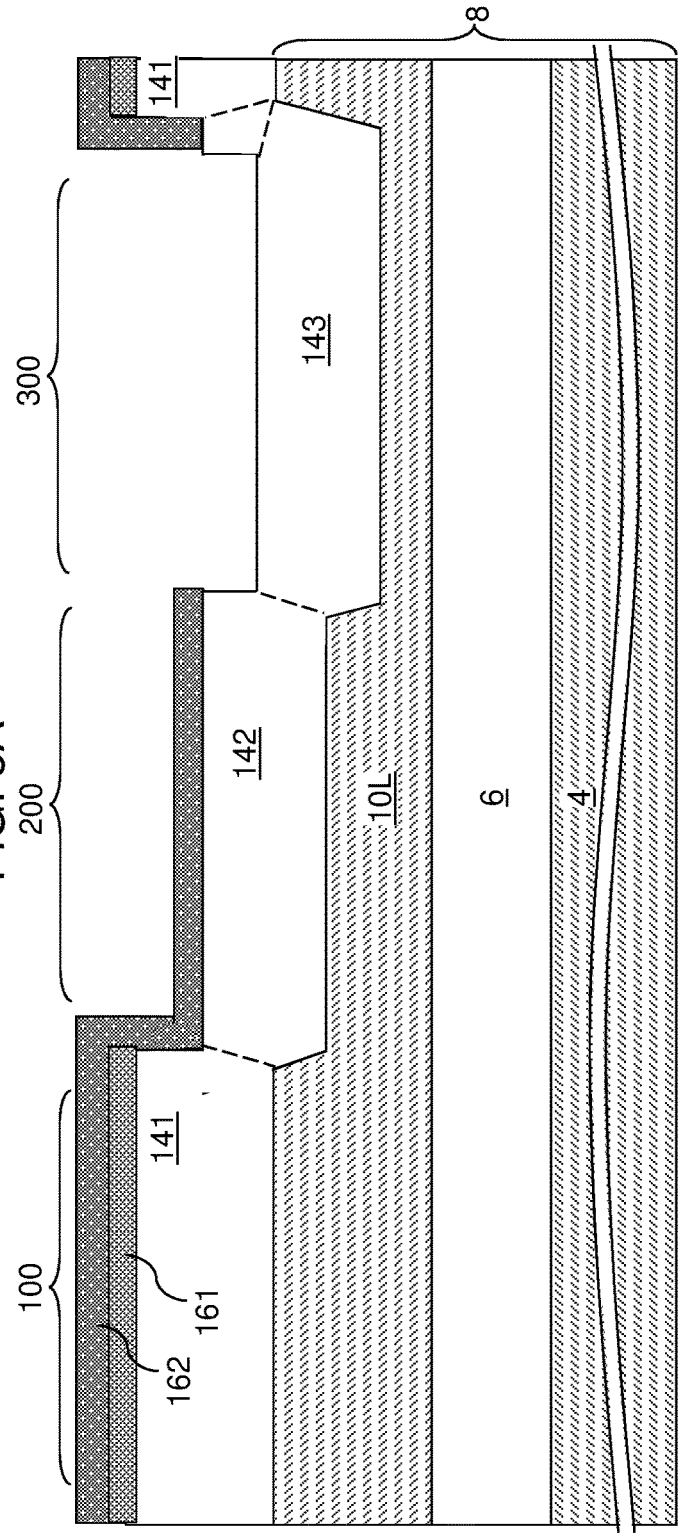
FIG. 5B is a vertical cross-sectional view of the first exemplary structure along the plane B-B' of FIG. 5A.

Referring to FIGS. 5A and 5B, an oxidation process is performed to covert unmasked surface portions of the top semiconductor layer 10L into a semiconductor oxide layer, which is herein referred to as a third semiconductor oxide layer 143. The oxidation process may include a thermal oxidation process or a plasma oxidation process. The surface portions of the third region 300 of the top semiconductor layer 10L are converted into the third semiconductor oxide layer 143. As a consequence, the third region 300 of the top semiconductor layer 10L is thinned by the oxidation process. The first and second diffusion barrier layer (161, 162) impedes oxidation of the first region 100 and the second region 200 of the top semiconductor layer 10L during the oxidation process. The third region 300 of the top semiconductor layer 10L has a lesser thickness than the second region 200 of the top semiconductor layer 10L after the oxidation process. The thickness of the third region 300 of the top semiconductor layer 10L may be in a range from 2% to 50% of the thickness of the top semiconductor layer 10L as provided at the processing steps of FIGS. 1A and 1B. For example, the thickness of the second region 200 and the third region 300 of the top semiconductor layer 10L may be in a range from 30 nm to 150 nm, such as from 50 nm to 100 nm, although lesser and greater thicknesses may also be used. The second diffusion barrier layer 162 minimizes thickness reduction in the portions of the top semiconductor layer 10L located in the first region 100 and the second region 200, thereby increasing the thickness differential between the portion of the top semiconductor layer 10L in the third region 300 relative to the portions of the top semiconductor layer 10L in the first region 100 and the second region 200. Alternatively, the thickness of the second region 200 of the top semiconductor layer 10L may be collaterally reduced by a lesser extent than the thickness reduction in the third region 300 of the top semiconductor layer 10L in embodiments in which the second diffusion barrier layer 162 is not used as at least one second diffusion barrier layer. The third semiconductor oxide layer 143 is adjoined to the second semiconductor oxide layer 142 at a first portion of the periphery thereof, and may be adjoined to the first semiconductor oxide layer 141 at a second portion of the periphery thereof.

Figure 5C:
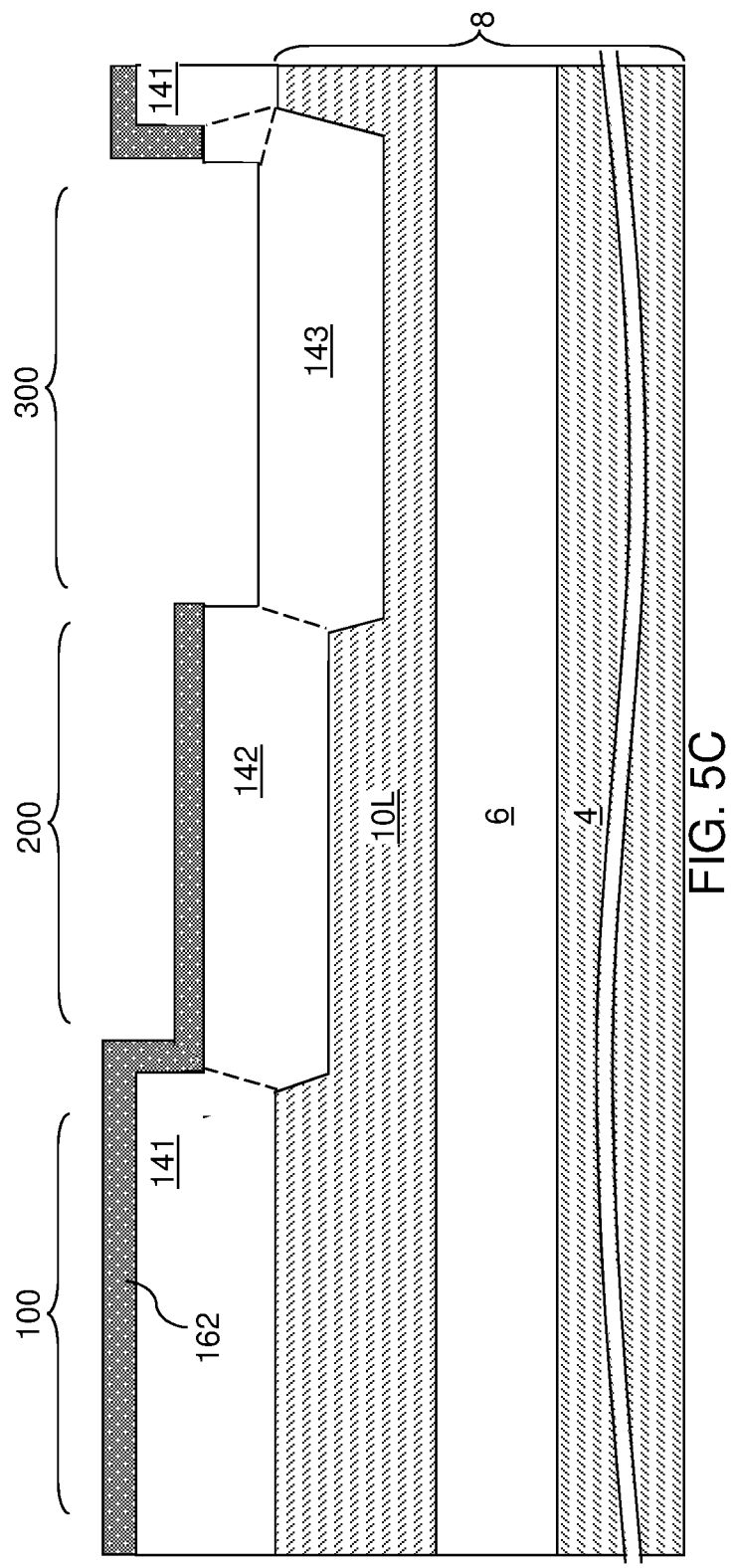
FIG. 5C is a vertical cross-sectional view of an alternative embodiment of the first exemplary structure at the processing steps of FIGS. 5A and 5B.

Referring to FIG. 5C, an alternative embodiment of the first exemplary structure is illustrated, which may be derived from the structure of FIG. 4C by performing the processing steps of FIGS. 5A and 5B.

Figure 6A:
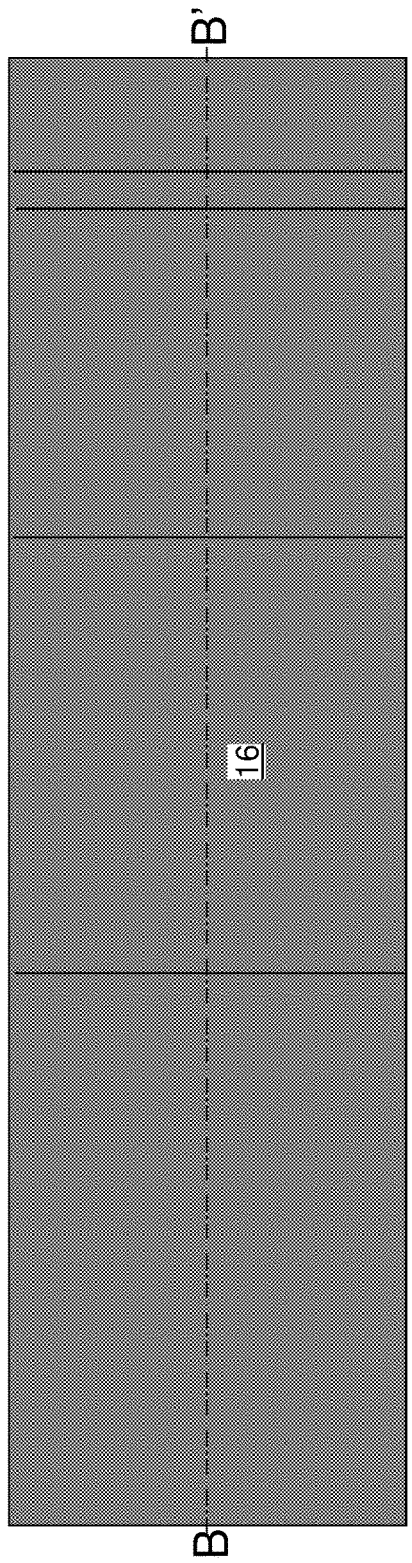
FIG. 6A is a top-down view of the first exemplary structure after formation of a planarization stop dielectric layer according to the first embodiment of the present disclosure.
Figure 6B:
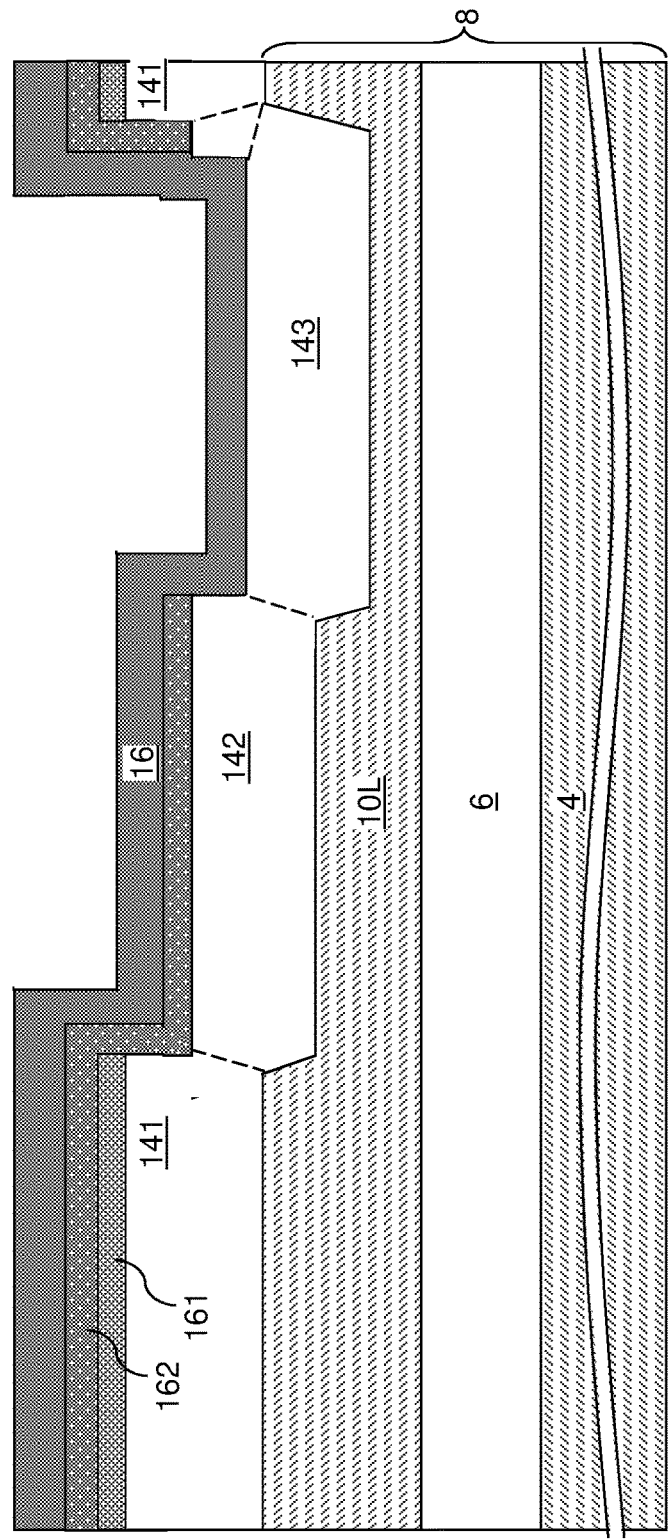
FIG. 6B is a vertical cross-sectional view of the first exemplary structure along the plane B-B' of FIG. 6A.

Referring to FIGS. 6A and 6B, a planarization stop dielectric layer 16 may be formed over the second diffusion barrier layer 162 and the third semiconductor oxide layer 143. The planarization stop dielectric layer 16 includes a dielectric material that may function as a stopping layer during a subsequent planarization process that planarizes a dielectric fill material for a shallow trench isolation structure. For example, the planarization stop dielectric layer 16 may include silicon nitride. The planarization stop dielectric layer 16 may be formed after thinning the second region 200 of the top semiconductor layer 10L and the third region 300 of the top semiconductor layer 10L. Generally, the planarization stop dielectric layer 16 may be formed over the second diffusion barrier layer 162, which includes the first diffusion barrier layer 161 and a semiconductor oxide portion formed by oxidation of the surface portion of the second region 200 of the top semiconductor layer 10L, i.e., the second semiconductor oxide layer 142. A top surface of the planarization stop dielectric layer 16 may comprise a plurality of horizontal surface segments that are vertically spaced from the insulating layer 6 by different vertical separation distances, and non-horizontal surface segments that connect neighboring pairs of the plurality of horizontal surface segments. In other words, the top surface of the planarization stop dielectric layer 16 includes topographical features including horizontal surfaces and non-horizontal surfaces that interconnect the horizontal surfaces. The non-horizontal surfaces may be tapered or vertical, and may include curved surface segments. The height of the topographical variations in the top surface of the planarization stop dielectric layer 16 may be in a range from 50 nm to 300 nm, although lesser and greater thicknesses may also be used.

According to an embodiment of the present disclosure, the height of the topological variations in the top surface of the planarization stop dielectric layer 16 may be minimized by selecting the thickness of the first semiconductor oxide layer 141 so that the height of the top surface of the first semiconductor oxide layer 141 is approximately at the height of the top surface of the third semiconductor oxide layer 143. Generally, silicon oxide derived from single crystalline silicon undergoes a volume expansion of about 117%. In other words, the volume of the silicon oxide material portion after oxidation of single crystalline silicon portion is about 217% of the volume of the single crystalline silicon portion. Thus, the thickness of the first semiconductor oxide layer 141 may be selected such that the height of the top surface of the third semiconductor oxide layer 143 is within 100 nm, and/or within 50 nm, of the height of the top surface of the first semiconductor oxide layer 141. In one embodiment, the top surface of the second semiconductor oxide layer 142 may be within 150 nm, and/or within 75 nm, of the height of the top surface of the first semiconductor oxide layer 141. According to an embodiment of the present disclosure, the total topographical variations in the top surface of the planarization stop dielectric layer 16 along the vertical direction may be less than 50%, and/or less than 25%, of the initial thickness of the top semiconductor layer 10L. For example, the total topographical variations in the top surface of the planarization stop dielectric layer 16 along the vertical direction may be in a range from 1% to 50%, such as from 3% to 25%, of the initial thickness of the top semiconductor layer 10L.

Figure 6C:
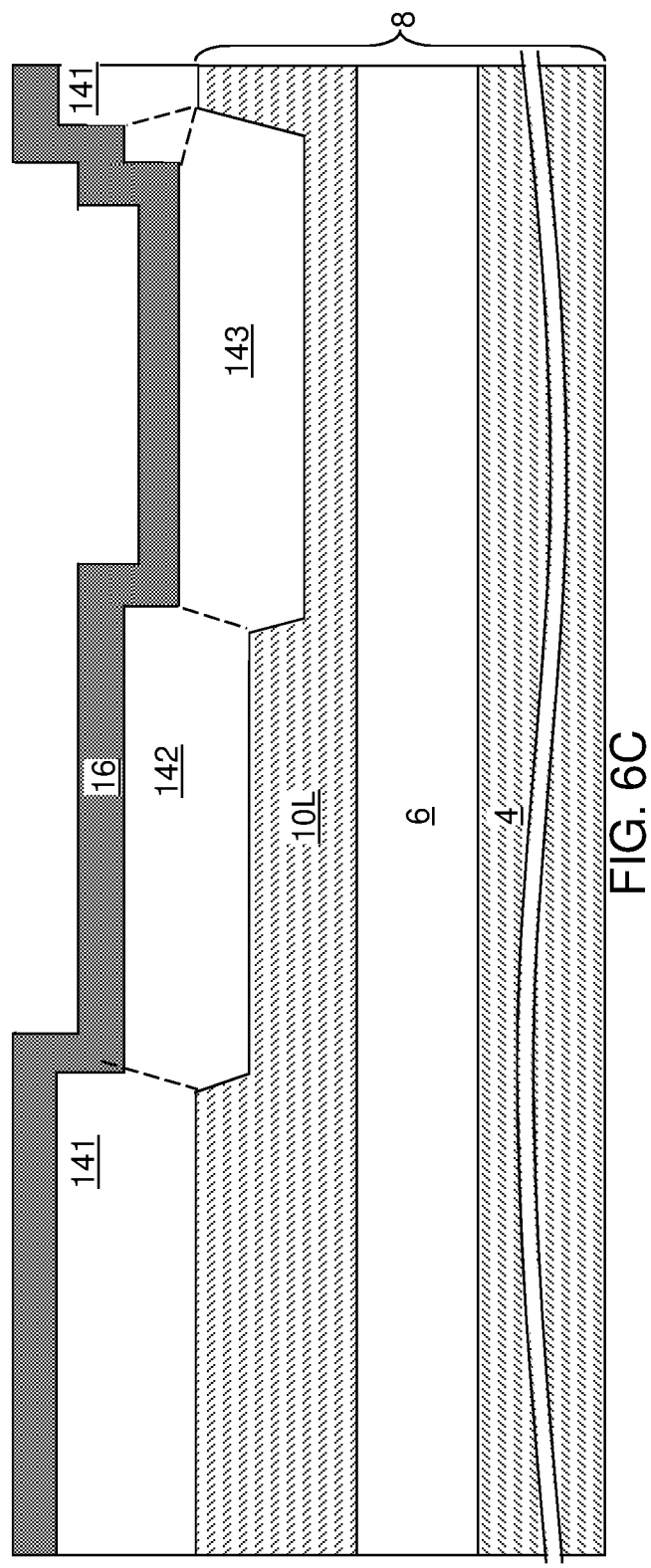
FIG. 6C is a vertical cross-sectional view of an alternative embodiment of the first exemplary structure at the processing steps of FIGS. 6A and 6B.

Referring to FIG. 6C, an alternative embodiment of the first exemplary structure is illustrated, which may be derived from the structure of FIG. 5C by removing the second diffusion barrier layer 162 prior to performing the processing steps of FIGS. 6A and 6B, or by removing the second diffusion barrier layer 162 and the first diffusion barrier layer 161 from the structure of FIGS. 5A and 5B prior to performing the processing steps of FIGS. 6A and 6B. In such an embodiment, the planarization stop dielectric layer 16 may be formed directly on top surfaces of the first semiconductor oxide layer 141 and the second semiconductor oxide layer 142.

Figure 7B:
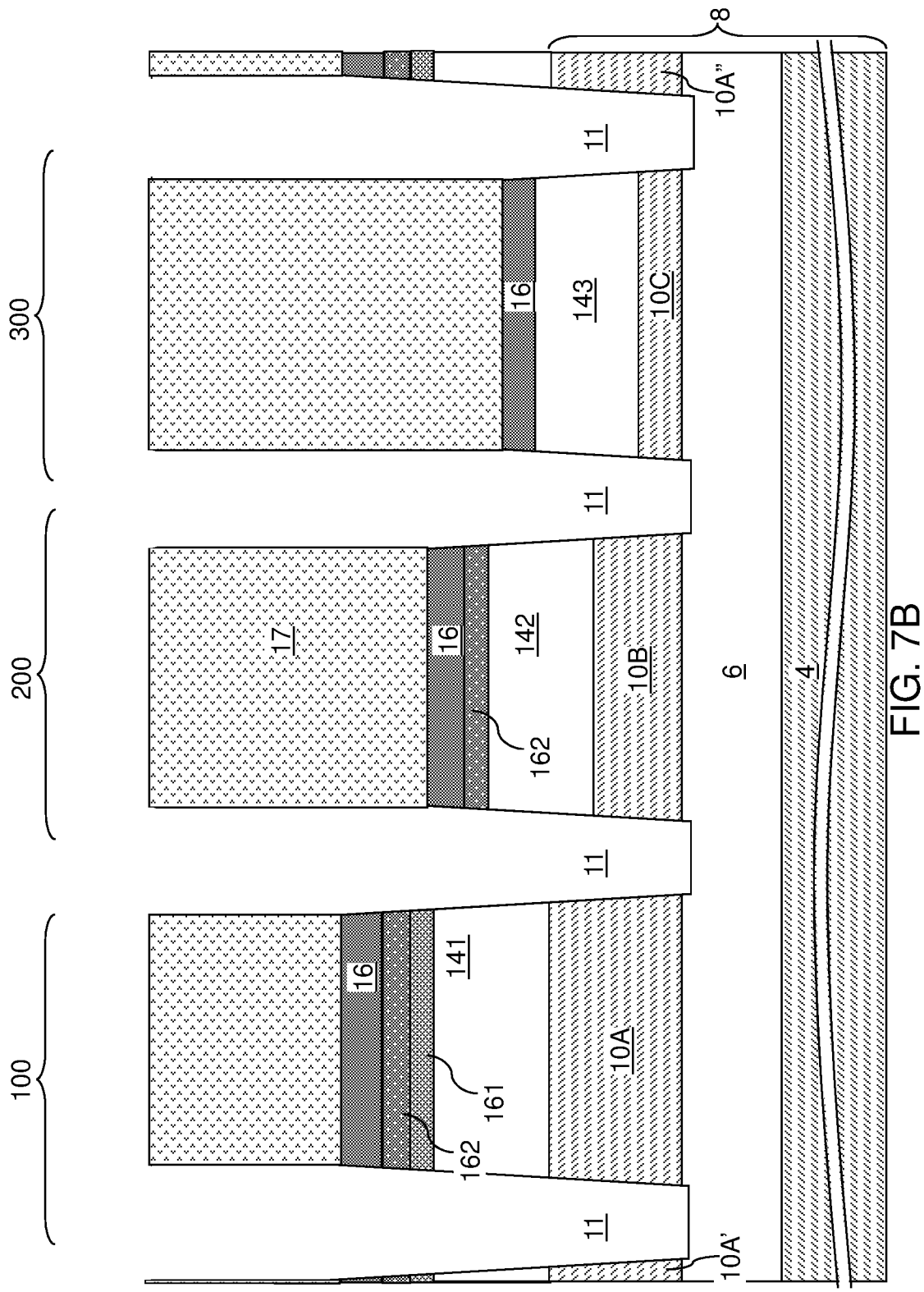
FIG. 7B is a vertical cross-sectional view of the first exemplary structure along the plane B-B' of FIG. 7A.

Referring to FIGS. 7A and 7B, a photoresist layer 17 may be applied over the top surface of the planarization stop dielectric layer 16, and may be lithographically patterned to cover discrete areas of the top semiconductor layer 10L. For example, a first area of the top semiconductor layer 10L may be covered within the area of the first device region 100, a second area of the top semiconductor layer 10L may be covered within the area of the second device region 200, a third area of the top semiconductor layer 10L may be covered within the area of the third device region 300, and so forth. In one embodiment, the areas covered by the patterned portions of the photoresist layer 17 may include rectangular areas.

An anisotropic etch process may be performed to transfer the pattern in the photoresist layer 17 through the planarization stop dielectric layer 16, the various diffusion barrier layers (161, 162), the various semiconductor oxide layers (141, 142, 143), and the top semiconductor layer 10L. The anisotropic etch process may include an etch step that indiscriminately etches the various underlying material layers without selectivity, and/or a plurality of etch steps that etches a material of a specific material layer selective to the material of an underlying material layer. In an illustrative example, the anisotropic etch process may include a first etch step that etches the materials of the planarization stop dielectric layer 16 and the various diffusion barrier layers (161, 162) selective to the material of the various semiconductor oxide layers (141, 142, 143), a second etch step that etches the material of the various semiconductor oxide layers (141, 142, 143) selective to the material of the top semiconductor layer 10L or without selectivity relative to the material of the top semiconductor layer 10L (i.e., at an approximately same etch rate), and a third etch step that etches the material of the top semiconductor layer 10L selective to the material of the insulating layer 6.

Shallow trenches 11 are formed in volumes from which the materials of the planarization stop dielectric layer 16, the various diffusion barrier layers (161, 162), the various semiconductor oxide layers (141, 142, 143), and the top semiconductor layer 10L are removed. The shallow trenches 11 divide remaining portions of the planarization stop dielectric layer 16, the various diffusion barrier layers (161, 162), the various semiconductor oxide layers (141, 142, 143), and the top semiconductor layer 10L into discrete layer stacks that are laterally spaced from one another. Patterned portions of the top semiconductor layer 10L may comprise a plurality of body regions (10A, 10B, 10C, 10A', 10A") that may be used to form semiconductor-on-insulator (SOI) field effect transistors (FETs). For example, a patterned portion of the top semiconductor layer 10L in the first device region 100 may include a first body region 10A, a patterned portion of the top semiconductor layer 10L in the second device region 200 may include a second body region 10B, and a patterned portion of the top semiconductor layer 10L in the third device region 300 may include a third body region 10C. Further, additional body regions (10A', 10A") may be formed in additional device regions. For example, a first additional body region 10A' and a second additional body region 10A" are illustrated in FIGS. 7A and 7B. Such additional body regions (10A', 10A") may have the same thickness as any of the first body region 10A, the second body region 10B, or the third body region 10C depending on the pattern of the first diffusion barrier layer 161 and the second diffusion barrier layer 162 that are used during the oxidation processes.

Each of the first body region 10A, the second body region 10B, and the third body region 10C may have a respective set of tapered sidewalls that are exposed to the shallow trenches 11. The taper angle of the tapered sidewalls of the body regions (10A, 10B, 10C, 10A', 10A") within respect to a vertical direction may be in a range from 0.1 degree to 10 degrees, such as from 0.2 degree to 5 degrees. The photoresist layer 17 may be subsequently removed, for example, by ashing.

Referring to FIG. 7C, an alternative embodiment of the first exemplary structure is illustrated at the processing steps of FIGS. 7A and 7B. The alternative embodiment of the first exemplary structure may be derived from the structure of FIG. 6C by performing the processing steps of FIGS. 7A and 7B.

Figure 8B:
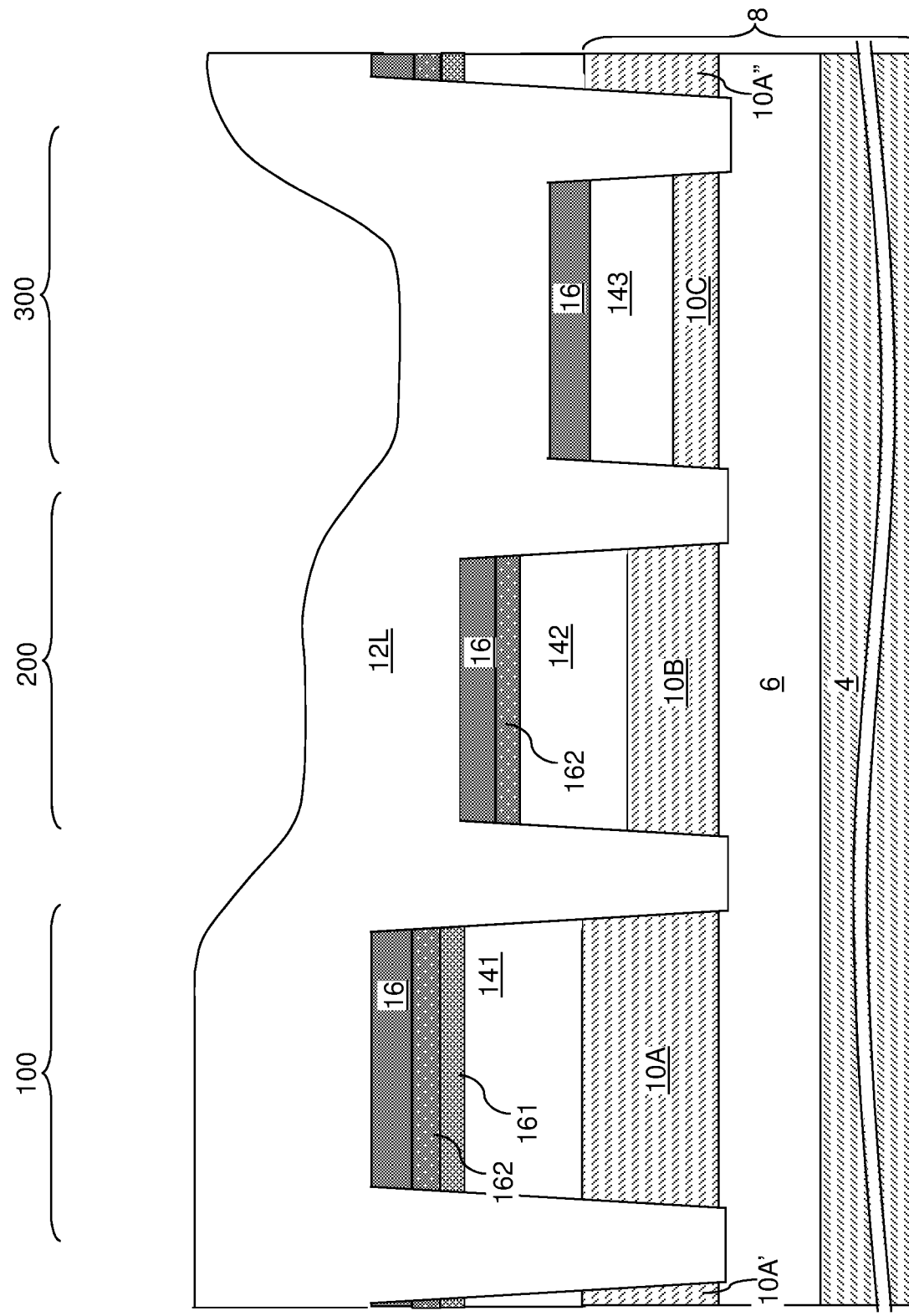
FIG. 8B is a vertical cross-sectional view of the first exemplary structure along the plane B-B' of FIG. 8A.

Referring to FIGS. 8A and 8B, a dielectric fill material may be conformally deposited in the shallow trenches 11 and over the planarization stop dielectric layer 16 to form a dielectric fill material layer 12L. The dielectric fill material includes a planarizable dielectric material such as undoped silicate glass or a doped silicate glass. Optionally, a reflow process (such as an anneal at an elevated temperature) may be performed to reflow the dielectric fill material in the shallow trenches 11 without voids or within minimal void volumes. The contour of the top surface of the dielectric fill material layer 12L generally replicates the contour of the top surface of the planarization stop dielectric layer 16.

Figure 8C:
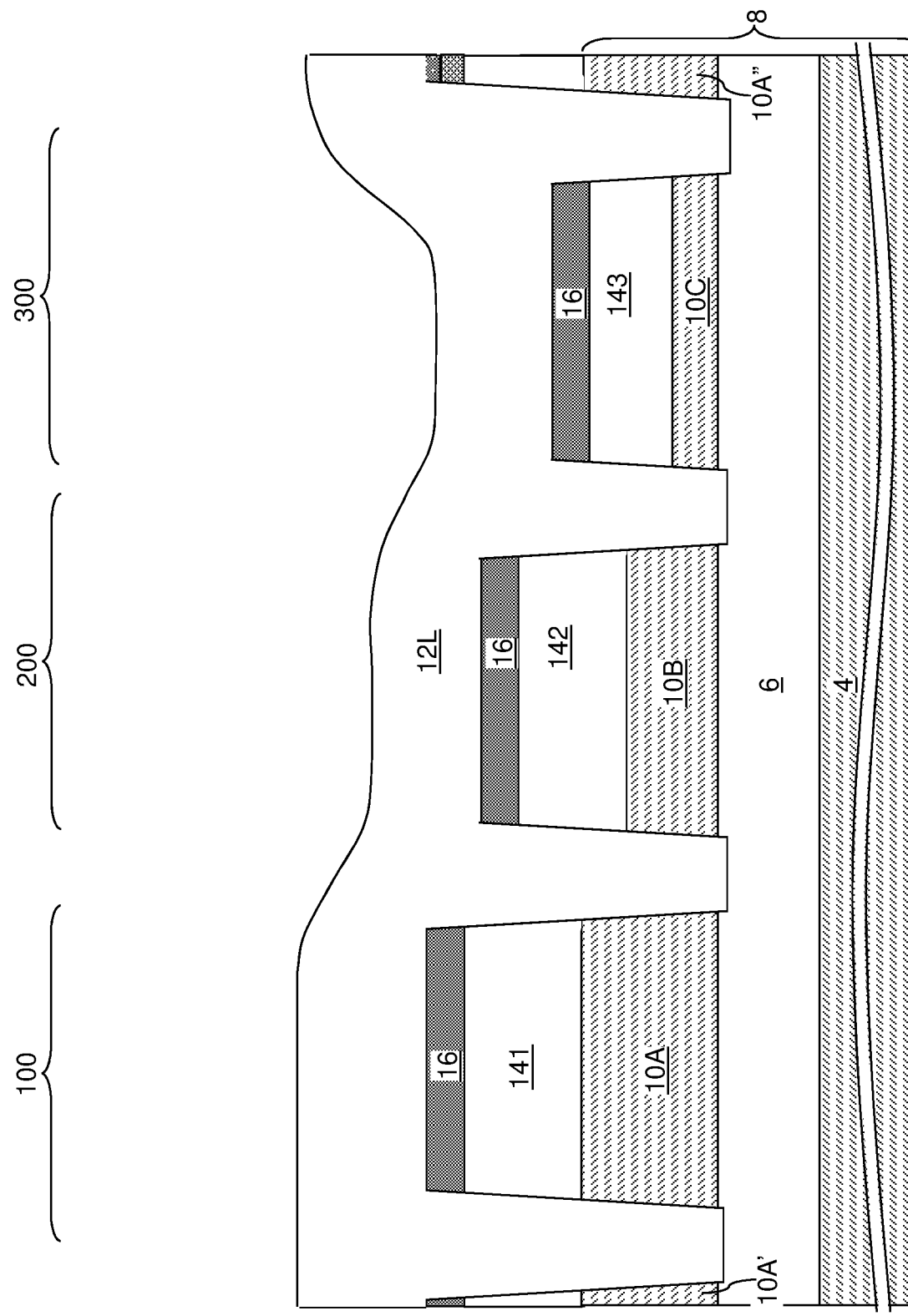
FIG. 8C is a vertical cross-sectional view of an alternative embodiment of the first exemplary structure at the processing steps of FIGS. 8A and 8B.

Referring to FIG. 8C, an alternative embodiment of the first exemplary structure is illustrated at the processing steps of FIGS. 8A and 8B. The alternative embodiment of the first exemplary structure may be derived from the structure of FIG. 7C by performing the processing steps of FIGS. 8A and 8B.

Figure 9A:
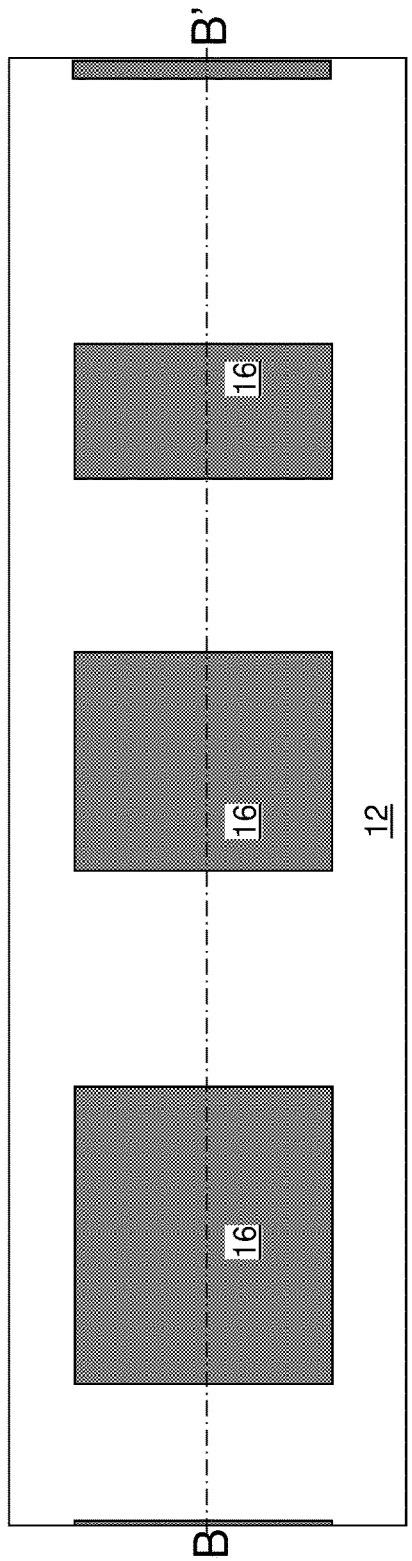
FIG. 9A is a top-down view of the first exemplary structure after planarization of the dielectric fill material layer according to the first embodiment of the present disclosure.
Figure 9B:
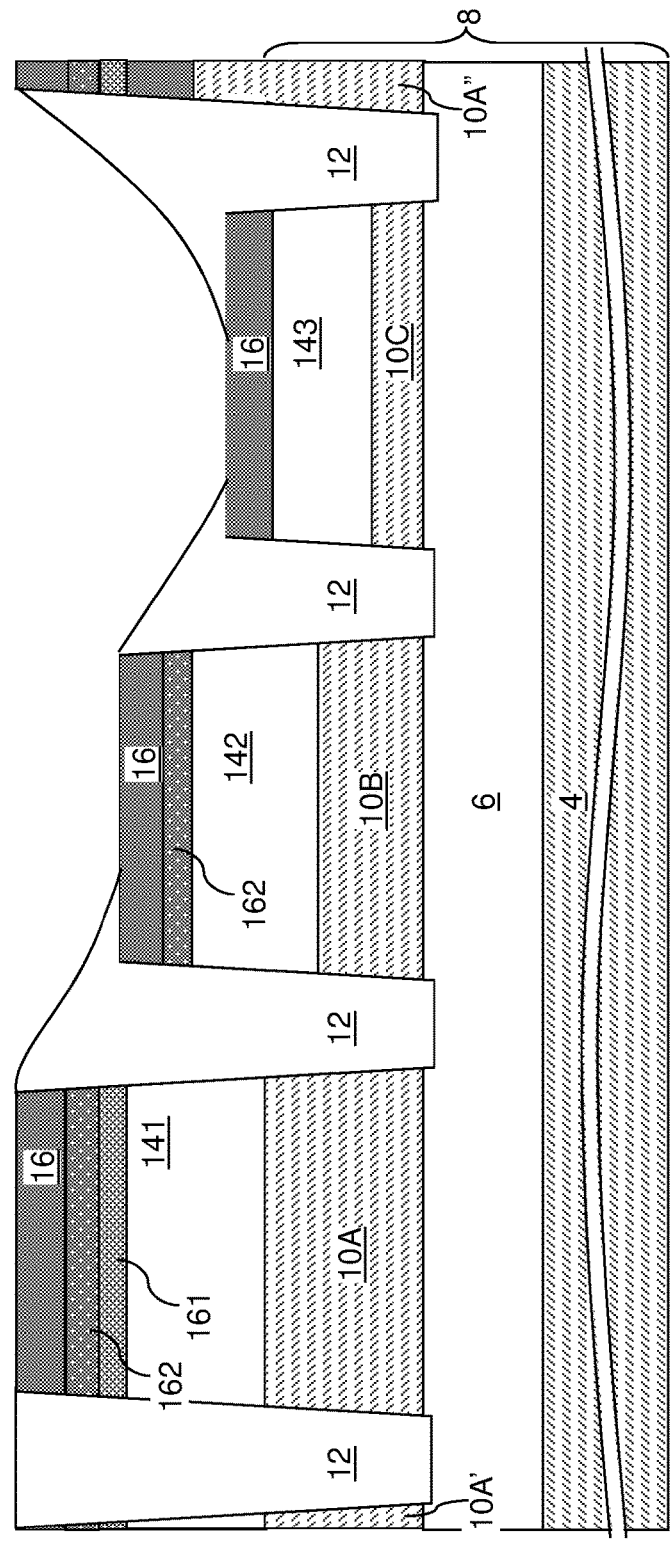
FIG. 9B is a vertical cross-sectional view of the first exemplary structure along the plane B-B' of FIG. 9A.

Referring to FIGS. 9A and 9B, a chemical mechanical planarization process may be performed to remove portions of the dielectric fill material layer 12L from above the top surface of the planarization stop dielectric layer 16. A high down-force may be used to induce dishing of the polished surface of the dielectric fill material layer 12L, and to remove portions of the dielectric fill material layer 12L from above the bottommost regions of the top surface of the planarization stop dielectric layer 16. In some embodiments, surface portions of the planarization stop dielectric layer 16 may be removed during the planarization process. A top surface of the planarization stop dielectric layer 16 may be physically exposed in each device region (100, 200, 300) after the planarization process. Remaining portions of the dielectric fill material may extend over first segments of a top surface of the planarization stop dielectric layer 16 that are proximal to the shallow trenches 11, and second segments of the top surface of the planarization stop dielectric layer 16 that are laterally spaced from the shallow trenches 11 may be physically exposed after the chemical mechanical planarization process.

Referring to FIG. 9C, an alternative embodiment of the first exemplary structure is illustrated at the processing steps of FIGS. 9A and 9B. The alternative embodiment of the first exemplary structure may be derived from the structure of FIG. 8C by performing the processing steps of FIGS. 9A and 9B.

Referring to FIGS. 10A and 10B, a first isotropic etch process may be performed to isotropically etch the planarization stop dielectric layer 16 selective to the dielectric fill material. The second diffusion barrier layer 162 and the first diffusion barrier layer 161 may be removed during the first isotropic etch process. In an illustrative example, the planarization stop dielectric layer 16 may include silicon nitride, and the first isotropic etch process may include a wet etch process using hot phosphoric acid.

Subsequently, the various semiconductor oxide layers (141, 142, 143) (i.e., the semiconductor oxide portions formed above the top semiconductor layer 10L at the processing steps of FIGS. 1A and 1B, 3A and 3B, and 5A and 5B) and the dielectric fill material of the dielectric fill material layer 12L may be isotropically etched selective to materials of the body regions (10A, 10B, 10C, 10A', 10A") simultaneously by performing a second isotropic etch process. For example, a wet etch process using dilute hydrofluoric acid may be performed to isotropically etch the various semiconductor oxide layers (141, 142, 143) and portions of the dielectric fill material layer 12L. The various semiconductor oxide layers (141, 142, 143) may be completely removed by the second isotropic etch process. The dielectric fill material layer 12L may be isotropically recessed such that remaining portions of the dielectric fill material are located between neighboring pairs of body regions (10A, 10B, 10C, 10A', 10A"). The remaining portion of the dielectric fill material constitutes a shallow trench isolation structure 12. Generally, the shallow trench isolation structure 12 may be formed by filling the shallow trenches 11 with a dielectric fill material, planarizing a predominant portion of the dielectric fill material overlying the planarization stop dielectric layer 16, removing the planarization stop dielectric layer 16 and any diffusion barrier layers (161, 162), and by recessing the dielectric fill material layer 12L and concurrently removing the various semiconductor oxide layers (141, 142, 143).

Portions of the shallow trench isolation structure 12 may be located between a pair of body regions (10A, 10B, 10C, 10A', 10A") having a height difference thereacross. For example, a first shallow trench isolation portion 12A located between the first body region 10A and the second body region 10B may have a height difference between an upper edge of a first sidewall that contacts the first body region 10A and an upper edge of a second sidewall that contacts the second body region 10B.

The upper edge of the first sidewall and the upper edge of a second sidewall may be connected by a continuous top surface of the first shallow trench isolation portion 12A that comprises a non-horizontal surface segment. In one embodiment, the first shallow trench isolation portion 12A may have a non-planar tilted top surface that continuously extends between the upper edge of the first sidewall of the first shallow trench isolation portion 12A that contacts the first body region 10A and the upper edge of the second sidewall of the first shallow trench isolation portion 12A that contacts the second body region 10B. In one embodiment, the continuous top surface of the first shallow trench isolation portion 12A may comprise a curved tapered surface that is free of a horizontal step or a vertical step.

The first body region 10A may have a first thickness, the second body region 10B may have a second thickness that is less than the first thickness, and the third body region 10C may have a third thickness that is less than the second thickness. The shallow trench isolation structure 12 may include a second shallow trench isolation portion 12B located between the second body region 10B and the third body region 10C and having a curved tapered surface. The shallow trench isolation structure may include a third shallow trench isolation portion 12C located between the third body region 10C and an additional body region 10A" having the first thickness and having a curved tapered surface.

In one embodiment, the plurality of body regions (10A, 1B, 10C, 10A', 10A") may comprise an additional body region 10A' located adjacent to the first body region 10A and having the first thickness. An additional portion of the shallow trench isolation structure 12, such as a fourth shallow trench isolation portion 12D, may be located between the first body region 10A and the additional body region 10A', and may have a curved top surface connecting an upper edge of a first sidewall of the additional portion of the shallow trench isolation structure that contacts the first body region 10A and an upper edge of a second sidewall of the additional portion of the shallow trench isolation structure 12 (such as the fourth shallow trench isolation portion 12D) that contacts the additional body region 10A'. In one embodiment, the first body region 10A and the additional body region 10A' may have the same thickness (such as the first thickness), and the upper edge of the first sidewall of the additional portion of the shallow trench isolation structure 12 and the upper edge of the second sidewall of the additional portion of the shallow trench isolation structure 12 may be located at a same distance from the insulating layer 6. In one embodiment, a center region of the curved top surface may be raised relative to the upper edge of the first sidewall of the additional portion of the shallow trench isolation structure 12 (such as the fourth shallow trench isolation portion 12D). Generally, the top surfaces of the portions of the shallow trench isolation structure 12 located between body regions (10A, 10B, 10C, 10A', 10A") having different thicknesses may be tapered and curved, and the top surfaces of the portions of the shallow trench isolation structure 12 located between body regions (10A, 10B, 10C, 10A', 10A") having the same thickness may be curved due to the isotropic nature of the etch process that recesses the dielectric fill material layer 12L.

Figure 11A:
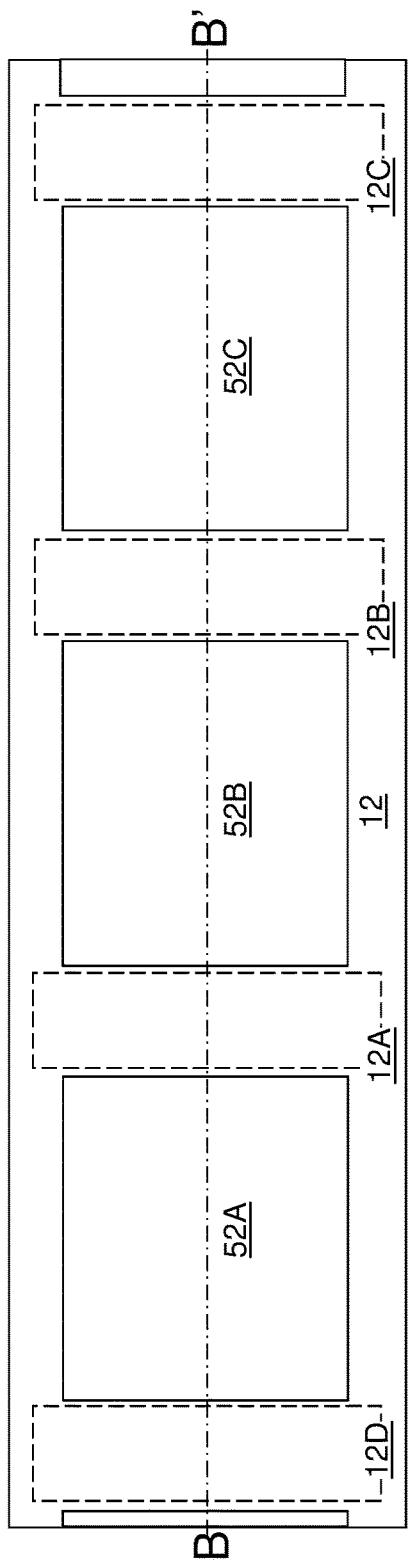
FIG. 11A is a top-down view of the first exemplary structure after formation of gate dielectric layers according to the first embodiment of the present disclosure.
Figure 11B:
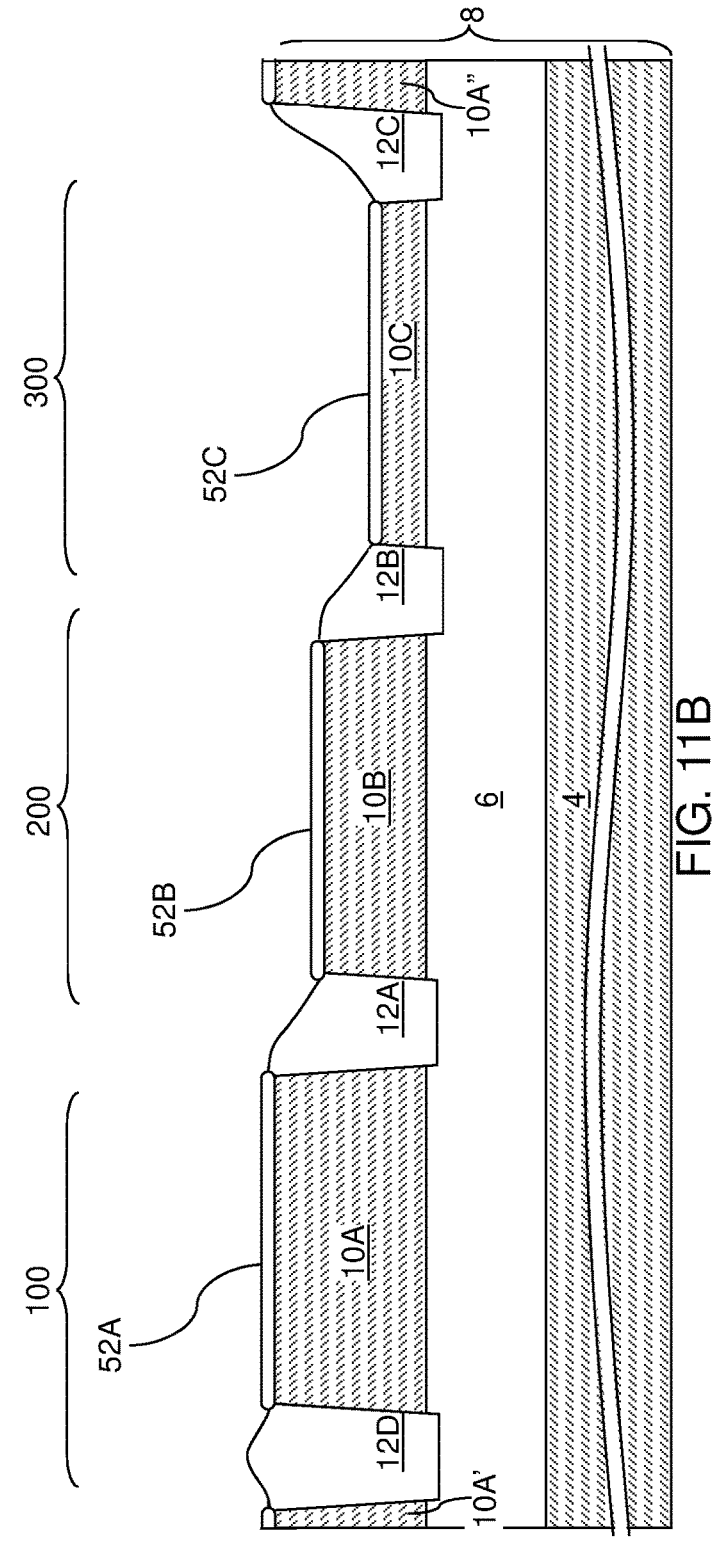
FIG. 11B is a vertical cross-sectional view of the first exemplary structure along the plane B-B' of FIG. 11A.

Referring to FIGS. 11A and 11B, gate dielectric layers (52A, 52B, 52C) may be formed on the top surfaces of the various body regions (10A, 10B, 10C, 10A', 10A"). The gate dielectric layers (52A, 52B, 52C) may be formed by thermal oxidation of surface portions of the semiconductor material in the various body regions (10A, 10B, 10C, 10A', 10A") and/or by deposition of a gate dielectric material layer (such as an aluminum oxide layer and/or a hafnium oxide layer). In one embodiment, the gate dielectric layers (52A, 52B, 52C) may be formed by a same set of processing steps, and may have the same material composition and the same thickness throughout.

Figure 12A:
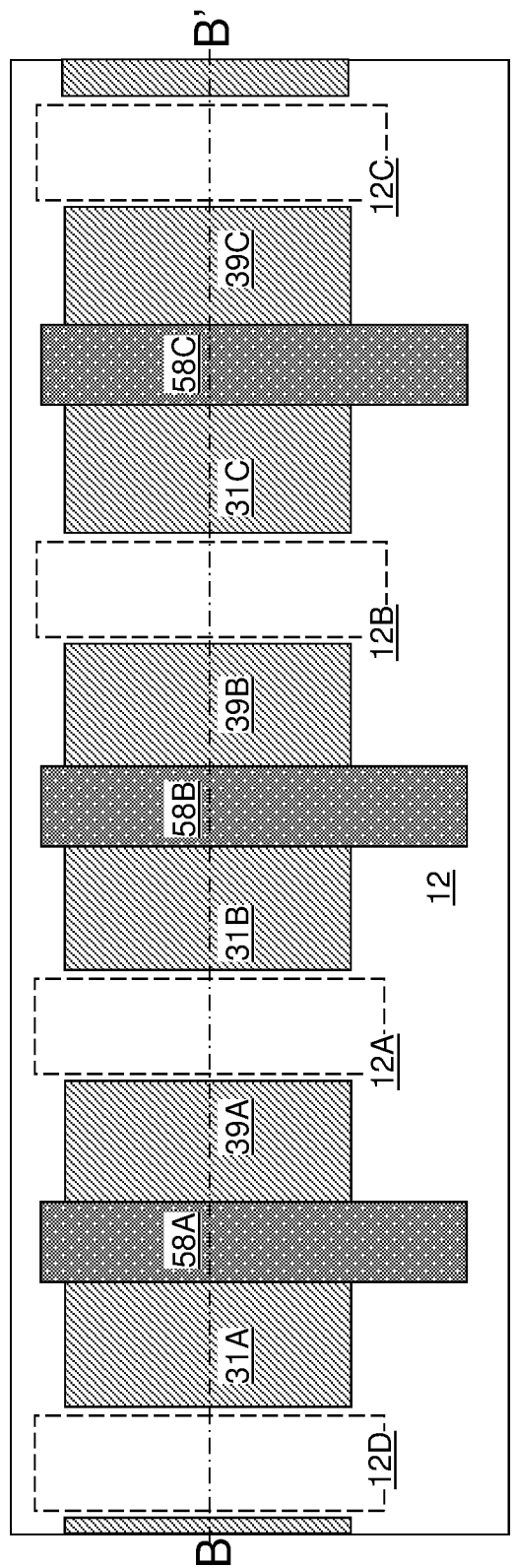
FIG. 12A is a top-down view of the first exemplary structure after formation of gate stack structures and extension regions according to the first embodiment of the present disclosure.
Figure 12B:
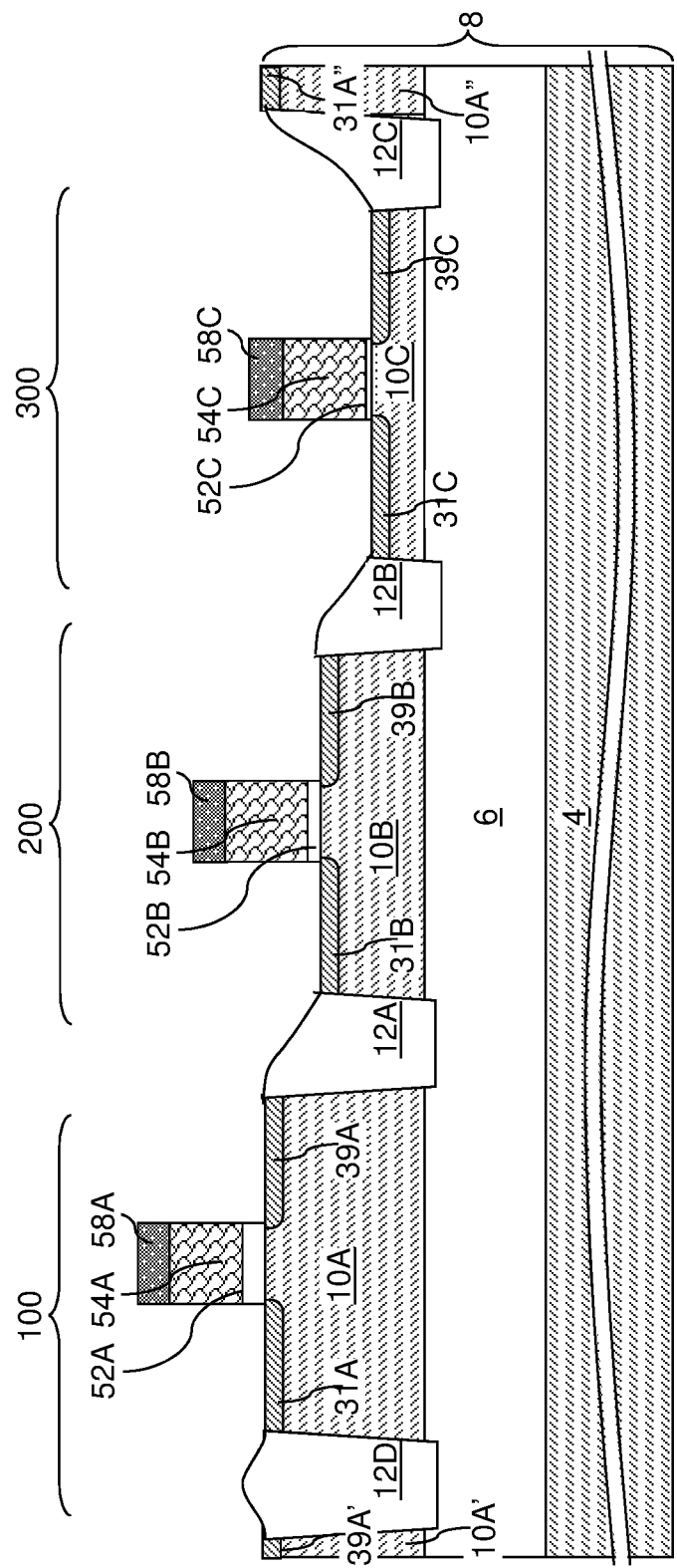
FIG. 12B is a vertical cross-sectional view of the first exemplary structure along the plane B-B' of FIG. 12A.

Referring to FIGS. 12A and 12B, a gate electrode material layer may be subsequently deposited over the gate dielectric layers (52A, 52B, 52C). The gate electrode material layer includes at least one conductive material. For example, the gate electrode material layer may include at least one of a metal, an intermetallic alloy, a metal-semiconductor alloy, a conductive metal oxide, a conductive metal nitride, a conductive metal carbide, and a doped semiconductor material including p-type dopants or n-type dopants at an average atomic concentration in a range from $5.0 \times 10^{19}/cm^3$ to $2.0 \times 10^{21}/cm^3$. The gate electrode material layer may be composed of a single conductive material or a stack of multiple conductive materials. The bottommost material within the gate electrode material layer may be selected to provide a suitable workfunction for the gate electrodes to be subsequently formed by patterning the gate electrode material layer. The gate electrode material layer may be formed by chemical vapor deposition, physical vapor deposition, vacuum evaporation, and/or atomic layer deposition. The thickness of the gate electrode material layer may be in a range from 50 nm to 300 nm, although lesser and greater thicknesses may also be used.

A gate cap dielectric layer may be formed over the gate electrode material layer. The gate cap dielectric layer includes a diffusion barrier material such as silicon nitride. Other suitable materials are within the contemplated scope of the disclosure. The thickness of the gate cap dielectric layer may be in a range from 20 nm to 60 nm, although lesser and greater thicknesses may also be used.

A photoresist layer (not shown) may be applied over the gate electrode material layer, and may be lithographically patterned to form line patterns that extend over a respective one of the device regions. An anisotropic etch process (such as a reaction ion etch process) may be performed to transfer the pattern in the photoresist layer through the layer stack of the gate cap dielectric layer, the gate electrode material layer, and the gate dielectric layers (52A, 52B, 52C). The body regions (10A, 10B, 10C, 10A', 10A") and the shallow trench isolation structure 12 may be used as etch stop structures.

Remaining portions of the layer stack of the gate cap dielectric layer, the gate electrode material layer, and the gate dielectric layers (52A, 52B, 52C) comprise gate stack structures {(52A, 54A, 58A), (52B, 54B, 58B), (52C, 54C, 58C)}. Each gate stack structures {(52A, 54A, 58A), (52B, 54B, 58B), (52C, 54C, 58C)} may include a first gate stack structure (52A, 54A, 58A) formed in the first device region 100 and including a first gate dielectric layer 52A, a first gate electrode 54A, and a first gate cap dielectric 58A; a second gate stack structure (52B, 54B, 58B) formed in the second device region 200 and including a second gate dielectric layer 52B, a second gate electrode 54B, and a second gate cap dielectric 58B; and a third gate stack structure (52C, 54C, 58C) formed in the third device region 300 and including a third gate dielectric layer 52C, a third gate electrode 54C, and a third gate cap dielectric 58C.

An extension ion implantation process may be performed to implant dopants of a second conductivity type into unmasked surface portions of the body regions (10A, 10B, 10C, 10A', 10A"). The second conductivity type is the opposite of the first conductivity type. For example, if the first conductivity type is p-type, the second conductivity type is n-type, and vice versa. The implanted surface portions of the body regions (10A, 10B, 10C, 10A', 10A") may be converted into doped semiconductor regions having a doping of the second conductivity type. A source extension region (31A, 31B, 31C) and a drain extension region (39A, 39B, 39C) may be formed within each device region (100, 200, 300) by conversion of the surface portions of the body regions (10A, 10B, 10C, 10A', 10A") into doped semiconductor material portions having a doping of the second conductivity type. The average atomic concentration of dopants of the second conductivity type in the source extension regions (31A, 31B, 31C) and the drain extension regions (39A, 39B, 39C) may be in a range from $1.0 \times 10^{19}/cm^3$ to $1.0 \times 10^{21}/cm^3$, although lesser and greater dopant concentrations may also be used. The depth of the source extension regions (31A, 31B, 31C) and the drain extension regions (39A, 39B, 39C) may be in a range from 5 nm to 50 nm, although lesser and greater depths may also be used. Each surface portion of the body regions (10A, 10B, 10C, 10A', 10A") that underlies a gate stack structure {(52A, 54A, 58A), (52B, 54B, 58B), (52C, 54C, 58C)} and is located between a neighboring pair of the source extension regions (31A, 31B, 31C) and the drain extension regions (39A, 39B, 39C) comprises a semiconductor channel. Each semiconductor channel extends between a source extension region (31A, 31B, 31C) and a drain extension region (39A, 39B, 39C), and may have a doping of the first conductivity type. Optionally, a halo implantation may be performed to implant dopants of the first conductivity type into regions that underlie the gate stack structures {(52A, 54A, 58A), (52B, 54B, 58B), (52C, 54C, 58C)}. The photoresist layer may be subsequently removed, for example, by ashing.

Figure 13A:
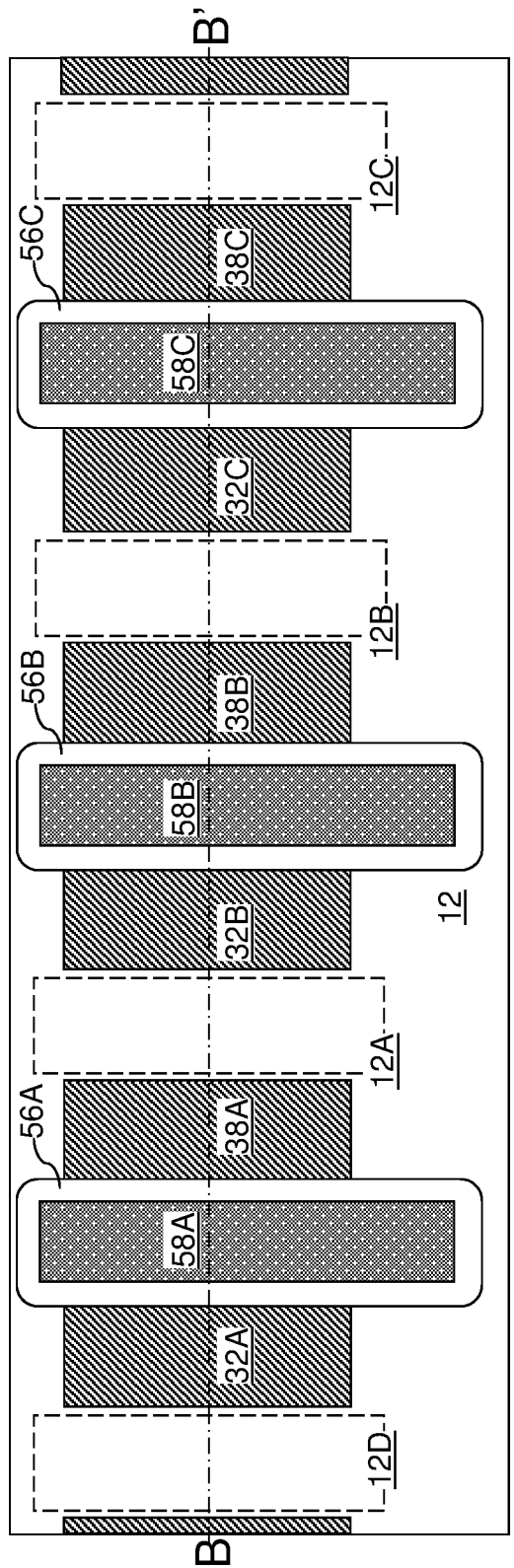
FIG. 13A is a top-down view of the first exemplary structure after formation of SOI field effect transistors according to the first embodiment of the present disclosure.
Figure 13B:
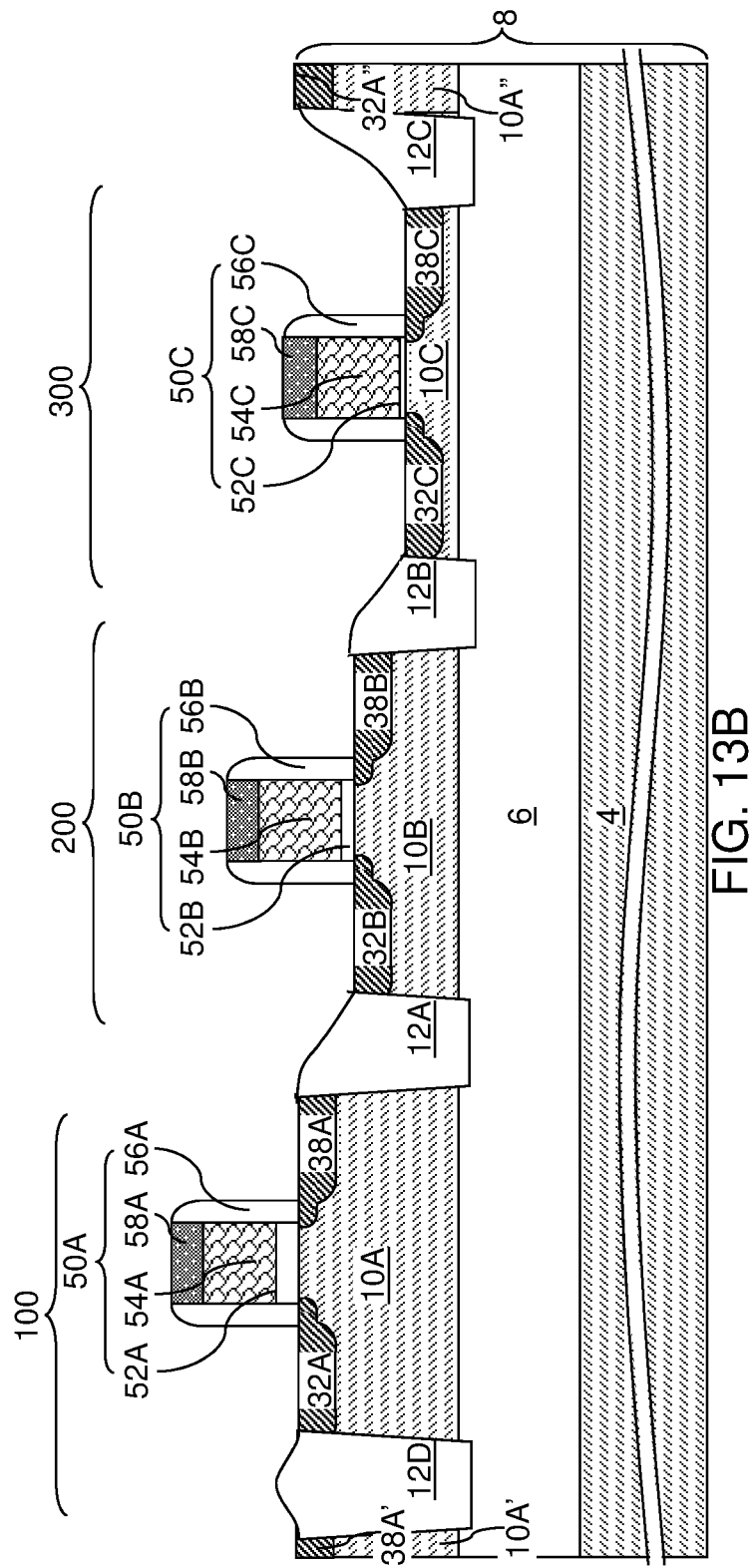
FIG. 13B is a vertical cross-sectional view of the first exemplary structure along the plane B-B' of FIG. 13A.

Referring to FIGS. 13A and 13B, at least one dielectric material such as silicon nitride and/or silicon oxide may be conformally deposited over the gate stack structures 50A, 50B, 50C{(52A, 54A, 58A), (52B, 54B, 58B), (52C, 54C, 58C)}, the source extension regions (31A, 31B, 31C), the drain extension regions (39A, 39B, 39C), and the shallow trench isolation structure 12. The at least one dielectric material may be anisotropic etched (for example, by a reactive ion etch process) to remove horizontal portions. Each remaining vertical portion that laterally surrounds a respective gate stack structure {(52A, 54A, 58A), (52B, 54B, 58B), (52C, 54C, 58C)} comprises a gate spacer (56A, 56B, 56C), which includes the at least one dielectric material. While only a single gate spacer (56A, 56B, 56C) is illustrated around each gate stack structure {(52A, 54A, 58A), (52B, 54B, 58B), (52C, 54C, 58C)}, embodiments are expressly contemplated herein in which multiple gate spacers are formed on a gate stack structure {(52A, 54A, 58A), (52B, 54B, 58B), (52C, 54C, 58C)} by sequentially depositing and anisotropically etching multiple dielectric materials. In one embodiment, a gate spacer (56A, 56B, 56C) may laterally surround a gate stack structure {(52A, 54A, 58A), (52B, 54B, 58B), (52C, 54C, 58C)}, and may be topologically homeomorphic to a torus, i.e., may be continuously deformed into a torus without forming a new opening or destroying an existing opening. The width of each gate spacer (56A, 56B, 56C) at the base portion (i.e., the lateral distance between an inner sidewall and an outer sidewall) may be in a range from 5 nm to 100 nm, although lesser and greater widths may also be used.

Dopants of the second conductivity type may be implanted into unmasked portions of the source extension regions (31A, 31B, 31C), the drain extension regions (39A, 39B, 39C), and underlying portions of the body regions (10A, 10B, 10C, 10A', 10A"). Implanted portions of the source extension regions (31A, 31B, 31C), the drain extension regions (39A, 39B, 39C), and underlying portions of the body regions (10A, 10B, 10C, 10A', 10A") form deep source regions and deep drain regions. The average atomic concentration of dopants of the second conductivity type in the deep source regions and the deep drain regions may be in a range from $5.0 \times 10^{19}/cm^3$ to $2.0 \times 10^{21}/cm^3$, although lesser and greater dopant concentrations may also be used. The average atomic concentration of dopants of the second conductivity type in the deep source regions and the deep drain regions is higher than the average atomic concentration of dopants of the second conductivity type in the remaining portions of the source extension regions (31A, 31B, 31C) and the drain extension regions (39A, 39B, 39C). The depth of the deep source regions and the deep drain regions may be in a range from 5 nm to 300 nm, such as from 10 nm to 100 nm, although lesser and greater depths may also be used. The depth of the deep source regions and the deep drain regions may be greater than the depth of the source extension regions (31A, 31B, 31C) and the drain extension regions (39A, 39B, 39C).

A deep source region and a deep drain region may be formed within each device region. Each combination of a source extension region (31A, 31B, 31C) and a deep source region constitutes a source region (32A, 32B, 32C), which may include a first source region 32A formed in the first device region 100, a second source region 32B formed in the second device region 200, and a third source region 32C formed in the third device region 300. Each combination of a drain extension region (39A, 39B, 39C) and a deep drain region constitutes a drain region (38A, 38B, 38C), which may include a first drain region 38A formed in the first device region 100, a second drain region 38B formed in the second device region 200, and a third drain region 38C formed in the third device region 300. Generally, a source region (32A, 32B, 32C) and a drain region (38A, 38B, 38C) may be formed in each body region (10A, 10B, 10C, 10A', 10A") that is laterally surrounded by the shallow trench isolation structure 12. A semiconductor channel extends between the source region (32A, 32B, 32C) and the drain region (38A, 38B, 38C) underneath a respective gate stack structure {(52A, 54A, 58A), (52B, 54B, 58B), (52C, 54C, 58C)}.

A semiconductor-on-insulator (SOI) field effect transistor (FET) may be formed within each device region (100, 200, 300). For example, a first SOI FET may be formed in, and over, the first body region 10A, a second SOI FET may be formed in, and over, the second body region 10B, and a third SOI FET may be formed in, and over, the third body region 10C.

Figure 14A:
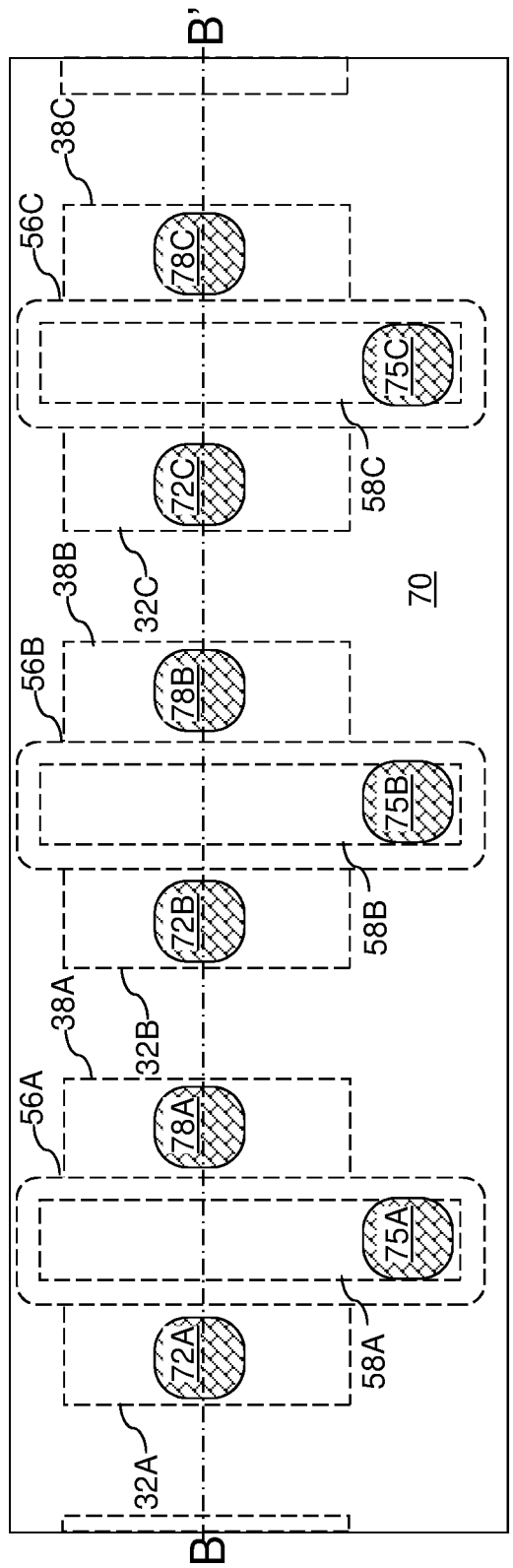
FIG. 14A is a top-down view of the first exemplary structure after formation of a contact-level dielectric layer and contact via structures according to the first embodiment of the present disclosure.
Figure 14B:
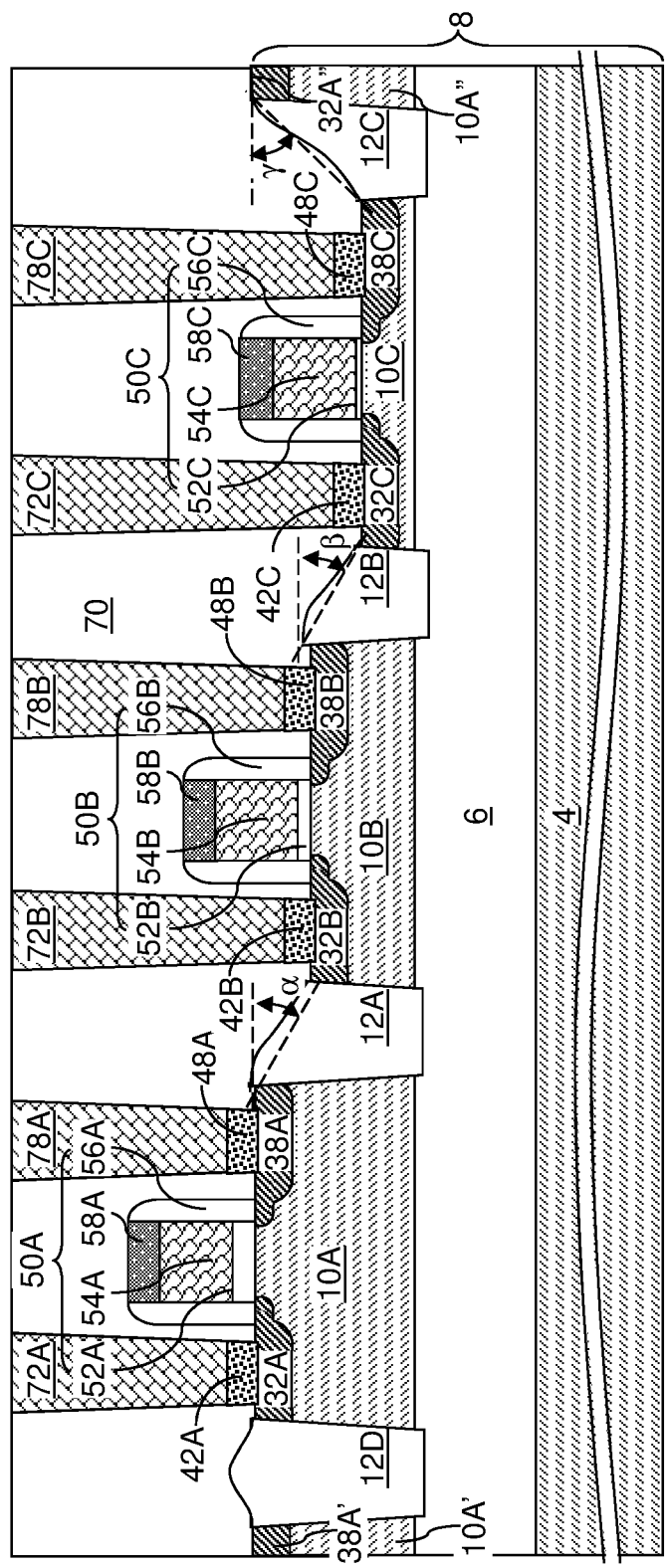
FIG. 14B is a vertical cross-sectional view of the first exemplary structure along the plane B-B' of FIG. 14A.

Referring to FIGS. 14A and 14B, a dielectric material may be deposited over the gate stack structures {(52A, 54A, 58A), (52B, 54B, 58B), (52C, 54C, 58C)}, the source region (32A, 32B, 32C), the drain region (38A, 38B, 38C), and the shallow trench isolation structure 12. The dielectric material may include a planarizable dielectric material such as undoped silicate glass or a doped silicate glass, or a self-planarizing dielectric material such as flowable oxide (FOX). The dielectric material may be deposited by a chemical vapor deposition process (such as a plasma-enhanced chemical vapor deposition process) or by spin coating. The top surface of the dielectric material may be planarized during, or after, the deposition process. A dielectric material layer having a planar (i.e., horizontal) top surface is formed, through which contact via structures are subsequently formed. As such, the dielectric material layer is herein referred to as a contact-level dielectric layer 70. The top surface of the contact-level dielectric layer 70 may be planar, and may be located above the top surface of the gate cap dielectrics (58A, 58B, 58C). The vertical distance between the top surface of the contact-level dielectric layer 70 and the top surfaces of the gate cap dielectrics (58A, 58B, 58C) may be in a range from 30 nm to 400 nm, although lesser and greater thicknesses may also be used.

A photoresist layer (not shown) may be applied over the contact-level dielectric layer 70, and may be lithographically patterned to form discrete openings therethrough. The openings in the photoresist layer may be formed over the source region (32A, 32B, 32C), the drain region (38A, 38B, 38C), and the gate electrodes (54A, 54B, 54C). An anisotropic etch process may be performed to form contact via cavities through the contact-level dielectric layer 70. The contact via cavities include source contact via cavities that extend from the top surface of the contact-level dielectric layer 70 to a top surface of a respective one of the source regions (32A, 32B, 32C), drain contact via cavities that extend from the top surface of the contact-level dielectric layer 70 to a top surface of a respective one of the drain regions (38A, 38B, 38C), and gate contact via cavities that extend from the top surface of the contact-level dielectric layer 70 to a top surface of a respective one of the gate electrodes (54A, 54B, 54C).

A metal that forms a metal-semiconductor alloy may be deposited into the contact via cavities by a conformal or non-conformal deposition method. If the body regions (10A, 10B, 10C, 10A', 10A'') comprise, and/or consist essentially of, doped silicon, the metal may be a material that may form a metal silicide. For example, the metal may include nickel, titanium, tungsten, molybdenum, platinum, or another metal that forms a metal silicide. An anneal process may be performed at an elevated temperature to induce formation of a metal silicide material. The elevated temperature may be in a range from 500 degrees Celsius to 750 degrees Celsius. Unreacted portions of the metal may be removed by a wet etch process that etches the metal selective to the metal silicide material. Remaining portions of the metal silicide material include source-side metal-semiconductor alloy regions (42A, 42B, 42C) contacting a respective source region (32A, 32B, 32C), drain-side metal-semiconductor alloy regions (48A, 48B, 48C) contacting a respective drain region (38A, 38B, 38C), and gate-side metal-semiconductor alloy regions (not expressly illustrated) contacting a respective gate electrode (54A, 54B, 54C).

A metallic liner including diffusion barrier material may be deposited at peripheral portions of the remaining volumes of the contact via cavities. The metallic liner includes a conducive metallic nitride material (such as TiN, TaN, or WN) and/or a metallic carbide material (such as TiC, TaC, or WC). The thickness of the metallic liner may be in a range from 3 nm to 15 nm, although lesser and greater thicknesses may also be used.

A metallic fill material such as Cu, W, Mo, Co, Ru, and/or another elemental metal or an intermetallic alloy may be deposited in remaining volumes of the contact via cavities. Portions of the metallic fill material and the metallic liner located above the horizontal plane including the top surface of the contact-level dielectric layer 70 may be removed by a planarization process. Each combination of a remaining portion of the metallic fill material and the metallic liner that fills a respective one of the contact via cavities constitutes a contact via structure (72A, 75A, 78A, 72B, 75B, 78B, 72C, 75C, 78C). The contact via structures (72A, 75A, 78A, 72B, 75B, 78B, 72C, 75C, 78C) include source contact via structures (72A, 72B, 72C) contacting a respective source-side metal-semiconductor alloy region (42A, 42B, 42C), drain contact via structures (78A, 78B, 78C) contacting a respective drain-side metal-semiconductor alloy region (48A, 48B, 48C), and gate contact via structures (75A, 75B, 75C) contacting a respective gate-side metal-semiconductor alloy region or a respective gate electrode (54A, 54B, 54C) (in case gate-side metal-semiconductor alloy regions are not formed).

The average slope angle α of the top surface of the first shallow trench isolation portion 12A, as measured between a horizontal plane and a Euclidean plane including top edges of two sidewalls of the first shallow trench isolation portion 12A that contact the first body region 10A and the second body region 10B, respectively, may be in a range from 1 degree to 20 degrees, such as from 2 degrees to 20 degrees, although lesser and greater angles may also be used. The average slope angle β of the top surface of the second shallow trench isolation portion 12B, as measured between a horizontal plane and a Euclidean plane including top edges of two sidewalls of the second shallow trench isolation portion 12B that contact the second body region 10B and the third body region 10C, respectively, may be in a range from 1 degree to 20 degrees, such as from 2 degrees to 20 degrees, although lesser and greater angles may also be used. The average slope angle γ of the top surface of the third shallow trench isolation portion 12C, as measured between a horizontal plane and a Euclidean plane including top edges of two sidewalls of the third shallow trench isolation portion 12C that contact the third body region 10C and an additional body region 10A'', respectively, may be in a range from 1 degree to 20 degrees, such as from 2 degrees to 20 degrees, although lesser and greater angles may also be used.

The thickness of the first body region 10A and the additional body regions (10A', 10A'') may be in a range from 150 nm to 500 nm, such as from 200 nm to 400 nm, although lesser and greater thicknesses may also be used. The thickness of the second body region 10B may be in a range from 30 nm to 150 nm, such as from 50 nm to 100 nm, although lesser and greater thicknesses may also be used. The thickness of the third body region 10C may be in a range from 10 nm to 70 nm, such as from 30 nm to 50 nm, although lesser and greater thicknesses may also be used.

Referring to FIGS. 1A-14B and according to various embodiments of the present disclosure, a semiconductor structure is provided, which comprises: a semiconductor-on-insulator substrate 8 including a handle substrate 4, an insulating layer 6, and a plurality of body regions (10A, 10B, 10C, 10A', 10A'') that are laterally surrounded by a shallow trench isolation structure 12, the plurality of body regions (10A, 10B, 10C, 10A', 10A'') comprising a first body region 10A having a first thickness and a second body region 10B having a second thickness than is less than the first thickness; a first semiconductor-on-insulator (SOI) field effect transistor (FET) including the first body region 10A, a first source region 32A and a first drain region 38A that are embedded in the first body region 10A, and a first gate stack structure (52A, 54A, 58A); and a second SOI FET including the second body region 10B, a second source region 32B and a second drain region 38B that are embedded in the second body region 10B, and a second gate stack structure (52B, 54B, 58B), wherein: a portion 12A of the shallow trench isolation structure 12 located between the first body region 10A and the second body region 10B has a height difference between an upper edge of a first sidewall that contacts the first body region 10A and an upper edge of a second sidewall that contacts the second body region 10B; and the upper edge of the first sidewall and the upper edge of a second sidewall are connected by a continuous top surface of the portion 12A of the shallow trench isolation structure 12 that comprises a non-horizontal surface segment.

In one embodiment, the continuous top surface of the portion 12A of the shallow trench isolation structure 12 comprises a curved tapered surface that is free of a horizontal step or a vertical step. In one embodiment, the plurality of body regions (10A, 10B, 10C, 10A', 10A") comprising an additional body region 10A' located adjacent to the first body region 10A and having the first thickness; and an additional portion 12D of the shallow trench isolation structure 12 is located between the first body region 10A and the additional body region 10A', and has a curved top surface connecting an upper edge of a first sidewall of the additional portion 12D of the shallow trench isolation structure 12 that contacts the first body region 10A and an upper edge of a second sidewall of the additional portion 12D of the shallow trench isolation structure 12 that contacts the additional body region 10A'.

In one embodiment, the upper edge of the first sidewall of the additional portion 12D of the shallow trench isolation structure 12 and the upper edge of the second sidewall of the additional portion 12D of the shallow trench isolation structure 12 are located at a same distance from the insulating layer 6. In one embodiment, a center region of the curved top surface may be raised relative to the upper edge of the first sidewall of the additional portion 12D of the shallow trench isolation structure 12.

Multiple types of semiconductor devices, such as field effect transistors, may be formed in the patterned portions of the top semiconductor layer 10L. In one embodiment, the first body region 10A, the second body region 10B, and the third body region 10C have different thicknesses, and different types of field effect transistors may be formed over the first body region 10A, the second body region 10B, and the third body region 10C. In an illustrative example, a first field effect transistor exhibiting device characteristics that are similar to device characteristics of a field effect transistor formed on a bulk semiconductor substrate may be formed in the first device region 100, a partially-depleted semiconductor-on-insulator (PDSOI) field effect transistor may be formed in the second device region 200, and a fully-depleted semiconductor-on-insulator (FDSOI) field effect transistor may be formed in the third device region 300. Thus, the first exemplary structure of the present disclosure provide formation of different types of semiconductor devices on a same substrate.

Referring to FIGS. 15A and 15B, a second exemplary structure according to a second embodiment of the present disclosure may be formed by providing a semiconductor-on-insulator (SOI) substrate 8, which may be the same as the SOI substrate 8 in FIGS. 1A and 1B. A silicon oxide pad layer 14 and a silicon nitride pad layer 116 may be formed over the top surface of the SOI substrate 8. The silicon oxide pad layer 14 may include silicon oxide, and may have thickness in a range from 5 nm to 50 nm, although lesser and greater thicknesses may also be used. The silicon nitride pad layer 116 includes silicon nitride, and may have a thickness in a range from 20 nm to 100 nm, although lesser and greater thicknesses may also be used.

Referring to FIGS. 16A and 16B, a photoresist layer may be applied over the silicon nitride pad layer 116, and may be lithographically patterned to cover discrete areas of the top semiconductor layer 10L. For example, a first area of the top semiconductor layer 10L may be covered within the area of the first device region 100, a second area of the top semiconductor layer 10L may be covered within the area of the second device region 200, a third area of the top semiconductor layer 10L may be covered within the area of the third device region 300, and so forth. In one embodiment, the areas covered by the patterned portions of the photoresist layer may include rectangular areas.

An anisotropic etch process may be performed to transfer the pattern in the photoresist layer through the silicon nitride pad layer 116, the silicon oxide pad layer 14, and the top semiconductor layer 10L. The anisotropic etch process may include an etch step that indiscriminately etches the various underlying material layers without selectivity, and/or a plurality of etch steps that etches a material of a specific material layer selective to the material of an underlying material layer. In an illustrative example, the anisotropic etch process may include a first etch step that etches the materials of the silicon nitride pad layer 116 selective to the material of the silicon oxide pad layer 14, a second etch step that etches the material of the silicon oxide pad layer 14 selective to the material of the top semiconductor layer 10L or without selectivity relative to the material of the top semiconductor layer 10L (i.e., at an approximately same etch rate), and a third etch step that etches the material of the top semiconductor layer 10L selective to the material of the insulating layer 6.

Shallow trenches 11 are formed in volumes from which the materials of the silicon nitride pad layer 116, the silicon oxide pad layer 14, and the top semiconductor layer 10L are removed. The shallow trenches 11 divide remaining portions of the silicon nitride pad layer 116, the silicon oxide pad layer 14, and the top semiconductor layer 10L into discrete layer stacks that are laterally spaced from one another. Patterned portions of the top semiconductor layer 10L may comprises a plurality of body regions (10A, 10B, 10C, 10A', 10A") that may be used to form semiconductor-on-insulator (SOI) field effect transistors (FETs). For example, a patterned portion of the top semiconductor layer 10L in the first device region 100 may include a first body region 10A, a patterned portion of the top semiconductor layer 10L in the second device region 200 may include a second body region 10B, and a patterned portion of the top semiconductor layer 10L in the third device region 300 may include a third body region 10C. Further, additional body regions (10A', 10A") may be formed in additional device regions. For example, a first additional body region 10A' and a second additional body region 10A" may be formed.

Each of the first body region 10A, the second body region 10B, and the third body region 10C may have a respective set of tapered sidewalls that are exposed to the shallow trenches 11. The taper angle of the tapered sidewalls of the body regions (10A, 10B, 10C, 10A', 10A") within respect to a vertical direction may be in a range from 0.1 degree to 10 degrees, such as from 0.2 degree to 5 degrees. The photoresist layer 17 may be subsequently removed, for example, by ashing.

Referring to FIGS. 17A and 17B, a dielectric fill material may be conformally deposited in the shallow trenches 11 and over the silicon nitride pad layer 116 to form a dielectric fill material layer. The dielectric fill material includes a planarizable dielectric material such as undoped silicate glass or a doped silicate glass. Optionally, a reflow process (such as an anneal at an elevated temperature) may be performed to reflow the dielectric fill material in the shallow trenches 11 without voids or within minimal void volumes.

A recess etch process may be performed to remove portions of the dielectric fill material layer overlying the top surface of the silicon nitride pad layer. Further, the recess etch process may be continued to vertically recess the top surface of the remaining portion of the dielectric fill material layer below the horizontal plane including the top surface of the silicon nitride pad layer 116. In one embodiment, the recess etch process may be continued until the top surface of the remaining portion of the dielectric fill material layer is formed between the horizontal plane including the top surface of the silicon nitride pad layer 116 and the horizontal plane including the bottom surface of the silicon nitride pad layer 116. The remaining continuous portion of the dielectric fill material comprises a shallow trench isolation structure 12.

Generally, the shallow trench isolation structure 12 may be formed depositing the dielectric fill material in the shallow trenches 11 and over the silicon nitride pad layer 116, and by recessing the dielectric fill material below the horizontal plane including the top surface of the silicon nitride pad layer 116. The remaining portion of the dielectric fill material after recessing the dielectric fill material comprises the shallow trench isolation structure 12, which is formed in the shallow trenches 11 and contacts the top surface of the insulating layer 6. In one embodiment, the entirety of a top surface of the shallow trench isolation structure 12 may be formed within a same horizontal plane. The shallow trench isolation structure 12 is formed through the top semiconductor layer 10L. The shallow trench isolation structure 12 laterally surrounds pattered portions of the top semiconductor layer 10L that comprise a plurality of body regions (10A, 10B, 10C, 10A', 10A"). The plurality of body regions (10A, 10B, 10C, 10A', 10A") may include the first body region 10A formed in the first device region 100, the second body region 10B formed in the second device region 200, and the third body region 10C formed in the third device region 300.

Referring to FIGS. 18A and 18B, the silicon nitride pad layer 116 may be removed by a first etch process. For example, a wet etch process using hot phosphoric acid may be used to remove the silicon nitride pad layer 116. The silicon oxide pad layer 14 may be subsequently removed by a second etch process. For example, a wet etch process using dilute hydrofluoric acid may be used to remove the silicon oxide pad layer 14. Surface portions of the shallow trench isolation structure 12 may be collaterally recessed isotropically during the second etch process. The shallow trench isolation structure 12 may include top surfaces that are located within the same horizontal plane.

The shallow trench isolation structure 12 may include multiple shallow trench isolation portions (12A, 12B, 12C, 12D) that are located between a respective neighboring pair of body regions (10A, 10B, 10C, 10A', 10A"). For example, the shallow trench isolation structure 12 may include a first shallow trench isolation portion 12A located between the first body region 10A and the second body region 10B, a second shallow trench isolation portion 12B located between the second body region 10B and the third body region 10C, a third shallow trench isolation portion 12C located between the third body region 10C and an additional body region 10A", and an additional shallow trench isolation portion 12D located between the first body region 10A and yet another additional body region 10A'.

Referring to FIGS. 19A and 19B, a first gate dielectric layer 52A may be formed on the top surfaces of the various body regions (10A, 10B, 10C, 10A', 10A"). The first gate dielectric layer 52A may be formed by thermal oxidation of surface portions of the semiconductor material in the various body regions (10A, 10B, 10C, 10A', 10A") and/or by deposition of a gate dielectric material layer (such as an aluminum oxide layer and/or a hafnium oxide layer). In one embodiment, the body regions (10A, 10B, 10C, 10A', 10A") may be formed by a same set of processing steps, and may have the same material composition and the same thickness throughout. In one embodiment, the first gate dielectric layer 52A may include a first semiconductor oxide layer that is formed on the top surfaces of the body regions (10A, 10B, 10C, 10A', 10A").

Figure 20A:
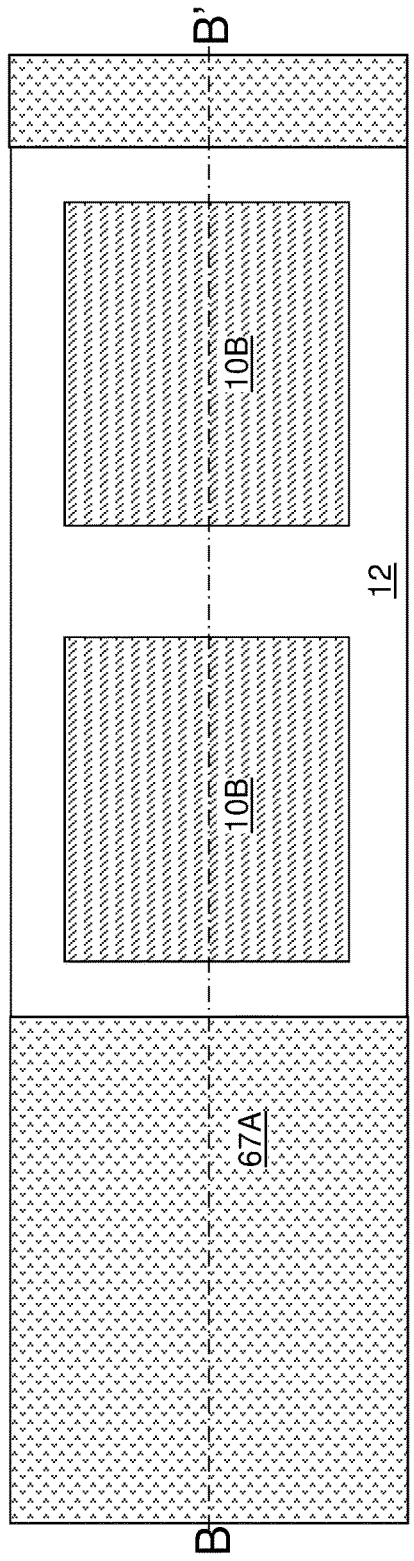
FIG. 20A is a top-down view of the second exemplary structure after vertically recessing a second body region and a third body region while protecting a first body region with a first patterned photoresist layer according to the second embodiment of the present disclosure.
Figure 20B:
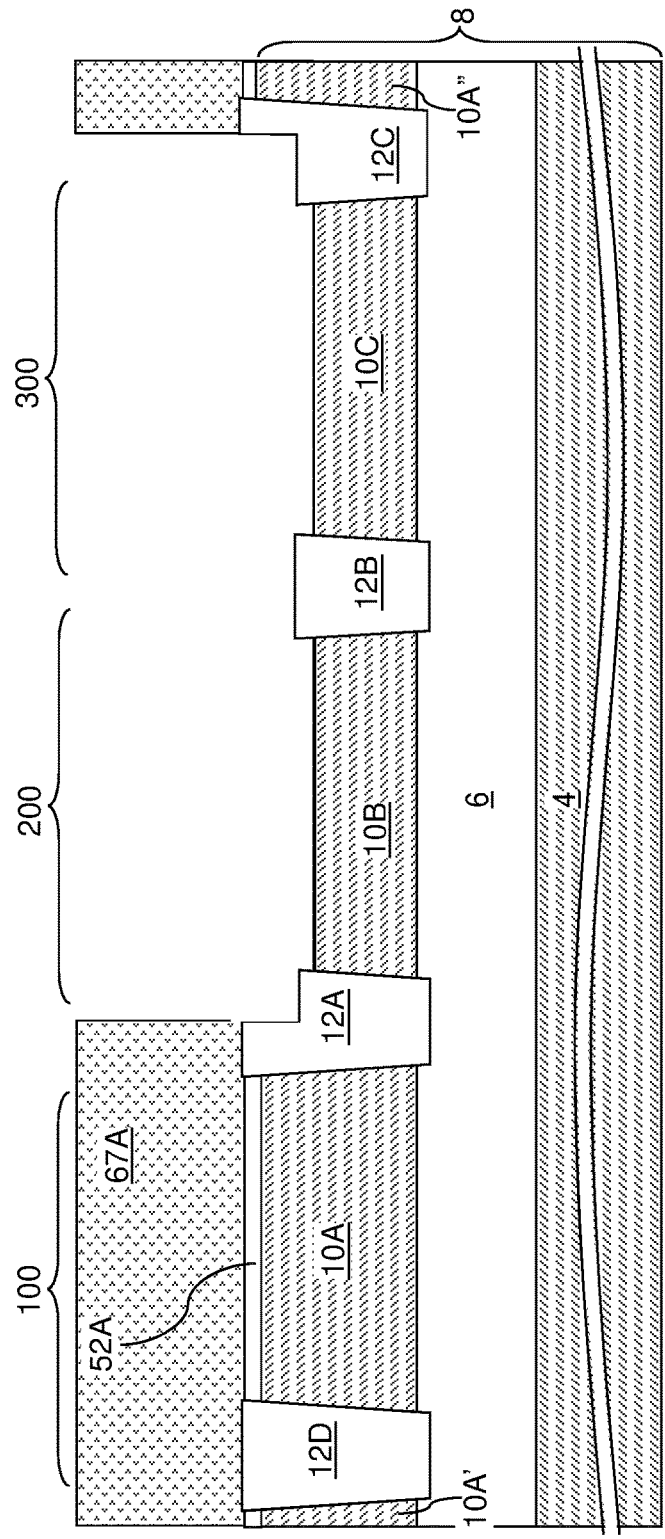
FIG. 20B is a vertical cross-sectional view of the second exemplary structure along the plane B-B' of FIG. 20A.

Referring to FIGS. 20A and 20B, a first photoresist layer 67A may be formed over the second exemplary structure, and may be lithographically patterned to form an opening in areas of the second device region 200 and the third device region 300. Segments of the first gate dielectric layer 52A located in the second device region 200 and the third device region 300 are physically exposed, while a segment of the first gate dielectric layer 52A located in the first device region 100 are masked by the first photoresist layer 67A. The first photoresist layer 67A is formed over the first body region 10A without covering the second body region 10B or the third body region 10C. An edge of the first photoresist layer 67A may be formed over a portion of the shallow trench isolation structure 12 (such as the first shallow trench isolation portion 12A) located between the first body region 10A and the second body region 10B. Another edge of the first photoresist layer 67A may be formed over a portion of the shallow trench isolation structure 12 (such as the third shallow trench isolation portion 12C) located between the third body region 10C and an additional body region 10A".

An etch process may be performed to remove the segments of the first gate dielectric layer 52A located in the second device region 200 and the third device region 300, while the segment of the first gate dielectric layer 52A in the first device region 100 underlies, and is protected by, the first photoresist layer 67A. For example, a wet etch process using dilute hydrofluoric acid may be performed to etch unmasked segments of the first gate dielectric layer 52A. Top surfaces of the second body region 10B and the third body region 10C are physically exposed, while the first body region 10A is covered by the first photoresist layer 67A. In such an embodiment, the second segment of the first gate dielectric layer 52A on the second body region 10B and the third segment of the first gate dielectric layer 52A on the third body region 10C may be etched using the first photoresist layer 67A as an etch mask. The first segment of the first gate dielectric layer 52A located on the first body region 10A is covered by the first photoresist layer 67A during the etch process, and thus is not etched during the etch process. An unmasked segment of the portion (such as the first shallow trench isolation portion 12A) of the shallow trench isolation structure 12 located between the first body region 10A and the second body region 10B may be collaterally etched during the etch process, and may be vertically recessed to provide a recessed horizontal surface that is vertically offset from a top surface of an unrecessed segment of the portion of the shallow trench isolation structure 12 that underlies the first photoresist layer 67A, i.e., the masked segment of the first shallow trench isolation portion 12A that underlies the first photoresist layer 67A.

The second body region 10B and the third body region 10C may be thinned by a subsequent etch process, which may vertically recess the second body region 10B and the third body region 10C while the first body region 10A is protected with a first etch mask layer. In one embodiment, the first photoresist layer 67A may function as the first etch mask layer. Alternatively, the first photoresist layer 67A may be removed, and the remaining first segment of the first gate dielectric layer 52A in the first device region 100 may function as the first etch mask layer. In such an embodiment, the second body region 10B and the third body region 10C may be vertically recessed using an etch process that etches the material of the second body region 10B and the third body region 10C selective to materials of the first segment of the first gate dielectric layer 52A and the shallow trench isolation structure 12. In an illustrative example, a wet etch process using hot trimethyl-2 hydroxyethyl ammonium hydroxide ("hot TMY") or tetramethyl ammonium hydroxide (TMAH) may be used to vertically recess the second body region 10B and the third body region 10C selective to the materials of the first segment of the first gate dielectric layer 52A and the shallow trench isolation structure 12.

A portion (such as the first shallow trench isolation portion 12A) of the shallow trench isolation structure 12 located between the first body region 10A and the second body region 10B may have a height difference between an upper edge of a first sidewall that contacts the first body region 10A and an upper edge of a second sidewall that contacts the second body region 10B. The upper edge of the first sidewall and the upper edge of a second sidewall may be connected by a continuous top surface of the portion of the shallow trench isolation structure 12 that comprises a non-horizontal surface segment. In one embodiment, the continuous top surface of the portion (such as the first shallow trench isolation portion 12A) of the shallow trench isolation structure 12 may comprises a first horizontal surface segment adjoined to an edge of a first sidewall of the portion of the shallow trench isolation structure 12 that contacts the first body region 10A, and a second horizontal surface segment adjoined to an edge of a second sidewall of the portion of the shallow trench isolation structure 12 that contacts the second body region 10B. In embodiments in which an anisotropic etch process is used to etch unmasked portions of the first gate dielectric layer 52A and to collaterally etch unmasked regions of the shallow trench isolation structure 12, a vertical surface segment may be adjoined to an edge of the first horizontal surface segment and to an edge of the second horizontal surface segment. In embodiments in which an isotropic etch process is used to etch unmasked portions of the first gate dielectric layer 52A and to collaterally etch unmasked regions of the shallow trench isolation structure 12, a tapered concave surface segment may be adjoined to an edge of the first horizontal surface segment and to an edge of the second horizontal surface segment.

Referring to FIGS. 21A and 21B, a second gate dielectric layer 52B may be formed on the physically exposed top surfaces of the second body region 10B and the third body region 10C. The second gate dielectric layer 52B may be formed by thermal oxidation of surface portions of the semiconductor material in the second body region 10B and the third body region 10C and/or by deposition of a gate dielectric material layer (such as an aluminum oxide layer and/or a hafnium oxide layer). The first gate dielectric layer 52A may become thicker by additional of a dielectric material portion. In one embodiment, the second gate dielectric layer 52B may include a second semiconductor oxide layer that is formed on the top surfaces of the second body region 10B and the third body region 10C.

Referring to FIGS. 22A and 22B, a second photoresist layer 67B may be formed over the second exemplary structure, and may be lithographically patterned to form an opening in the area of the third device region 300. The segment of the second gate dielectric layer 52B located in the third device region 300 is physically exposed, while the first gate dielectric layer 52A located in the first device region 100 and a segment of the second gate dielectric layer 52B located in the second device region 200 are masked by the second photoresist layer 67B. The second photoresist layer 67B is formed over the first body region 10A and the second body region 10B without covering the third body region 10C. An edge of the second photoresist layer 67B may be formed over a portion of the shallow trench isolation structure 12 (such as the second shallow trench isolation portion 12B) located between the second body region 10B and the third body region 10C. Another edge of the second photoresist layer 67B may be formed over a portion of the shallow trench isolation structure 12 (such as the third shallow trench isolation portion 12C) located between the third body region 10C and an additional body region 10A'.

An etch process may be performed to remove the segments of the second gate dielectric layer 52B located in the third device region 300, while the first gate dielectric layer 52A and the segment of the second gate dielectric layer 52B in the second device region 200 underlie, and are protected by, the second photoresist layer 67B. For example, a wet etch process using dilute hydrofluoric acid may be performed to etch an unmasked segment of the second gate dielectric layer 52B in the third device region 300. The top surface of the third body region 10C may be physically exposed, while the first body region 10A and the second body region 10B are covered by the second photoresist layer 67B. In such an embodiment, the segment of the second gate dielectric layer 52B on the third body region 10C may be etched using the second photoresist layer 67B as an etch mask. The first gate dielectric layer 52A and the segment of the second gate dielectric layer 52B located on the second body region 10B are covered by the second photoresist layer 67B during the etch process, and thus is not etched during the etch process. An unmasked segment of the portion (such as the second shallow trench isolation portion 12B) of the shallow trench isolation structure 12 located between the second body region 10B and the third body region 10C may be collaterally etched during the etch process, and may be vertically recessed to provide a recessed horizontal surface that is vertically offset from a top surface of an unrecessed segment of the portion of the shallow trench isolation structure 12 that underlies the second photoresist layer 67B, i.e., the masked segment of the second shallow trench isolation portion 12B that underlies the second photoresist layer 67B.

The third body region 10C may be thinned by a subsequent etch process, which may vertically recess the third body region 10C while the first body region 10A and the second body region 10B are protected with a second etch mask layer. In one embodiment, the second photoresist layer 67B may function as the second etch mask layer. Alternatively, the second photoresist layer 67B may be removed, and the first gate dielectric layer 52A and the remaining segment of the second gate dielectric layer 52B in the second device region 200 may function as the second etch mask layer. In such an embodiment, the third body region 10C may be vertically recessed using an etch process that etches the material of the third body region 10C selective to materials of the first gate dielectric layer 52A, the second gate dielectric layer 52B, and the shallow trench isolation structure 12. In an illustrative example, a wet etch process using hot trimethyl-2 hydroxyethyl ammonium hydroxide ("hot TMY") or tetramethyl ammonium hydroxide (TMAH)

may be used to vertically recess the third body region 10C selective to the materials of the first gate dielectric layer 52A, the second gate dielectric layer 52B, and the shallow trench isolation structure 12.

A portion (such as the second shallow trench isolation portion 12B) of the shallow trench isolation structure 12 located between the second body region 10B and the third body region 10C may have a height difference between an upper edge of a third sidewall that contacts the second body region 10B and an upper edge of a fourth sidewall that contacts the third body region 10C. The upper edge of the third sidewall and the upper edge of the fourth sidewall may be connected by a continuous top surface of the portion of the shallow trench isolation structure 12 that comprises a non-horizontal surface segment. In one embodiment, the continuous top surface of the portion (such as the second shallow trench isolation portion 12B) of the shallow trench isolation structure 12 may comprises a third horizontal surface segment adjoined to an edge of the third sidewall of the portion of the shallow trench isolation structure 12 that contacts the second body region 10B, and a fourth horizontal surface segment adjoined to an edge of the fourth sidewall of the portion of the shallow trench isolation structure 12 that contacts the third body region 10C. In embodiments in which an anisotropic etch process is used to etch unmasked portions of the second gate dielectric layer 52B and to collaterally etch unmasked regions of the shallow trench isolation structure 12, a vertical surface segment may be adjoined to an edge of the third horizontal surface segment and to an edge of the fourth horizontal surface segment. In embodiments in which an isotropic etch process is used to etch unmasked portions of the second gate dielectric layer 52B and to collaterally etch unmasked regions of the shallow trench isolation structure 12, a tapered concave surface segment may be adjoined to an edge of the third horizontal surface segment and to an edge of the fourth horizontal surface segment. Generally, the third body region 10C may be thinned by vertically recessing the third body region 10C while protecting the first body region 10A and the second body region 10B with a second etch mask layer.

Referring to FIGS. 23A and 23B, a third gate dielectric layer 52C may be formed on the physically exposed top surface of the third body region 10C. The third gate dielectric layer 52C may be formed by thermal oxidation of surface portions of the semiconductor material in the third body region 10C and/or by deposition of a gate dielectric material layer (such as an aluminum oxide layer and/or a hafnium oxide layer). The first gate dielectric layer 52A and the second gate dielectric layer 52B may become thicker by additional of a dielectric material portion. In one embodiment, the third gate dielectric layer 52C may include a second semiconductor oxide layer that is formed on the top surfaces of the third body region 10C. In one embodiment, the first gate dielectric layer 52A may have a greater thickness than the second gate dielectric layer 52B, and the second gate dielectric layer 52B may have a greater thickness than the third gate dielectric layer 52C. The thickness of the first gate dielectric layer 52A may be in a range from 3 nm to 20 nm, the thickness of the second gate dielectric layer 52B may be in a range from 2 nm to 10 nm, and the thickness of the third gate dielectric layer 52C may be in a range from 1 nm to 6 nm, although lesser and greater thicknesses may be used for each of the first gate dielectric layer 52A, the second gate dielectric layer 52B, and the third gate dielectric layer 52C.

Figure 24A:
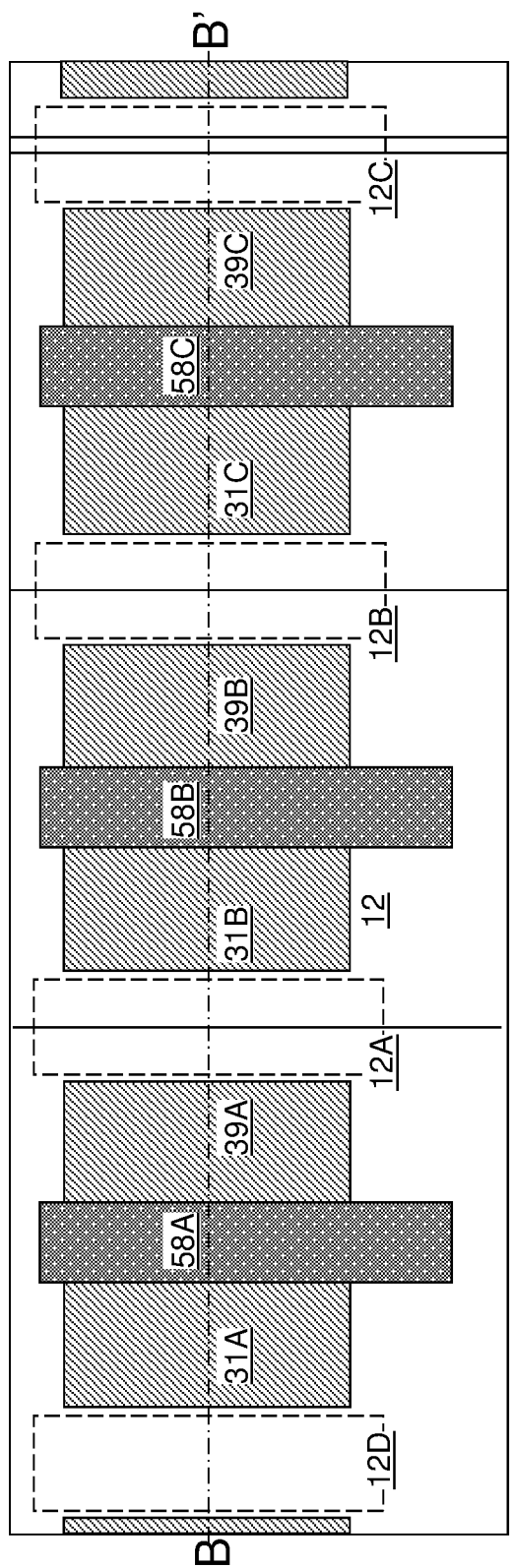
FIG. 24A is a top-down view of the second exemplary structure after formation of gate stack structures and extension regions according to the second embodiment of the present disclosure.
Figure 24B:
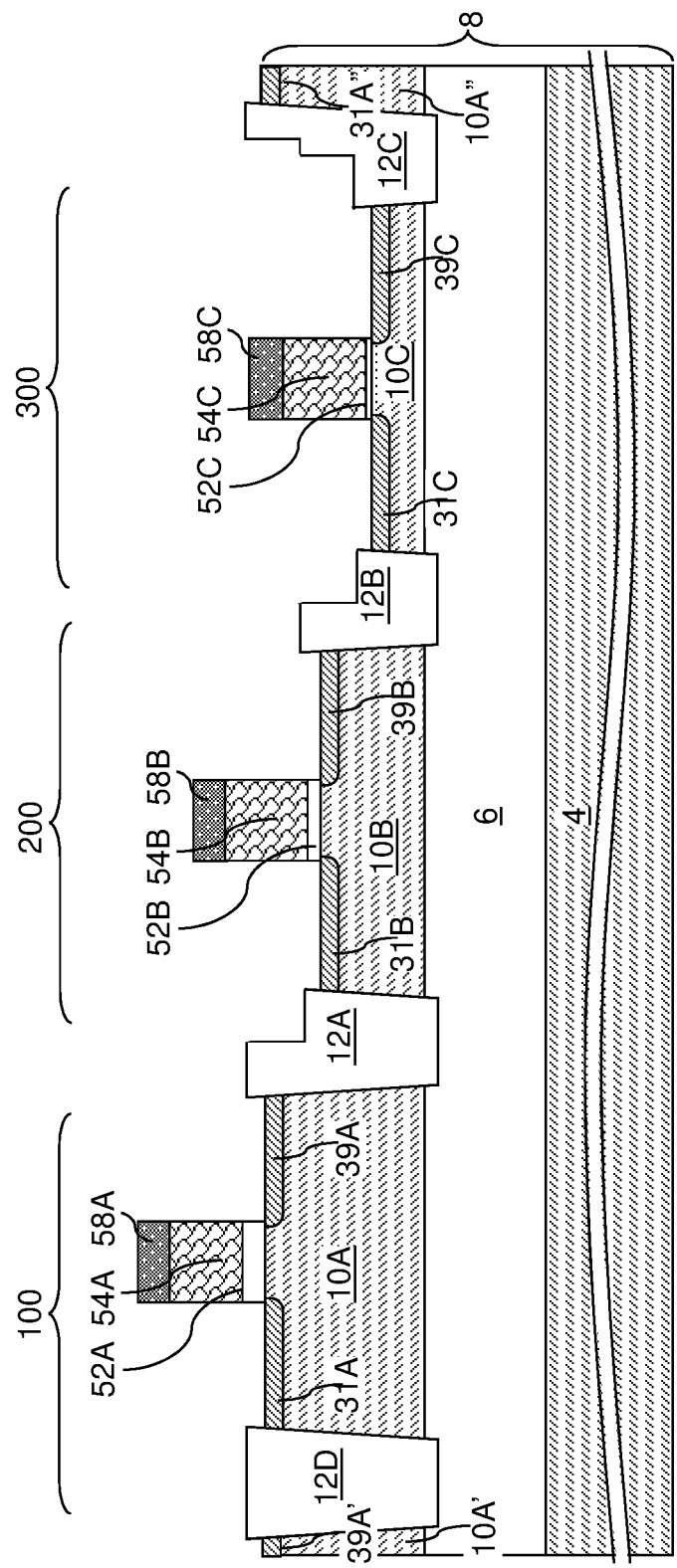
FIG. 24B is a vertical cross-sectional view of the second exemplary structure along the plane B-B' of FIG. 24A.

Referring to FIGS. 24A and 24B, the processing steps of FIGS. 12A and 12B may be performed to form gate stack structures {(52A, 54A, 58A), (52B, 54B, 58B), (52C, 54C, 58C)}, source extension regions (31A, 31B, 31C), and the drain extension regions (39A, 39B, 39C).

Figure 25A:
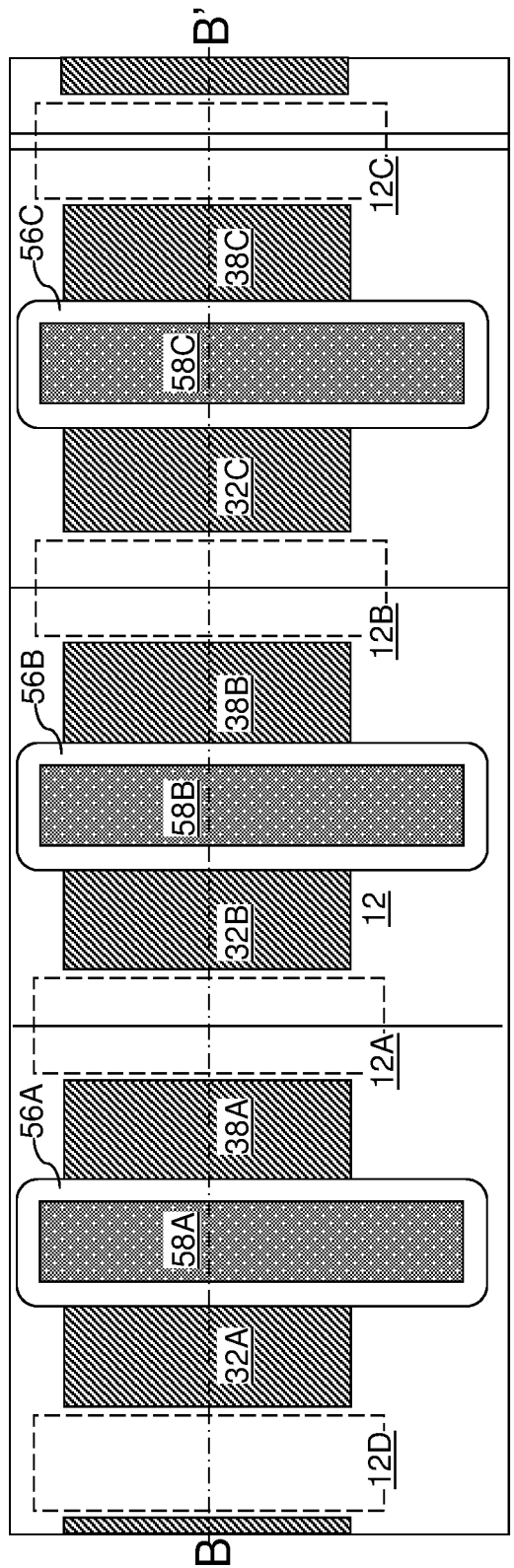
FIG. 25A is a top-down view of the second exemplary structure after formation of SOI field effect transistors according to the second embodiment of the present disclosure.
Figure 25B:
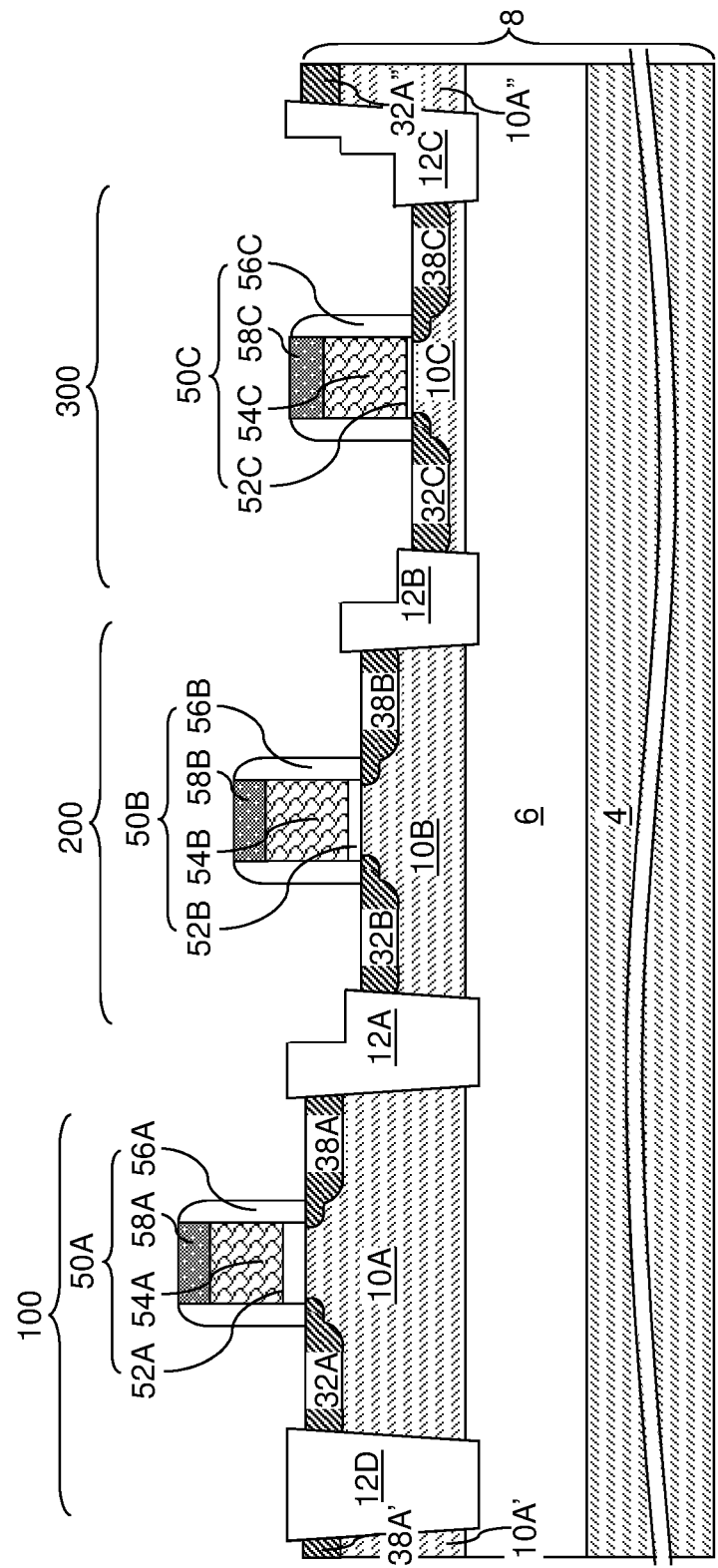
FIG. 25B is a vertical cross-sectional view of the second exemplary structure along the plane B-B' of FIG. 25A.

Referring to FIGS. 25A and 25B, the processing steps of FIGS. 13A and 13B may be performed to form gate spacers (56A, 56B, 56C), source regions (32A, 32B, 32C, 32A"), and drain regions (38A, 38B, 38C).

Figure 26A:
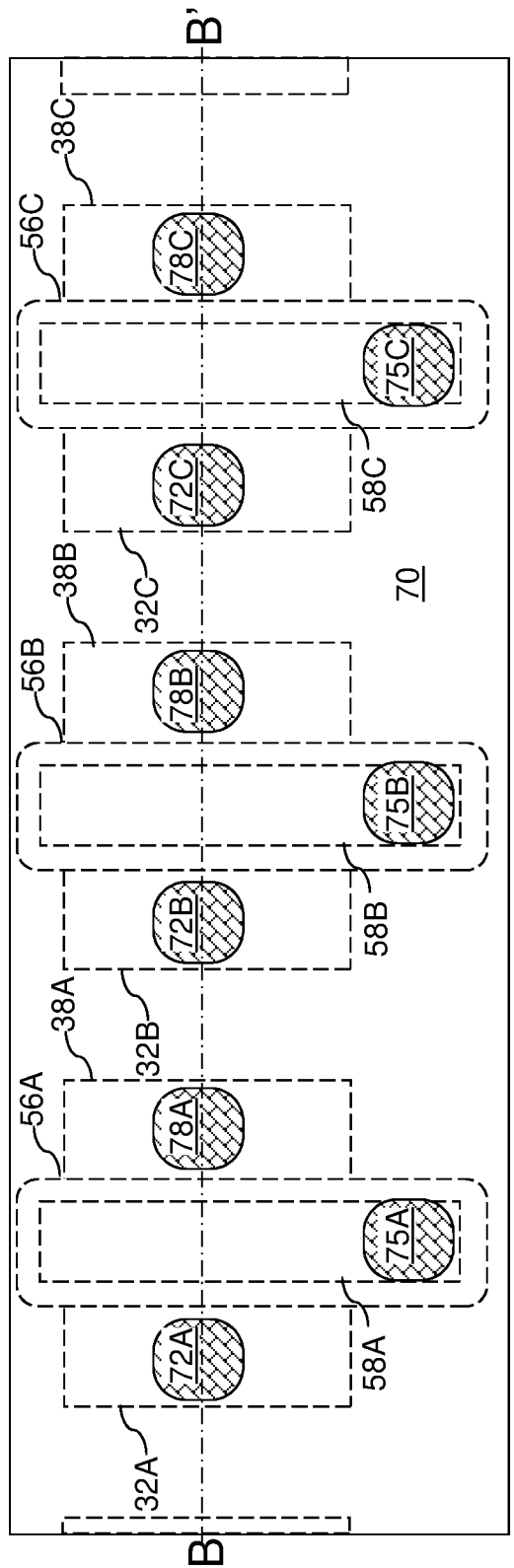
FIG. 26A is a top-down view of the second exemplary structure after formation of a contact-level dielectric layer and contact via structures according to the second embodiment of the present disclosure.
Figure 26B:
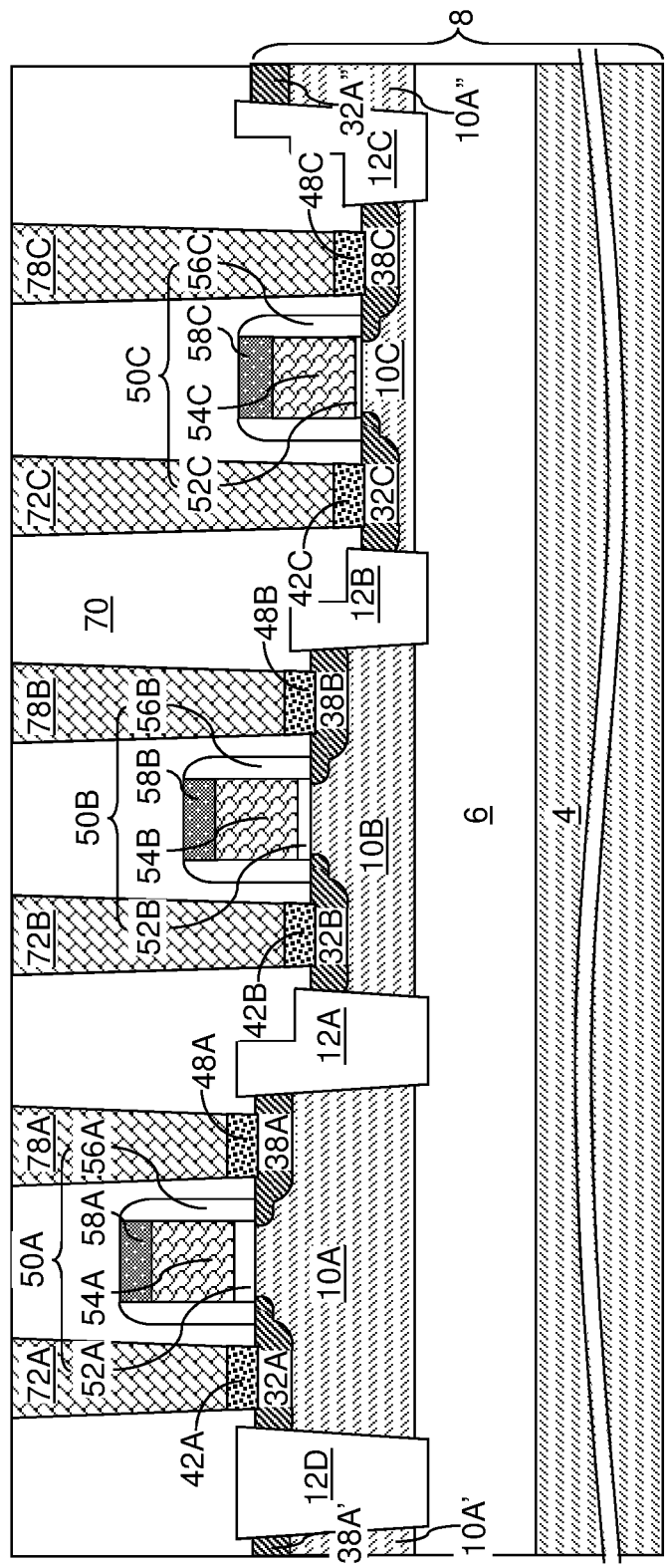
FIG. 26B is a vertical cross-sectional view of the second exemplary structure along the plane B-B' of FIG. 26A.

Referring to FIGS. 26A and 26B, the processing steps of FIGS. 14A and 14B may be performed to form a contact-level dielectric layer 70, source-side metal-semiconductor alloy regions (42A, 42B, 42C), drain-side metal-semiconductor alloy regions (48A, 48B, 48C), gate-side metal-semiconductor alloy regions, and various contact via structures (72A, 75A, 78A, 72B, 75B, 78B, 72C, 75C, 78C).

The thickness of the first body region 10A and the additional body regions (10A', 10A") may be in a range from 150 nm to 500 nm, such as from 200 nm to 400 nm, although lesser and greater thicknesses may also be used. The thickness of the second body region 10B may be in a range from 30 nm to 150 nm, such as from 50 nm to 100 nm, although lesser and greater thicknesses may also be used. The thickness of the third body region 10C may be in a range from 10 nm to 70 nm, such as from 30 nm to 50 nm, although lesser and greater thicknesses may also be used.

Referring to FIGS. 15A-26B and according to various embodiments of the present disclosure, a semiconductor structure is provided, which comprises: a semiconductor-on-insulator substrate 8 including a handle substrate 4, an insulating layer 6, and a plurality of body regions (10A, 10B, 10C, 10A', 10A') that are laterally surrounded by a shallow trench isolation structure 12, the plurality of body regions (10A, 10B, 10C, 10A', 10A') comprising a first body region 10A having a first thickness and a second body region 10B having a second thickness than is less than the first thickness; a first semiconductor-on-insulator (SOI) field effect transistor (FET) including the first body region 10A, a first source region 32A and a first drain region 38A that are embedded in the first body region 10A, and a first gate stack structure (52A, 54A, 58A); and a second SOI FET including the second body region 10B, a second source region 32B and a second drain region 38B that are embedded in the second body region 10B, and a second gate stack structure (52B, 54B, 58B), wherein: a portion 12A of the shallow trench isolation structure 12 located between the first body region 10A and the second body region 10B has a height difference between an upper edge of a first sidewall that contacts the first body region 10A and an upper edge of a second sidewall that contacts the second body region 10B; and the upper edge of the first sidewall and the upper edge of a second sidewall are connected by a continuous top surface of the portion 12A of the shallow trench isolation structure 12 that comprises a non-horizontal surface segment.

In one embodiment, the continuous top surface of the portion 12A of the shallow trench isolation structure 12 comprises: a first horizontal surface segment adjoined to an edge of a first sidewall of the portion 12A of the shallow trench isolation structure 12 that contacts the first body region 10A; a second horizontal surface segment adjoined to an edge of a second sidewall of the portion 12A of the shallow trench isolation structure 12 that contacts the second body region 10B; and a vertical surface segment adjoined to an edge of the first horizontal surface segment and to an edge of the second horizontal surface segment. Alternatively, a tapered concave surface segment may be adjoined to an edge of the first horizontal surface segment and to an edge of the second horizontal surface segment.

Multiple types of semiconductor devices, such as field effect transistors, may be formed in the patterned portions of the top semiconductor layer 10L. In one embodiment, the first body region 10A, the second body region 10B, and the third body region 10C have different thicknesses, and different types of field effect transistors may be formed over the first body region 10A, the second body region 10B, and the third body region 10C. In an illustrative example, a first field effect transistor exhibiting device characteristics that are similar to device characteristics of a field effect transistor formed on a bulk semiconductor substrate may be formed in the first device region 100, a partially-depleted semiconductor-on-insulator (PDSOI) field effect transistor may be formed in the second device region 200, and a fully-depleted semiconductor-on-insulator (FDSOI) field effect transistor may be formed in the third device region 300. Thus, the second exemplary structure of the present disclosure provide formation of different types of semiconductor devices on a same substrate.

Referring to FIG. 27, a first flowchart illustrates steps for forming the first exemplary structure of the present disclosure. Referring to step 2710, a semiconductor-on-insulator substrate 8 including a handle substrate 4, an insulating layer 6, and a top semiconductor layer 10L may be provided. Referring to step 2720, a first region 100 of the top semiconductor layer 10L may be covered with first diffusion barrier layer 161, and a second region 200 of the top semiconductor layer 10L may be physically exposed. Referring to step 2730, the second region 200 of the top semiconductor layer 10L may be thinned by performing an oxidation process that oxidizes a surface portion of the second region 200 of the top semiconductor layer 10L while the first diffusion barrier layer 161 impedes oxidation of the first region 100 of the top semiconductor layer 10L. The second region 200 of the top semiconductor layer 10L has a lesser thickness than the first region 100 of the top semiconductor layer 10L after the oxidation process. Referring to step 2740, shallow trenches 11 may be formed through the top semiconductor layer 10L. The top semiconductor layer 10L is divided into discrete portions that comprise a first body region 10A patterned from the first region 100 of the top semiconductor layer 10L and a second body region 10B patterned from the second region 200 of the top semiconductor layer 10L. Referring to step 2750, a shallow trench isolation structure 12 may be formed by filling the shallow trenches 11 with a dielectric fill material and recessing portions of the dielectric fill material. The shallow trench isolation structure 12 comprises a first shallow trench isolation portion 12A located between the first body region 10A and the second body region 10B and having a non-planar tilted top surface. Referring to step 2760, a first semiconductor-on-insulator (SOI) field effect transistor (FET) including the first body region 10A and a second SOI FET including the second body region 10B may be formed.

Figure 28:
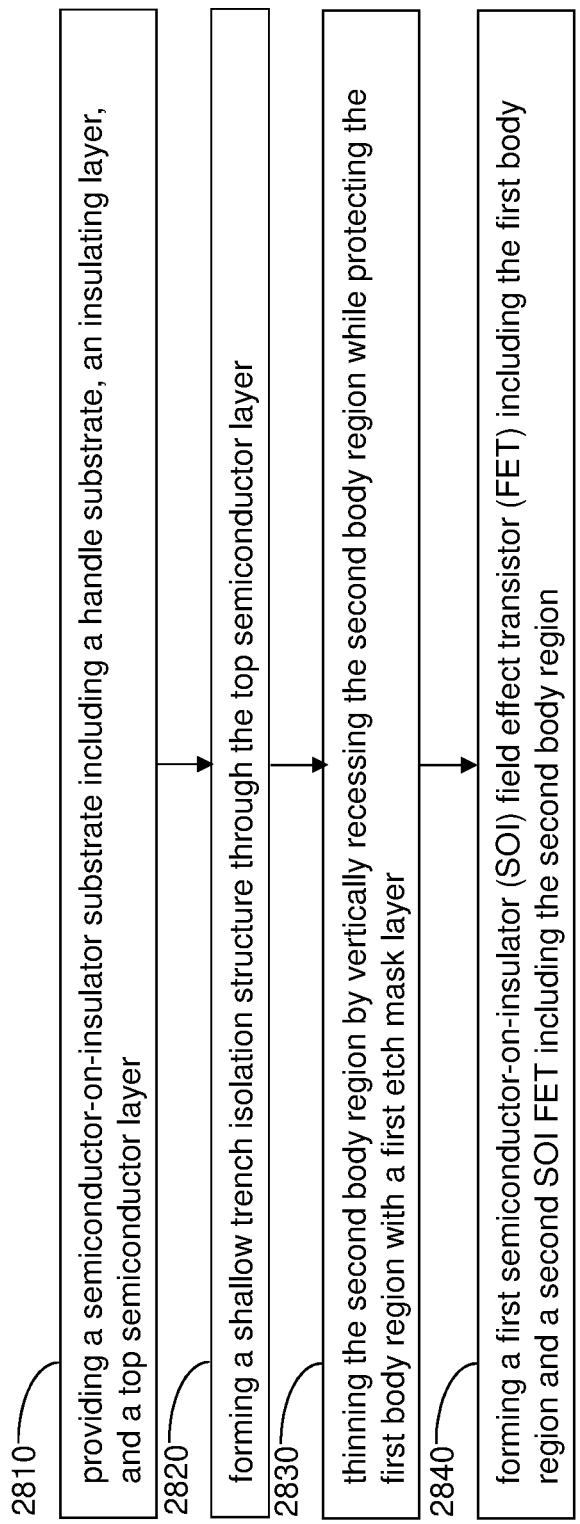
FIG. 28 is a second flowchart illustrating steps for forming the second exemplary structure of the present disclosure according to an embodiment of the present disclosure.

Referring to FIG. 28, a second flowchart illustrates steps for forming the second exemplary structure of the present disclosure. Referring to step 2810, a semiconductor-on-insulator substrate 8 including a handle substrate 4, an insulating layer 6, and a top semiconductor layer 10L is provided. Referring to step 2820, a shallow trench isolation structure 12 is formed through the top semiconductor layer 10L. The shallow trench isolation structure 12 laterally surrounds pattered portions of the top semiconductor layer 10L that comprise a first body region 10A and a second body region 10B. Referring to step 2830, thinning the second body region by vertically recessing the second body region 10B while protecting the first body region 10A with a first etch mask layer (67A or 52A). Referring to step 2840, a first semiconductor-on-insulator (SOI) field effect transistor (FET) including the first body region 10A and a second SOI FET including the second body region 10B may be formed.

Referring to all drawings and according to various embodiments of the present disclosure, a method of forming a semiconductor structure is provided, which comprises the operations of: providing a semiconductor-on-insulator substrate 8 including a handle substrate 4, an insulating layer 6, and a top semiconductor layer 10L. The method further comprising the operation of covering a first region 100 of the top semiconductor layer 10L with at least one first diffusion barrier layer 141 and physically exposing a second region 200, 300 of the top semiconductor layer 10L. The method further comprising the operation of thinning the second region 200, 300 of the top semiconductor layer 10L by performing an oxidation process that oxidizes a surface portion of the second region 200, 300 of the top semiconductor layer 10L while the at least one first diffusion barrier layer 141 impedes oxidation of the first region 100 of the top semiconductor layer 10L, wherein the second region 200, 300 of the top semiconductor layer 10L has a lesser thickness than the first region 100 of the top semiconductor layer 10L after the oxidation process. The method further comprising the operation of forming shallow trenches 11 through the top semiconductor layer 10L, wherein the top semiconductor layer 10L is divided into discrete portions 10A, 10B, 10C that comprise a first body region 10A patterned from the first region 100 of the top semiconductor layer 10L and a second body region 10B patterned from the second region 200 of the top semiconductor layer 10L. The method further comprising the operation of forming a shallow trench isolation structure 12 by filling the shallow trenches 11 with a dielectric fill material and recessing portions of the dielectric fill material, wherein the shallow trench isolation structure 12 comprises a first shallow trench isolation portion 12A located between the first body region 10A and the second body region 10A and having a non-planar tilted top surface. The method further comprising the operation of forming a first semiconductor-on-insulator (SOI) field effect transistor (FET) including the first body region 10A and a second SOI FET including the second body region 10B.

Referring to all drawings and according to various embodiments of the present disclosure, a method of forming a semiconductor structure is provided, which comprises the operations of: providing a semiconductor-on-insulator substrate 8 including a handle substrate 4, an insulating layer 6, and a top semiconductor layer 10L. The method further comprising the operation of forming a shallow trench isolation structure 12 through the top semiconductor layer 10L, wherein the shallow trench isolation structure 12 laterally surrounds pattered portions of the top semiconductor layer 10L that comprise a first body region 10A and a second body region 10B. The method further comprising the operation of thinning the second body region 10B by vertically recessing the second body region 10B while protecting the first body region 10A with a first etch mask layer 67A; and forming a first semiconductor-on-insulator (SOI) field effect transistor (FET) including the first body region 10A and a second SOI FET including the second body region 10B.

Referring to all drawings and according to various embodiments of the present disclosure, a semiconductor structure is provided, which comprises: a semiconductor-on-insulator substrate 8 including a handle substrate 4, an insulating layer 6, and a plurality of body regions (10A, 10B, 10C, 10A', 10A') that are laterally surrounded by a shallow trench isolation structure 12, the plurality of body regions (10A, 10B, 10C, 10A', 10A') comprising a first body region 10A having a first thickness and a second body region 10B having a second thickness than is less than the first thickness; a first semiconductor-on-insulator (SOI) field effect transistor (FET) including the first body region 10A, a first source region 32A and a first drain region 38A that are embedded in the first body region 10A, and a first gate stack structure (52A, 54A, 58A); and a second SOI FET including the second body region 10B, a second source region 32B and a second drain region 38B that are embedded in the second body region 10B, and a second gate stack structure (52B, 54B, 58B), wherein: a portion 12A of the shallow trench isolation structure 12 located between the first body region 10A and the second body region 10B has a height difference between an upper edge of a first sidewall that contacts the first body region 10A and an upper edge of a second sidewall that contacts the second body region 10B; and the upper edge of the first sidewall and the upper edge of a second sidewall are connected by a continuous top surface of the portion 12A of the shallow trench isolation structure 12 that comprises a non-horizontal surface segment.

In one embodiment, the plurality of body regions (10A, 10B, 10C, 10A', 10A") comprises a third body region 10C having a third thickness than is less than the second thickness. The semiconductor structure comprises a third SOI FET including the third body region 10C, a third source region 32C and a third drain region 38C that are embedded in the third body region 10C, and a third gate stack structure (52C, 54C, 58C). The first SOI FET may comprise a partially depleted SOI FET. The third SOI FET may comprise a fully depleted SOI FET. The second SOI FET may comprise a partially depleted SOI FET or a fully depleted SOI FET.

The various methods and structures of the present disclosure may provide a combination of at least one partially depleted SOI FET and at least one fully depleted SOI FET on a same SOI substrate with low production cost and a relatively short processing time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
    providing a substrate including a top semiconductor layer that includes a first region, a second region, and a third region;
    forming at least one first diffusion barrier layer that covers a first region of the top semiconductor layer and does not cover the second region and the third region of the top semiconductor layer;
    thinning the second region and the third region of the top semiconductor layer without thinning the first region of the top semiconductor layer;
    forming a second diffusion barrier layer that covers the first region and the second region of the top semiconductor layer and does not cover the third region of the top semiconductor layer;
    additionally thinning the third region of the top semiconductor layer while a combination of the at least one first diffusion barrier layer and the second diffusion barrier layer masks the first region and the second region of the top semiconductor layer;
    forming shallow trenches through the top semiconductor layer after said additional thinning of the third region of the top semiconductor layer;
    forming a shallow trench isolation structure by filling the shallow trenches with a dielectric fill material and recessing portions of the dielectric fill material; and
    forming semiconductor devices on discrete semiconductor portions in the first region and in the second region.

2. The method of claim 1, further comprising:
    forming a first semiconductor oxide layer over the top semiconductor layer, wherein the at least one first diffusion barrier layer is formed over the first semiconductor oxide layer; and
    removing a portion of the first semiconductor oxide layer from above the second region and the third region of the top semiconductor layer prior to thinning the second region and the third region of the top semiconductor layer.

3. The method of claim 2, further comprising performing an oxidation process while the first region of the top semiconductor layer is covered with the at least one first diffusion barrier layer and while the second region and the third region of the top semiconductor layer are not covered with any diffusion barrier layer, whereby the second region and the third region of the top semiconductor layer are thinned.

4. The method of claim 3, wherein the oxidation process forms a second semiconductor oxide layer such that a top surface of the second semiconductor oxide layer is located below a horizontal plane including a top surface of the first semiconductor oxide layer.

5. The method of claim 1, further comprising forming a planarization stop dielectric layer over the at least one first diffusion barrier layer after thinning the second region and the third region of the top semiconductor layer and prior to formation of the shallow trench isolation structure.

6. The method of claim 5, wherein the planarization stop dielectric layer as formed over the at least one first diffusion barrier layer comprises:
    a first horizontally-extending portion that overlies the first region of the top semiconductor layer;
    a second horizontally-extending portion that overlies the second region of the top semiconductor layer; and
    a connecting portion that connects an end region of the first horizontally-extending portion with an end of the second horizontally-extending portion.

7. The method of claim 6, wherein:
    the second horizontally-extending portion is vertically offset from the first horizontally-extending portion; and
    the connecting portion is free of any stepped surface.

8. The method of claim 1, wherein the shallow trenches divide the top semiconductor layer divided into the discrete semiconductor portions, the discrete semiconductor portions having different thicknesses.

9. The method of claim 1, wherein the shallow trench isolation structure is formed with a non-horizontal top surface extends between a neighboring pair of discrete semiconductor portions.

10. The method of claim 1, wherein:
said additionally thinning of the third region of the top semiconductor layer is effected by performing an oxidation process that converts a surface portion of the third region of the top semiconductor layer into a semiconductor material portion; and
the method comprises forming a planarization stop dielectric layer on the semiconductor oxide portion.

11. A method of forming a semiconductor structure, comprising:
providing a substrate including a top semiconductor layer comprising a first region, a second region, and a third region;
forming at least one first diffusion barrier layer that covers the first region of the top semiconductor layer without covering the second region of the top semiconductor layer;
thinning the second region and the third region of the top semiconductor layer without thinning the first region of the top semiconductor layer;
forming a second diffusion barrier layer that covers the first region and the second region of the top semiconductor layer and does not cover the third region of the top semiconductor layer;
additionally thinning the third region of the top semiconductor layer while a combination of the at least one first diffusion barrier layer and the second diffusion barrier layer masks the first region and the second region of the top semiconductor layer;
forming a planarization stop dielectric layer over the at least one first diffusion barrier layer and over the second diffusion barrier layer after said additional thinning of the third region of the top semiconductor layer;
forming shallow trenches through the top semiconductor layer, wherein the top semiconductor layer is divided into discrete portions that comprise a first body region patterned from the first region of the top semiconductor layer and a second body region patterned from the second region of the top semiconductor layer; and
forming a first semiconductor-on-insulator (SOI) field effect transistor (FET) including the first body region and a second SOI FET including the second body region.

12. The method of claim 11, further comprising performing an oxidation process that oxidizes a surface portion of the second region of the top semiconductor layer while the at least one first diffusion barrier layer impedes oxidation of the first region of the top semiconductor layer, whereby the second region of the top semiconductor layer is thinned.

13. The method of claim 11, further comprising:
applying and patterning a photoresist layer over the planarization stop dielectric layer such that the photoresist layer covers discrete areas of the top semiconductor layer; and
transferring a pattern in the photoresist layer through the planarization stop dielectric layer and the top semiconductor layer, whereby the shallow trenches are formed through the top semiconductor layer.

14. The method of claim 11, wherein a shallow trench isolation structure is formed with a non-horizontal top surface that continuously extends between the first body region and the second body region without any stepped surface therein.

15. The method of claim 11, further comprising:
depositing a dielectric fill material in the shallow trenches and over the planarization stop dielectric layer;

performing a chemical mechanical planarization process that removes portions of the dielectric fill material located above the planarization stop dielectric layer; and
isotropically recessing the dielectric fill material after the chemical mechanical planarization process, whereby a shallow trench isolation structure is formed.

16. The method of claim 15, wherein:
the second region of the top semiconductor layer is thinned by converting a surface portion of the second region of the top semiconductor layer into a semiconductor oxide layer;
the shallow trenches are formed through the planarization stop dielectric layer and through the semiconductor oxide layer; and
the dielectric fill material is isotropically recessed employing an etch chemistry that is selective to a material of the planarization stop dielectric layer.

17. The method of claim 11, further comprising:
covering the first region of the top semiconductor layer with at least one first diffusion barrier layer and physically exposing the second region of the top semiconductor layer; and
oxidizing a surface portion of the second region while the first region is covered with the at least one first diffusion barrier layer, whereby the second region is thinned and a semiconductor oxide layer is formed, wherein the planarization stop dielectric layer is formed over the semiconductor oxide layer.

18. The method of claim 11, wherein:
said additionally thinning of the third region of the top semiconductor layer is effected by performing an oxidation process that converts a surface portion of the third region of the top semiconductor layer into a semiconductor material portion; and
the planarization stop dielectric layer is formed on the semiconductor oxide portion.

19. A method of forming a semiconductor structure, comprising:
providing a semiconductor-on-insulator substrate including a handle substrate, an insulating layer, and a top semiconductor layer that includes a first region and a second region;
thinning the second region of the top semiconductor layer by performing an oxidation process that oxidizes a surface portion of the second region of the top semiconductor layer, whereby the second region has a lesser thickness than the first region;
forming a planarization stop dielectric layer over at least one first diffusion barrier layer and over a semiconductor oxide portion formed by oxidation of the surface portion of the second region of the top semiconductor layer after thinning the second region of the top semiconductor layer;
forming shallow trenches through the top semiconductor layer, wherein the top semiconductor layer is divided into discrete portions that comprise a first body region patterned from the first region of the top semiconductor layer and a second body region patterned from the second region of the top semiconductor layer, and wherein the shallow trenches are formed through the planarization stop dielectric layer;
forming a shallow trench isolation structure by filling the shallow trenches with a dielectric fill material and recessing portions of the dielectric fill material; and forming a first semiconductor-on-insulator (SOI) field effect transistor (FET) including the first body region and a second SOI FET including the second body region.

20. The method of claim 19, further comprising covering the first region of the top semiconductor layer at least one first diffusion barrier layer and physically exposing the second region of the top semiconductor layer prior to performing the oxidation process, wherein the at least one first diffusion barrier layer impedes oxidation of the first region of the top semiconductor layer during the oxidation process.

* * * * *